(12) United States Patent
Kim et al.

(10) Patent No.: US 9,911,924 B2
(45) Date of Patent: Mar. 6, 2018

(54) MATERIAL FOR ORGANIC OPTOELECTRONIC DEVICE, ORGANIC LIGHT EMITTING DIODE INCLUDING THE SAME, AND DISPLAY INCLUDING THE ORGANIC LIGHT EMITTING DIODE

(71) Applicants: SAMSUNG ELECTRONICS CO., LTD., Suwon-si, Gyeonggi-do (KR); CHEIL INDUSTRIES INC., Gumi-si, Gyeongsangbuk-do (KR)

(72) Inventors: Hyung-Sun Kim, Uiwang-si (KR); Byungku Kim, Uiwang-si (KR); Chang woo Kim, Uiwang-si (KR); Jin Hyeon Ryu, Uiwang-si (KR); Moo-Jin Park, Uiwang-si (KR); Jae-Deuk Yang, Uiwang-si (KR); Eun-Sun Yu, Uiwang-si (KR); Ho-Jae Lee, Uiwang-si (KR)

(73) Assignees: SAMSUNG ELECTRONICS CO., LTD., Gyeonggi-Do (KR); CHEIL INDUSTRIES INC., Gyeongsangbuk-Do (KR)

( * ) Notice: Subject to any disclaimer, the term of this patent is extended or adjusted under 35 U.S.C. 154(b) by 809 days.

(21) Appl. No.: 14/035,370

(22) Filed: Sep. 24, 2013

(65) Prior Publication Data
US 2014/0197386 A1 Jul. 17, 2014

(30) Foreign Application Priority Data

Jan. 17, 2013 (KR) ........................ 10-2013-0005570

(51) Int. Cl.
*H01L 51/00* (2006.01)
*C09K 11/06* (2006.01)
*H01L 51/50* (2006.01)

(52) U.S. Cl.
CPC .......... *H01L 51/0067* (2013.01); *C09K 11/06* (2013.01); *H01L 51/0072* (2013.01); *C09K 2211/185* (2013.01); *H01L 51/0052* (2013.01); *H01L 51/0071* (2013.01); *H01L 51/0073* (2013.01); *H01L 51/0074* (2013.01); *H01L 51/0085* (2013.01); *H01L 51/5012* (2013.01); *H01L 2251/5384* (2013.01)

(58) Field of Classification Search
CPC .................... H01L 51/0067; H01L 51/0071
See application file for complete search history.

(56) References Cited

U.S. PATENT DOCUMENTS

| 2005/0127823 | A1† | 6/2005 | Iwakuma |
| 2006/0103298 | A1† | 5/2006 | Lee |
| 2007/0099026 | A1† | 5/2007 | Lee |
| 2009/0061285 | A1 | 3/2009 | Menon et al. |
| 2010/0187977 | A1† | 7/2010 | Kai |
| 2011/0278555 | A1* | 11/2011 | Inoue .................... C07D 209/82 257/40 |
| 2011/0279020 | A1† | 11/2011 | Inoue |
| 2012/0138911 | A1 | 6/2012 | Inoue et al. |
| 2012/0138912 | A1 | 6/2012 | Inoue et al. |
| 2012/0138915 | A1† | 6/2012 | Nishimura |
| 2012/0181518 | A1 | 7/2012 | Ogiwara et al. |
| 2012/0223295 | A1† | 9/2012 | Inoue |
| 2013/0112952 | A1 | 5/2013 | Adamovich et al. |
| 2014/0070204 | A1* | 3/2014 | Nagao .................. C07D 209/86 257/40 |

FOREIGN PATENT DOCUMENTS

| JP | 08003547 | † | 1/1996 |
| JP | 2003133075 | † | 5/2003 |
| KR | 1020090023253 | A | 3/2009 |
| KR | 1020110122051 | A | 11/2011 |
| KR | 20120034648 | A | 4/2012 |
| KR | 20120057561 | A | 6/2012 |
| WO | 2011136755 A1 | † | 11/2011 |
| WO | 2011137072 A1 | † | 11/2011 |
| WO | 2012 153725 | * | 11/2012 |
| WO | 2012153725 A1 | † | 11/2012 |

* cited by examiner
† cited by third party

*Primary Examiner* — Kuo-Liang Peng
(74) *Attorney, Agent, or Firm* — Cantor Colburn LLP

(57) ABSTRACT

A material for an organic optoelectronic device including a first compound represented by Chemical Formula A-1 and a second compound represented by Chemical Formula B-1:

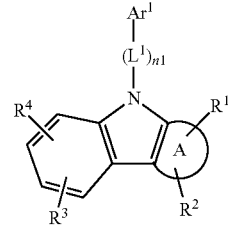

Chemical Formula A-1

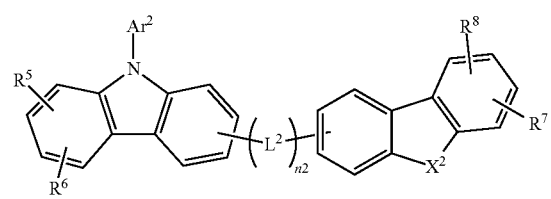

Chemical Formula B-1 wherein, variables $R_1$-$R_8$, $Ar_1$, $Ar_2$, $L_1$, $L_2$, $X_2$, $n_1$, and $n_2$ are described in the specification.

15 Claims, 2 Drawing Sheets

MATERIAL FOR ORGANIC OPTOELECTRONIC DEVICE, ORGANIC LIGHT EMITTING DIODE INCLUDING THE SAME, AND DISPLAY INCLUDING THE ORGANIC LIGHT EMITTING DIODE

CROSS-REFERENCE TO RELATED APPLICATION

This application claims priority to and the benefit of Korean Patent Application No. 10-2013-0005570 filed on Jan. 17, 2013, and all the benefits accruing therefrom under 35 U.S.C. § 119, the content of which is incorporated herein in its entirety by reference.

BACKGROUND

1. Field

A material for an organic optoelectronic device, an organic light emitting diode, and a display device including the organic light emitting diode are disclosed.

2. Description of the Related Art

An organic photoelectric device is a device requiring a charge exchange between an electrode and an organic material by using holes or electrons.

An organic optoelectronic device may be classified in accordance with its driving principles. A first organic optoelectronic device is an electronic device driven as follows: excitons are generated in an organic material layer by photons from an external light source, the excitons are separated into electrons and holes, and the electrons and holes are transferred to different electrodes as a current source (voltage source).

A second organic optoelectronic device is an electronic device driven as follows: a voltage or a current is applied to at least two electrodes to inject holes and/or electrons into an organic material semiconductor positioned at an interface of the electrodes, and the device is driven by the injected electrons and holes.

Examples of the organic optoelectronic device include an organic light emitting diode, an organic solar cell, an organic photoconductor drum, an organic transistor, and the like, which require a hole injecting or transport material, an electron injecting or transport material, or a light emitting material.

Particularly, an organic light emitting diode ("OLED") has recently drawn attention due to an increasing demand for flat panel displays. In general, organic light emission refers to conversion of electrical energy into photo-energy.

Such an organic light emitting diode converts electrical energy into light by applying a current to an organic light emitting material. It has a structure in which a functional organic material layer is interposed between an anode and a cathode. The organic material layer includes a multi-layer including different materials, for example a hole injection layer ("HIL"), a hole transport layer ("HTL"), an emission layer, an electron transport layer ("ETL"), and an electron injection layer ("EIL"), in order to improve efficiency and stability of an organic light emitting diode.

In such an organic light emitting diode, when a voltage is applied between an anode and a cathode, holes from the anode and electrons from the cathode are injected to an organic material layer and recombined to generate excitons having high energy. The generated excitons generate light having certain wavelengths while shifting to a ground state.

Recently, it has become known that a phosphorescent light emitting material may be used for a light emitting material of an organic light emitting diode in addition to the fluorescent light emitting material. Such a phosphorescent material emits lights by transporting the electrons from a ground state to an exited state, non-radiance transiting of a singlet exciton to a triplet exciton through intersystem crossing, and transiting a triplet exciton to a ground state to emit light.

As described above, in an organic light emitting diode, an organic material layer includes a light emitting material and a charge transport material, for example a hole injection material, a hole transport material, an electron transport material, an electron injection material, and the like.

The light emitting material is classified as blue, green, and red light emitting materials according to emitted colors, and yellow and orange light emitting materials to emit colors approaching natural colors.

When one material is used as a light emitting material, a maximum light emitting wavelength is shifted to a long wavelength or color purity decreases because of interactions between molecules, or device efficiency decreases because of a light emitting quenching effect. Therefore, a host/dopant system is included as a light emitting material in order to improve color purity and increase luminous efficiency and stability through energy transfer.

In order to achieve excellent performance in an organic light emitting diode, a material constituting an organic material layer, for example a hole injection material, a hole transport material, a light emitting material, an electron transport material, an electron injection material, and a light emitting material such as a host and/or a dopant, should be stable and have good efficiency. However, development of an organic material layer forming material for an organic light emitting diode has thus far not been entirely satisfactory and thus there is a need for a novel material. This material development is also required for other organic optoelectronic devices.

A low molecular organic light emitting diode is manufactured as a thin film in a vacuum deposition method, and can have good efficiency and life-span performance. A polymer organic light emitting diode manufactured in an Inkjet or spin coating method has an advantage of low initial cost and being applicable to a large display.

Both low molecular organic light emitting and polymer organic light emitting diodes have advantages of self-light emission, high speed response, wide viewing angle, ultra-thinness, high image quality, durability, large driving temperature range, and the like. In particular, they have good visibility due to the self-light emission characteristic compared with a conventional LCD (liquid crystal display), and have an advantage of decreasing thickness and weight of an LCD by up to a third, because they do not need a backlight.

In addition, since they have a response speed of a microsecond unit, which is 1,000 times faster than an LCD, they can realize a perfect motion picture without an after-image. Based on these advantages, they have been developed to have a remarkable 80 times the efficiency and more than 100 times the life-span since they first came out in the late 1980's. Recently, they have become rapidly larger such that a 40-inch organic light emitting diode panel is now possible.

They are simultaneously required to have improved luminous efficiency and life-span in order to be larger. Such luminous efficiency requires smooth combination between holes and electrons in an emission layer.

SUMMARY

A material for an organic optoelectronic device that may provide an organic optoelectronic device having high efficiency, long life-span, and the like is provided.

An organic light emitting diode including the material for an organic optoelectronic device and a display device including the organic light emitting diode are provided.

In an embodiment, a material for an organic optoelectronic device including a first compound represented by Chemical Formula A-1 and a second compound represented by Chemical Formula B-1 is provided.

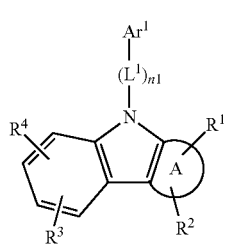

Chemical Formula A-1

In Chemical Formula A-1, $Ar^1$ is a substituted or unsubstituted C2 to C30 heteroaryl group having electronic properties, $L^1$ is a substituted or unsubstituted C2 to C6 alkenylene group, a substituted or unsubstituted C2 to C6 alkynylene group, a substituted or unsubstituted C6 to C30 arylene group, a substituted or unsubstituted C2 to C30 heteroarylene group, or a combination thereof, n1 is an integer of 0 to 3, $R^1$ to $R^4$ are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthio group, a substituted or unsubstituted C6 to C20 arylthio group, a substituted or unsubstituted C1 to C20 heterocyclothio group, a substituted or unsubstituted C1 to C20 ureide group, a substituted or unsubstituted C3 to C40 silyl group, or a combination thereof, A is a substituted or unsubstituted C5 to C80 aryl group or a substituted or unsubstituted C2 to C80 heteroaryl group, and A includes one to five rings.

Chemical Formula B-1

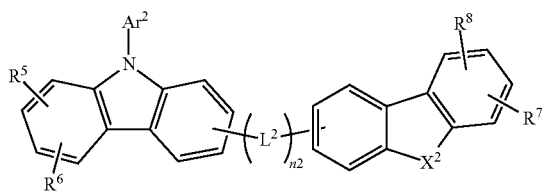

In Chemical Formula B-1, $X^2$ is —O—, —S—, or —NR'—, $Ar^2$, $R^5$ to $R^8$, and R' are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthio group, a substituted or unsubstituted C6 to C20 arylthio group, a substituted or unsubstituted C1 to C20 heterocyclothio group, a substituted or unsubstituted C1 to C20 ureide group, a substituted or unsubstituted C3 to C40 silyl group, or a combination thereof, $L^2$ is a substituted or unsubstituted C2 to C6 alkenylene group, a substituted or unsubstituted C2 to C6 alkynylene group, a substituted or unsubstituted C6 to C30 arylene group, a substituted or unsubstituted C2 to C30 heteroarylene group, or a combination thereof, and n2 is an integer of 0 to 3.

A may be represented by Chemical Formula A-2 or A-3.

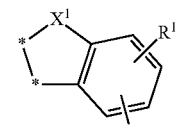

Chemical Formula A-2

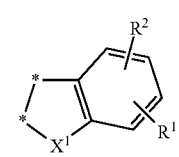

Chemical Formula A-3

In Chemical Formula A-2 and A-3, adjacent two asterisks (*) indicate bonding positions with Chemical Formula A-1, $X^1$ is O—, —S—, or —NR'—, and $R^1$, $R^2$, and R' are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthio group, a substituted or unsubstituted C6 to C20 arylthio group, a substituted or unsubstituted C1 to C20 heterocyclothio group, a substituted or unsubstituted C1 to C20 ureide group, a substituted or unsubstituted C3 to C40 silyl group, or a combination thereof.

A may be represented by one of Chemical Formulae A-4 to A-9.

Chemical Formula A-4

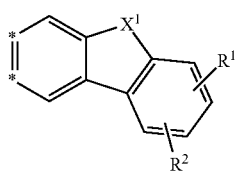

Chemical Formula A-5

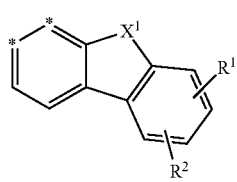

Chemical Formula A-6

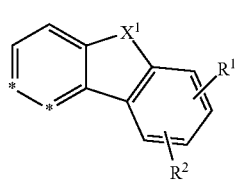

Chemical Formula A-7

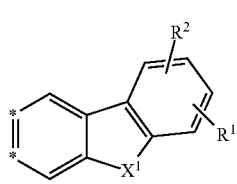

Chemical Formula A-8

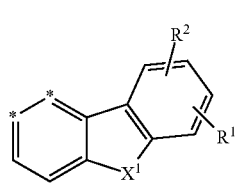

Chemical Formula A-9

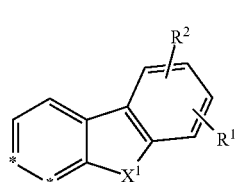

In Chemical Formulae A-4 to A-9, two adjacent asterisks (*) indicate bonding positions with Chemical Formula A-1, $X^1$ is —O—, —S—, or —NR'—, and $R^1$, $R^2$, and R' are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthio group, a substituted or unsubstituted C6 to C20 arylthio group, a substituted or unsubstituted C1 to C20 heterocyclothio group, a substituted or unsubstituted C1 to C20 ureide group, a substituted or unsubstituted C3 to C40 silyl group, or a combination thereof.

The Chemical Formula A-1 may be represented by Chemical Formula A-10.

Chemical Formula A-10

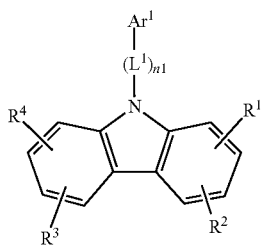

In Chemical Formula A-10, $Ar^1$ is a substituted or unsubstituted C2 to C30 heteroaryl group having electronic properties, $L^1$ is a substituted or unsubstituted C2 to C6 alkenylene group, a substituted or unsubstituted C2 to C6 alkynylene group, a substituted or unsubstituted C6 to C30 arylene group, a substituted or unsubstituted C2 to C30 heteroarylene group, or a combination thereof, n1 is an integer of 0 to 3, $R^1$ to $R^4$ are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthio group, a substituted or unsubstituted C6 to C20 arylthio group, a substituted or unsubstituted C1 to C20 heterocyclothio group, a substituted or unsubstituted C1 to C20 ureide group, a substituted or unsubstituted C3 to C40 silyl group, or a combination thereof.

In Chemical Formula B-1, n2 may be 0.

In Chemical Formula B-1, $X^2$ may be NR', wherein R' is a substituted or unsubstituted C6 to C30 aryl group.

The material for an organic optoelectronic device may further include a dopant represented by Chemical Formula C-1.

Chemical Formula C-1

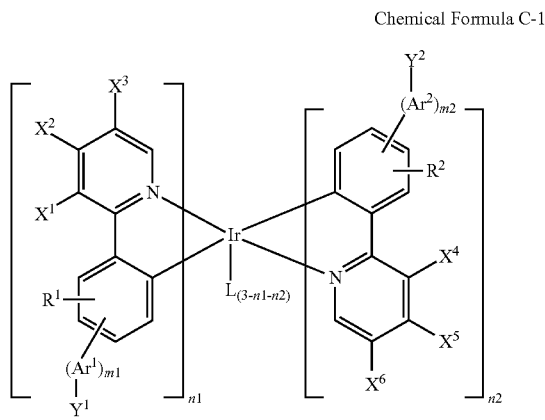

In Chemical Formula C-1, $X^1$ to $X^6$, $Y^1$, and $Y^2$ are independently hydrogen, deuterium, a halogen, a substituted or unsubstituted C1 to C20 alkyl group, a substituted or unsubstituted C1 to C20 fluoroalkyl group, a substituted or unsubstituted C1 to C20 alkoxy group, a substituted or unsubstituted C1 to C20 amino group, a substituted or unsubstituted C6 to C30 aryl group, a substituted or unsubstituted C1 to C30 heteroaryl group, or a substituent represented by Chemical Formula X-1, $Ar^1$ and $Ar^2$ are substituted or unsubstituted C6 to C30 arylene groups, $R^1$ and $R^2$ are independently hydrogen, deuterium, a C1 to C30 alkyl group substituted or unsubstituted with a halogen, a C6 to C30 aryl group substituted or unsubstituted with a C1 to C30 alkyl group, or a halogen, $m^1$ and $m^2$ are integers ranging from 0 to 2, and $m^1+m^2$ is greater than or equal to 1, L is a bidentate ligand of a monovalent anion, and is coordination-bonded with iridium through lone pair electrons of carbon or heteroatoms, $n^1$ and $n^2$ are independently integers ranging from 0 to 3, and $n^1+n^2$ is an integer ranging from 1 to 3, Chemical Formula X-1

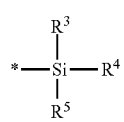

In Chemical Formula X-1, $R^3$, $R^4$, and $R^5$ are independently a substituted or unsubstituted C1 to C20 alkyl group, a substituted or unsubstituted C1 to C20 alkoxy group, a substituted or unsubstituted C1 to C20 fluoroalkyl group, a substituted or unsubstituted C1 to C20 amino group, a substituted or unsubstituted C6 to C30 aryl group, or a substituted or unsubstituted C1 to C30 heteroaryl group.

In Chemical Formula C-1, $m^1$ is 1 or 2 and $Y^1$ is a substituent represented by Chemical Formula X-1, or $m^2$ is 1 or 2 and $Y^2$ is a substituent represented by Chemical Formula X-1.

In Chemical Formula C-1, $n^1+n^2$ may be 3.

In Chemical Formula C-1, $n^1$ or $n^2$ may be 3.

In Chemical Formula C-1, L may be selected from Chemical Formulae L-1 to L-14.

Chemical Formula L-1

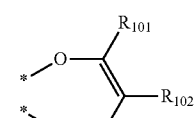

Chemical Formula L-2

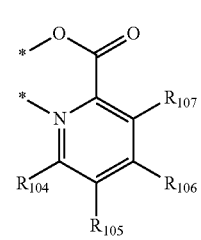

Chemical Formula L-3

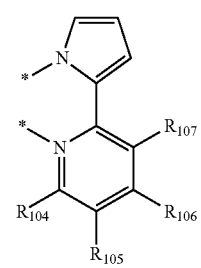

Chemical Formula L-4

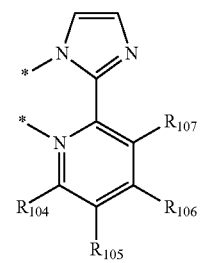

Chemical Formula L-5

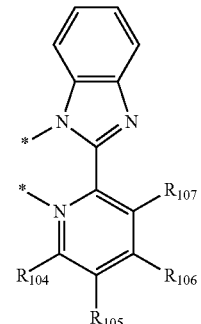

Chemical Formula L-6
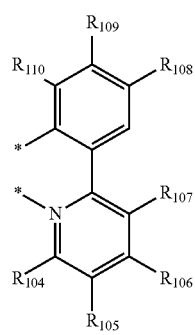
Chemical Formula L-7
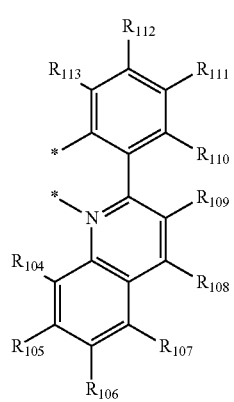
Chemical Formula L-8
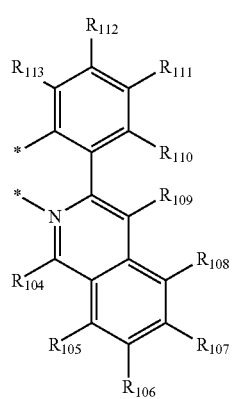
Chemical Formula L-9
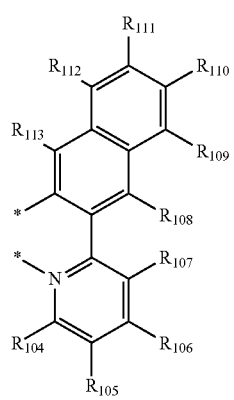
Chemical Formula L-10
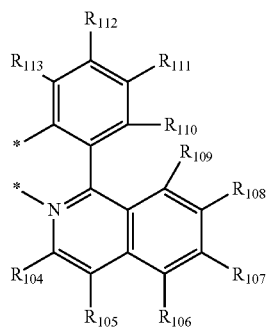
Chemical Formula L-11
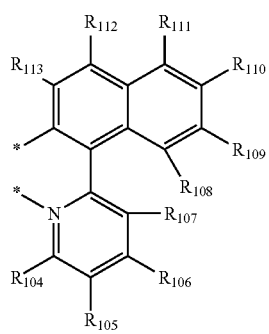
Chemical Formula L-12
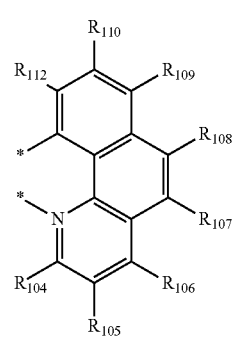
Chemical Formula L-13
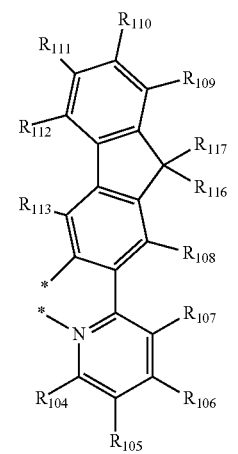

Chemical Formula L-14

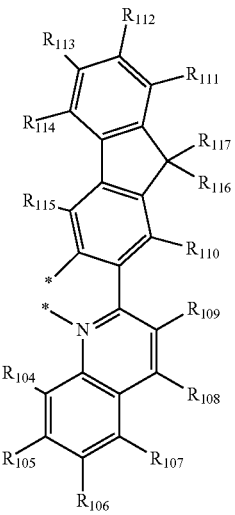

In Chemical Formula L-1 to L-14, asterisk (*) indicates a site bonding with iridium, $R_{101}$ to $R_{103}$ are independently hydrogen, deuterium, a C1 to C30 alkyl group substituted or unsubstituted with a halogen, or a C6 to C30 aryl group substituted or unsubstituted with a C1 to C30 alkyl group or a halogen, $R_{104}$ to $R_{115}$ are independently hydrogen, deuterium, a halogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C2 to C30 alkenyl group, a substituted or unsubstituted C6 to C30 aryl group, a substituted or unsubstituted C1 to C30 heteroaryl group, a substituted or unsubstituted C1 to C30 amino group, a substituted or unsubstituted C6 to C30 an arylamino group, $SF_5$, a trialkylsilyl group having a substituted or unsubstituted C1 to C30 alkyl group, a dialkylarylsilyl group having a substituted or unsubstituted C1 to C30 alkyl group and a C6 to C30 aryl group, or a triarylsilyl group having a substituted or unsubstituted C6 to C30 aryl group, $R_{116}$ to $R_{117}$ are independently hydrogen, deuterium, a C1 to C30 alkyl group substituted or unsubstituted with a halogen, or a C6 to C30 aryl group substituted or unsubstituted with a C1 to C30 alkyl group.

The substituted or unsubstituted C2 to C30 heteroaryl group having electronic properties may be a substituted or unsubstituted imidazolyl group, a substituted or unsubstituted triazolyl group, a substituted or unsubstituted tetrazolyl group, a substituted or unsubstituted oxadiazolyl group, a substituted or unsubstituted oxatriazolyl group, a substituted or unsubstituted thiatriazolyl group, a substituted or unsubstituted benzimidazolyl group, a substituted or unsubstituted benzotriazolyl group, a substituted or unsubstituted pyridinyl group, a substituted or unsubstituted pyrimidinyl group, a substituted or unsubstituted triazinyl group, a substituted or unsubstituted pyrazinyl group, a substituted or unsubstituted pyridazinyl group, a substituted or unsubstituted purinyl group, a substituted or unsubstituted quinolinyl group, a substituted or unsubstituted isoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted acridinyl group, a substituted or unsubstituted phenanthrolinyl group, or a substituted or unsubstituted phenazinyl group.

The substituted or unsubstituted C2 to C30 heteroaryl group having electronic properties may be represented by one of Chemical Formulae E-1 to E-5.

Chemical Formula E-1

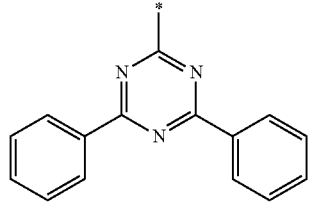

Chemical Formula E-2

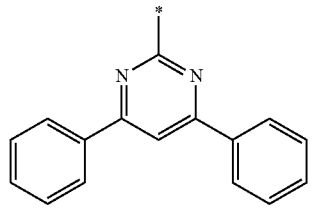

Chemical Formula E-3

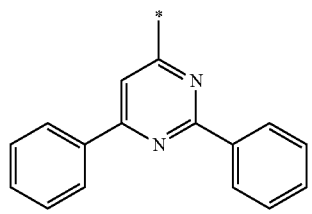

Chemical Formula E-4

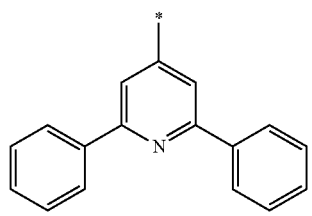

Chemical Formula E-5

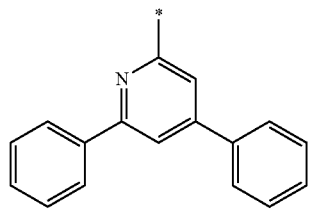

The Chemical Formula A-1 may be represented by one of the following Chemical Formulae H-1 to H-35.

Chemical Formula H-1
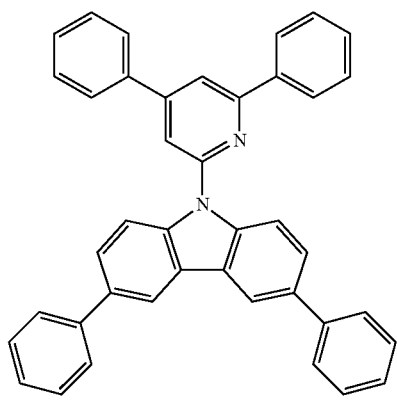
Chemical Formula H-2
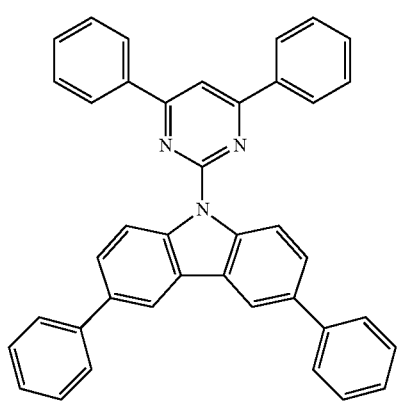
Chemical Formula H-3
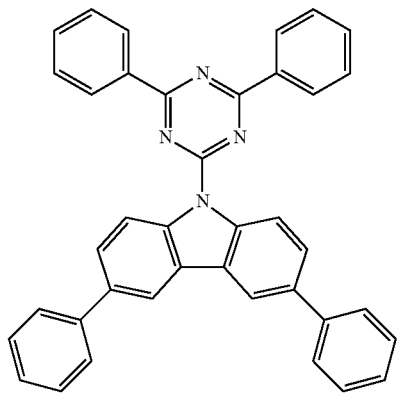
Chemical Formula H-4
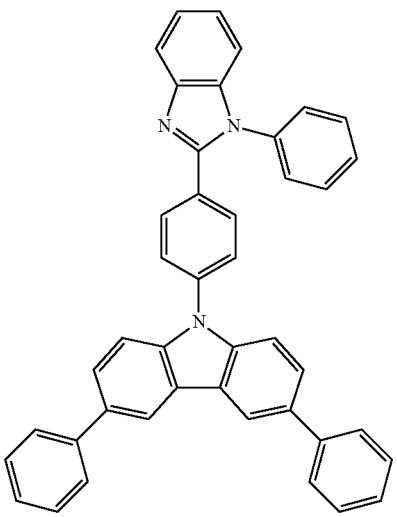
Chemical Formula H-5
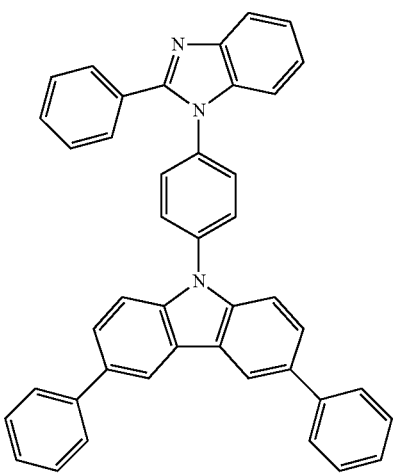
Chemical Formula H-6
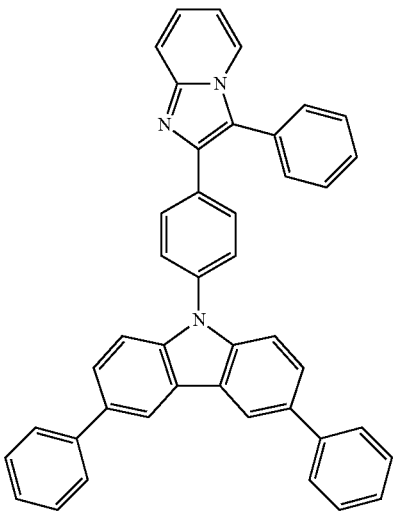

Chemical Formula H-7
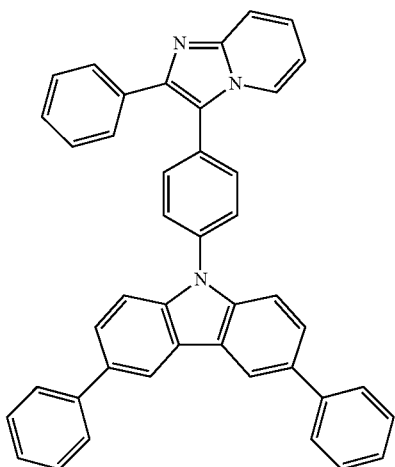
Chemical Formula H-8
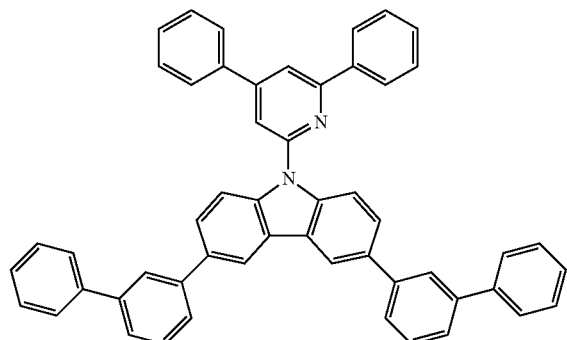
Chemical Formula H-9
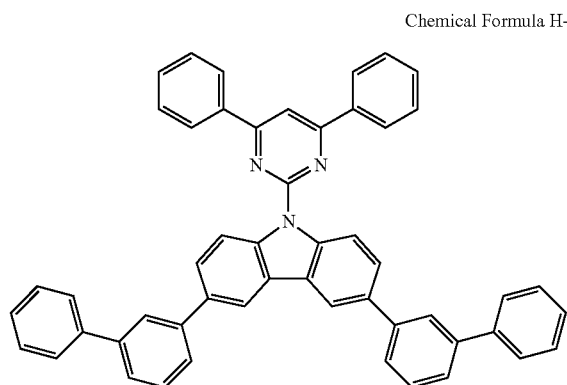
Chemical Formula H-10
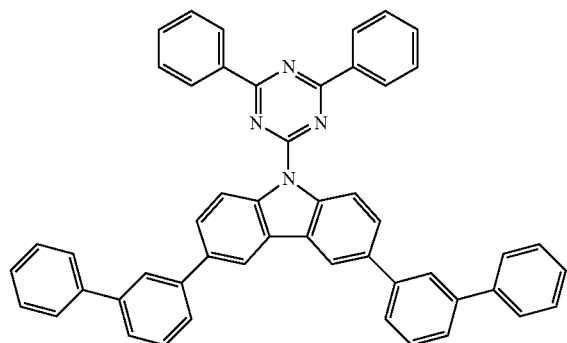
Chemical Formula H-11
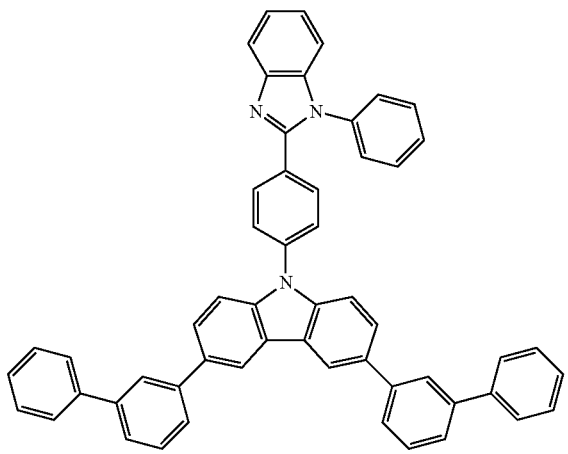
Chemical Formula H-12
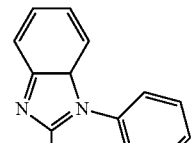
Chemical Formula H-13
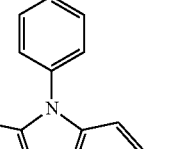

Chemical Formula H-14
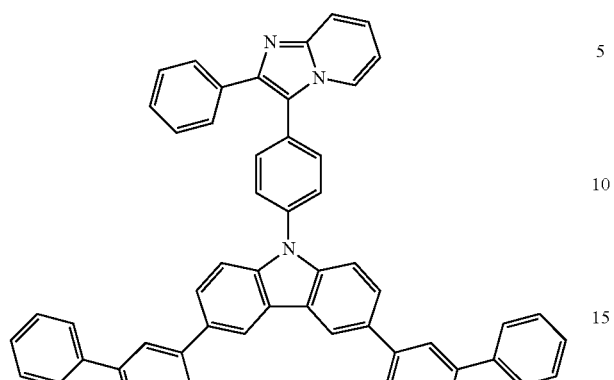
Chemical Formula H-15
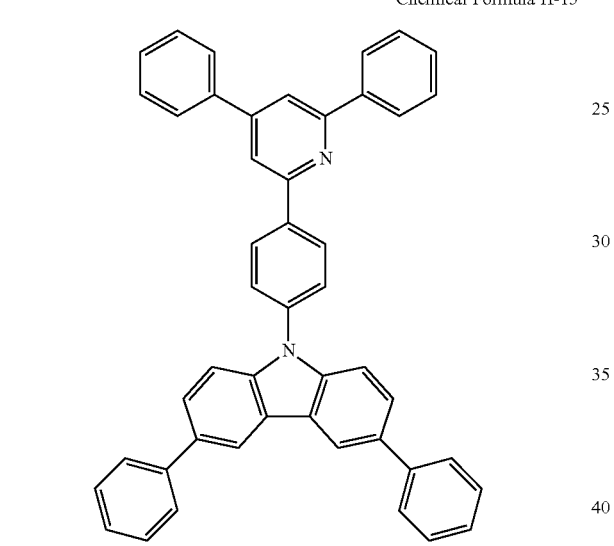
Chemical Formula H-16
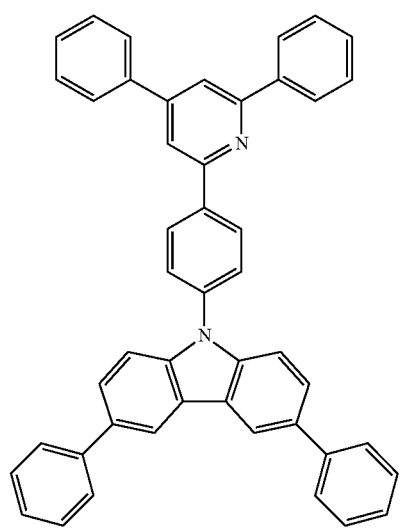
Chemical Formula H-17
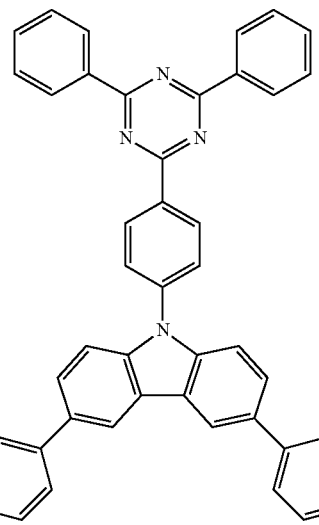
Chemical Formula H-18
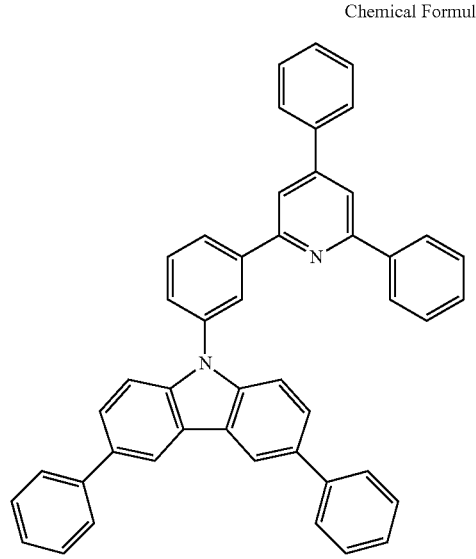
Chemical Formula H-19
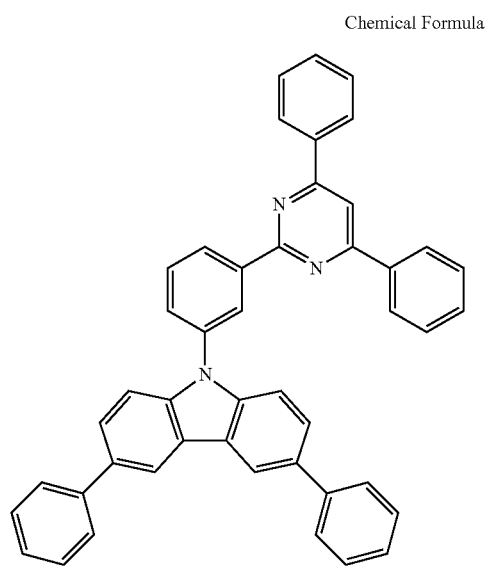

-continued
Chemical Formula H-20
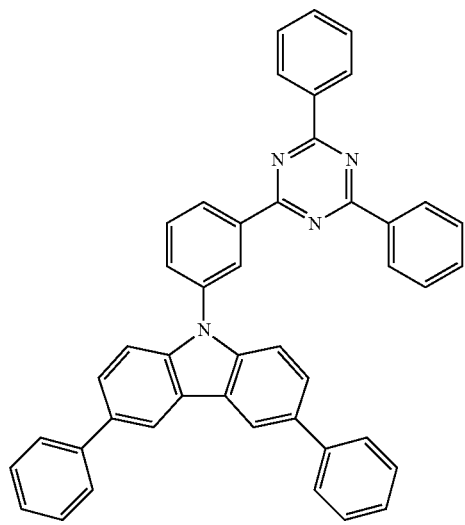
Chemical Formula H-21
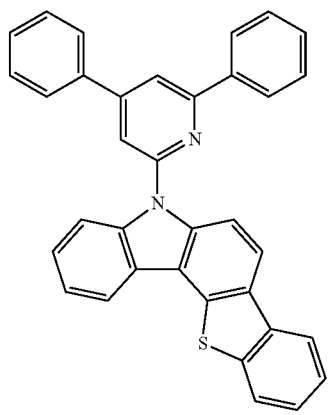
Chemical Formula H-22
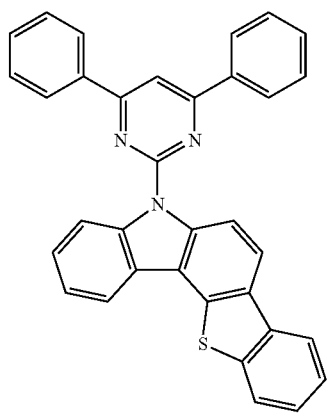
-continued
Chemical Formula H-23
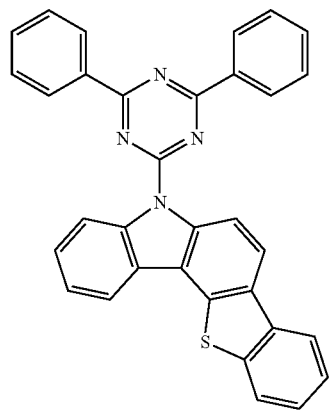
Chemical Formula H-24
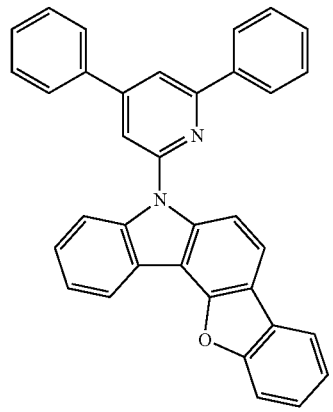
Chemical Formula H-25
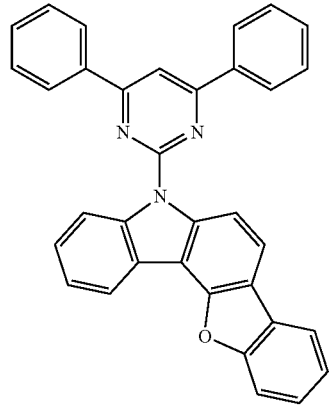

-continued
Chemical Formula H-26
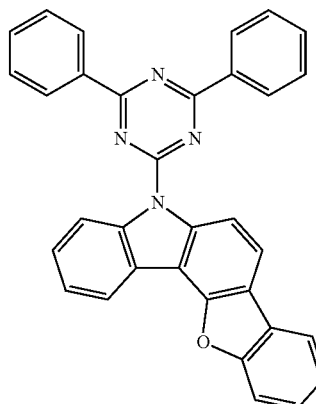
Chemical Formula H-27
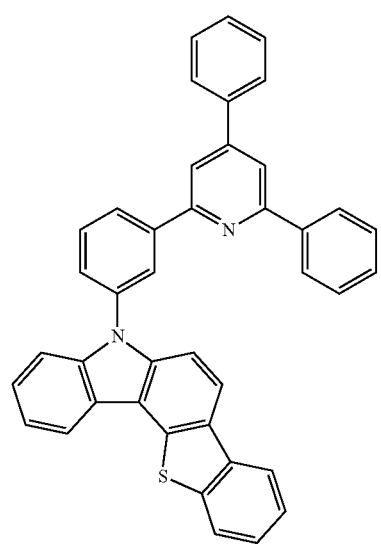
Chemical Formula H-28
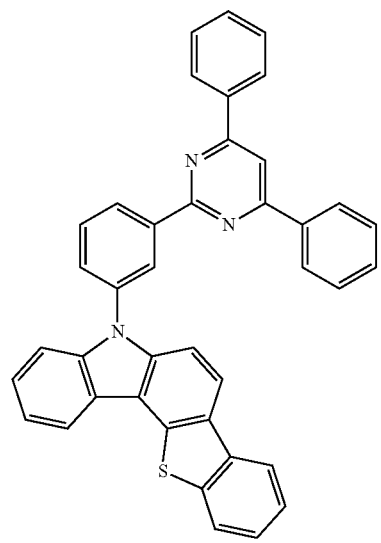
-continued
Chemical Formula H-29
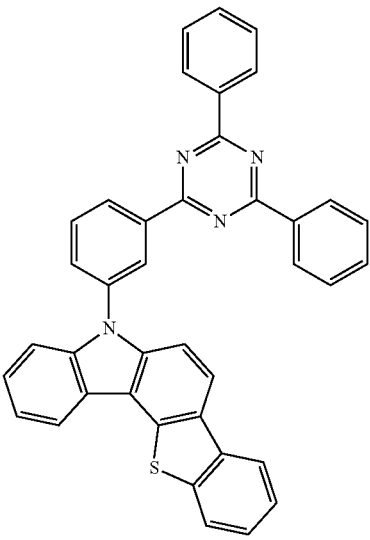
Chemical Formula H-30
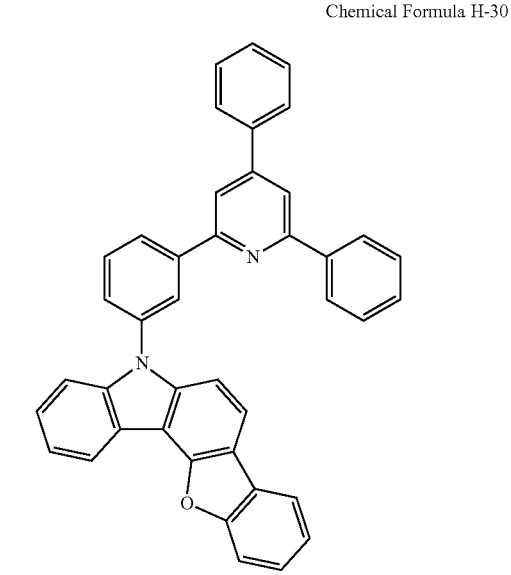

Chemical Formula H-31
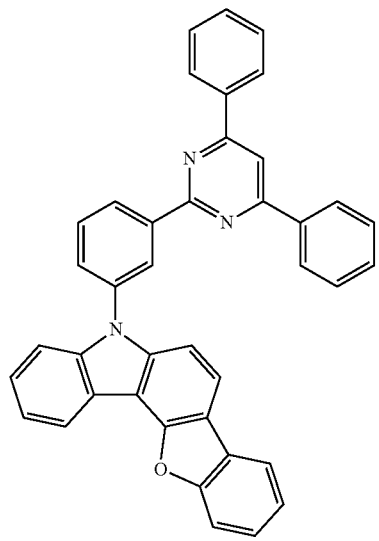
Chemical Formula H-32
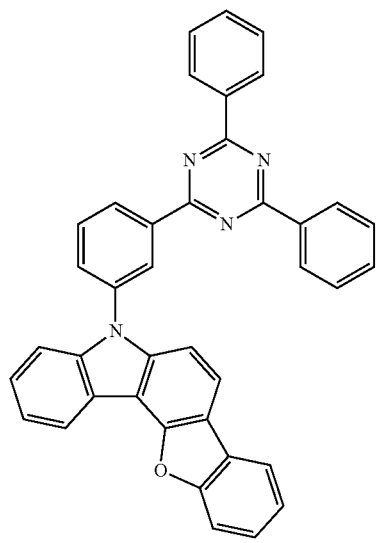
Chemical Formula H-33
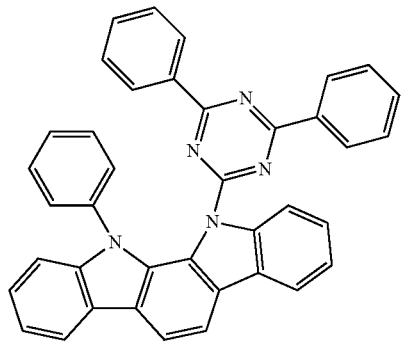
Chemical Formula H-34
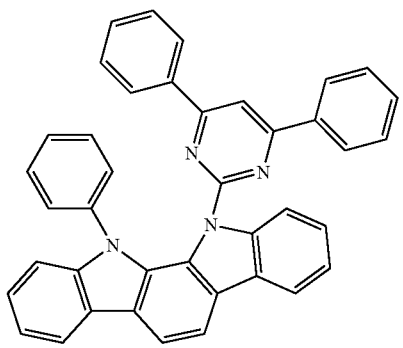
Chemical Formula H-35
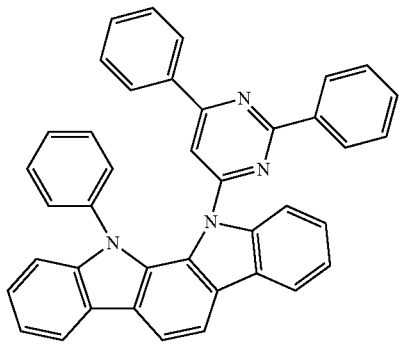
Chemical Formula B-1 may be represented by one of Chemical Formulae I-1 to I-31.
Chemical Formula I-1
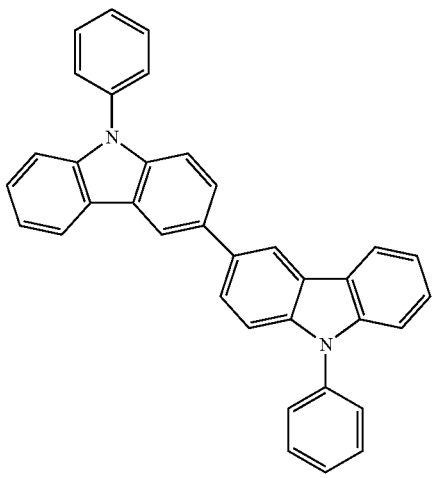

Chemical Formula I-2
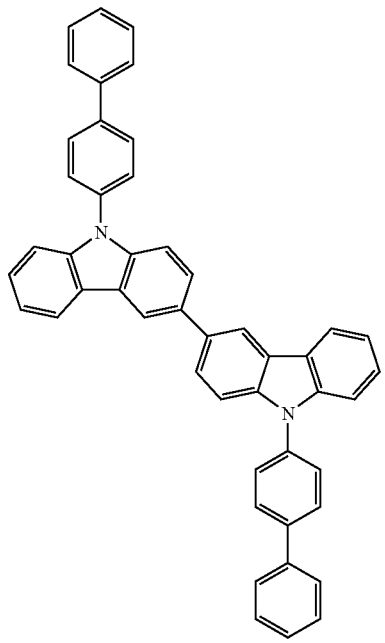
Chemical Formula I-3
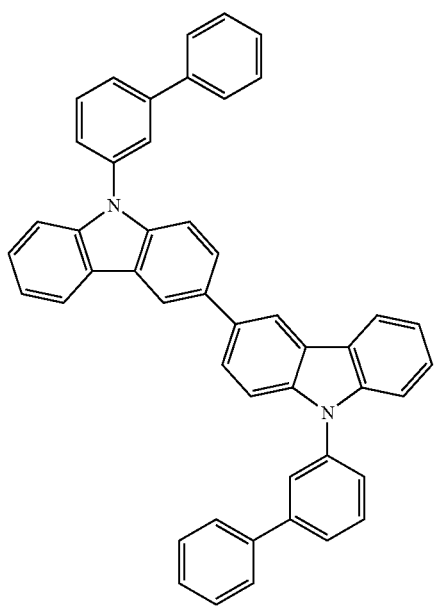
Chemical Formula I-4
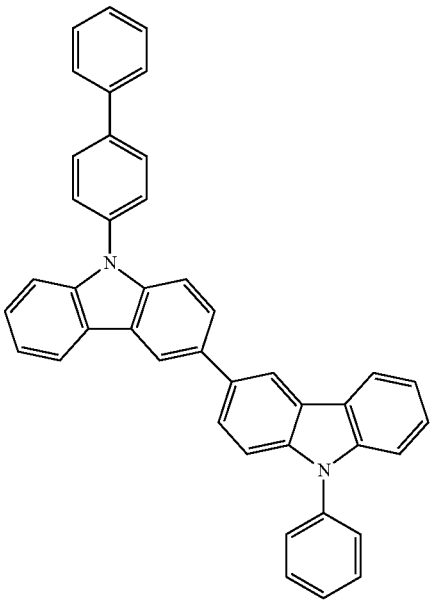
Chemical Formula I-5
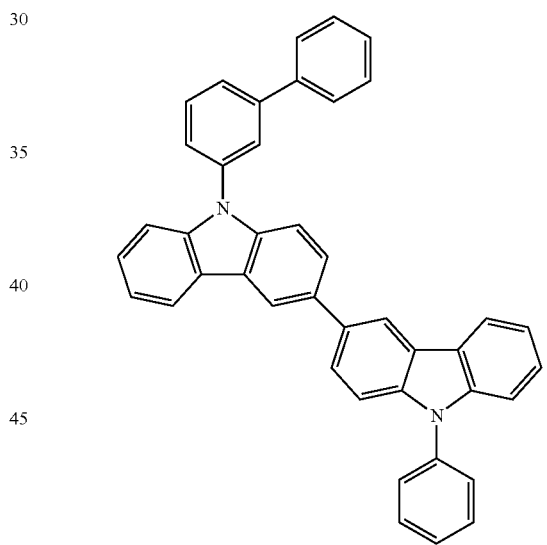
Chemical Formula I-6
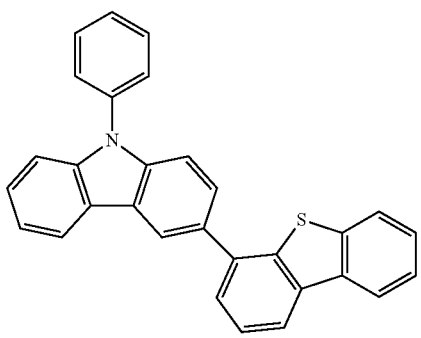

Chemical Formula I-7
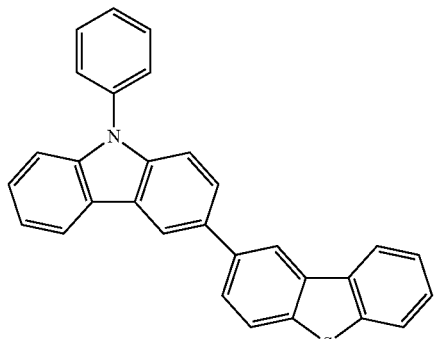
Chemical Formula I-8
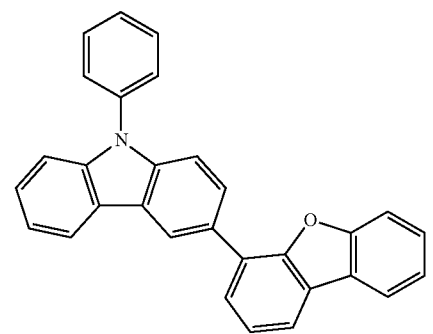
Chemical Formula I-9
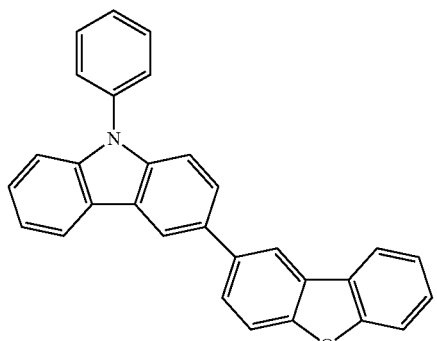
Chemical Formula I-10
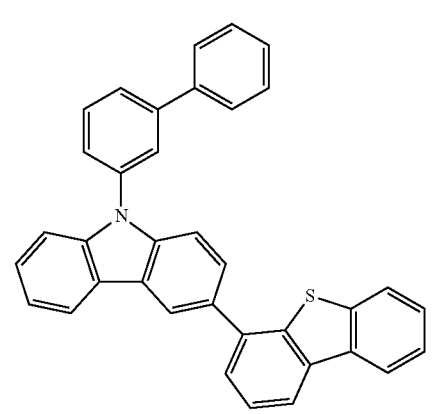
Chemical Formula I-11
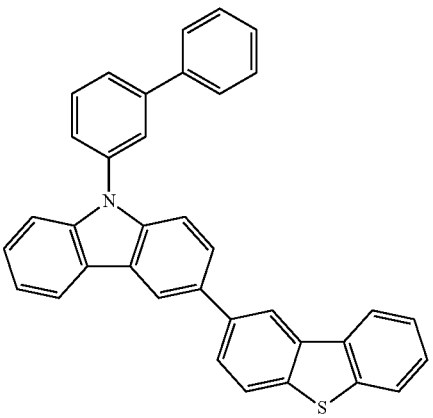
Chemical Formula I-12
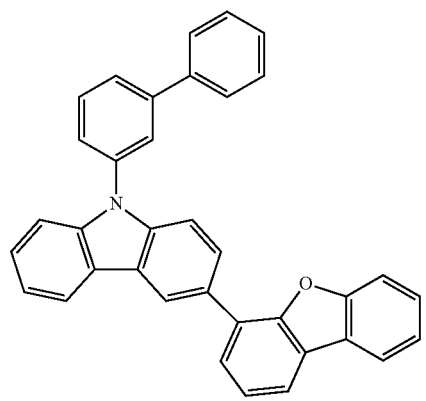
Chemical Formula I-13
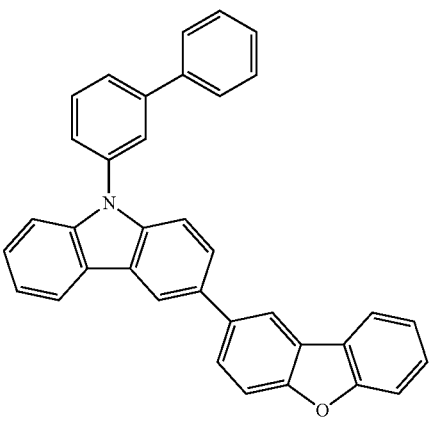

Chemical Formula I-14
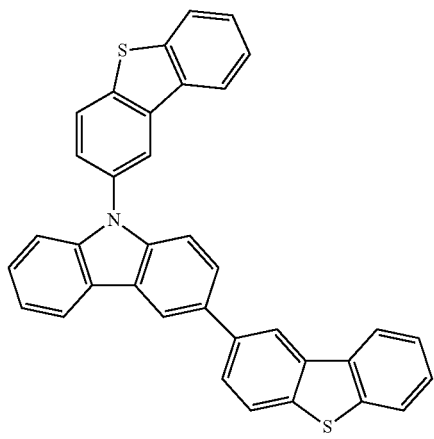
Chemical Formula I-15
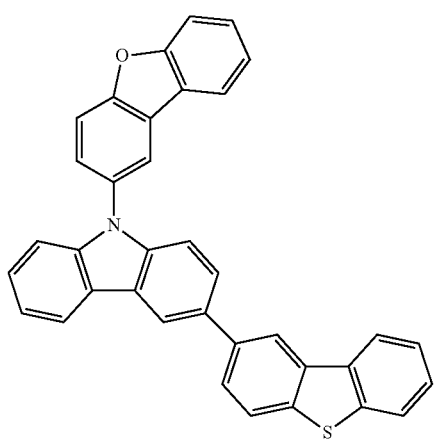
Chemical Formula I-16
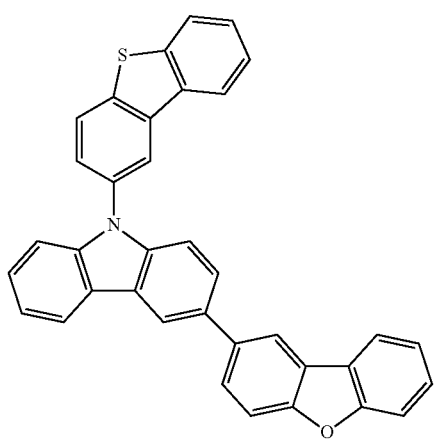
Chemical Formula I-17
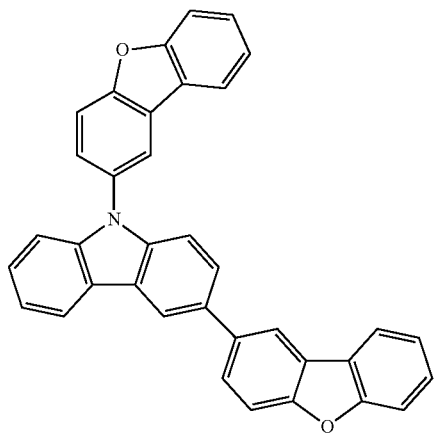
Chemical Formula I-18
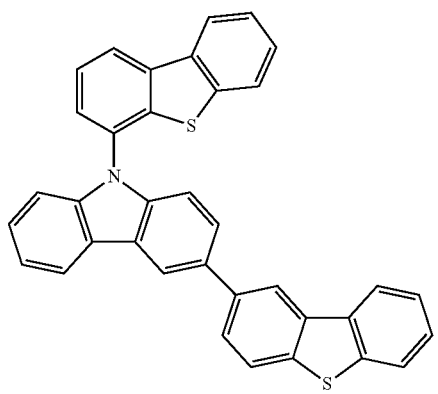
Chemical Formula I-19
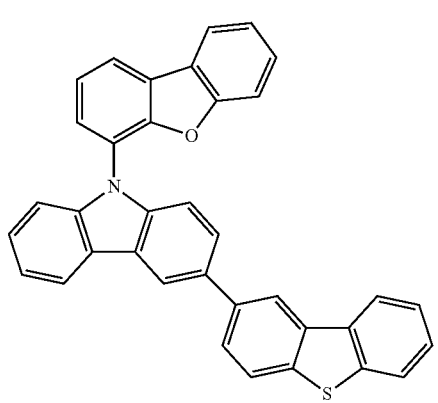

Chemical Formula I-20
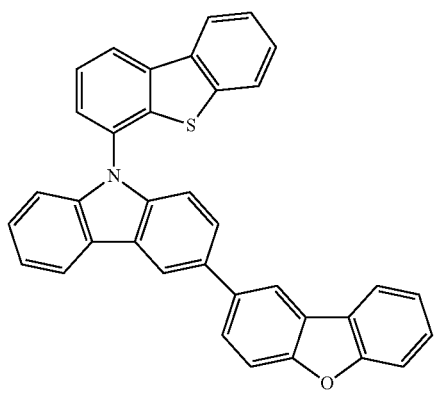
Chemical Formula I-21
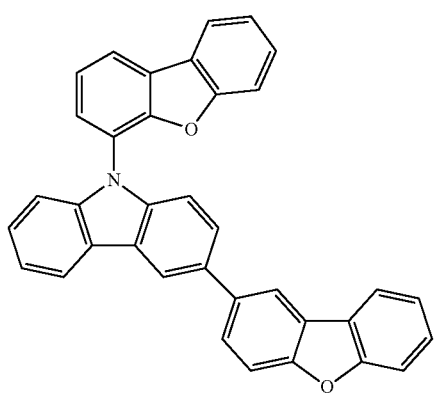
Chemical Formula I-22
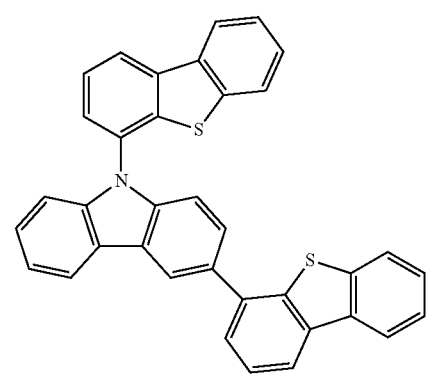
Chemical Formula I-23
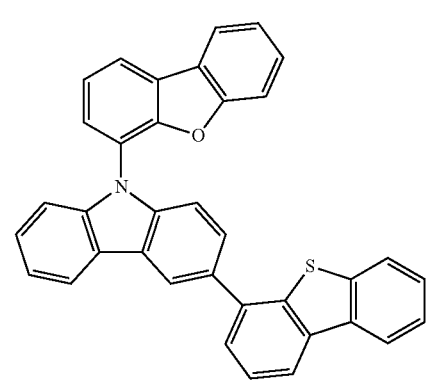
Chemical Formula I-24
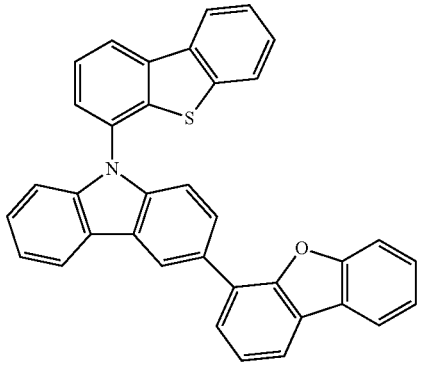
Chemical Formula I-25
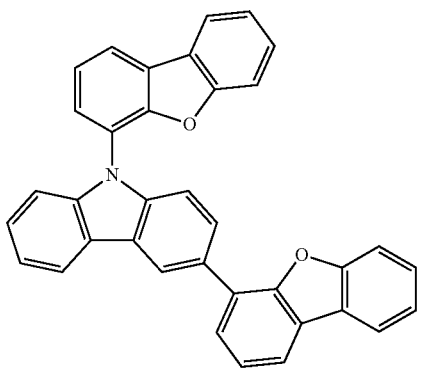
Chemical Formula I-26
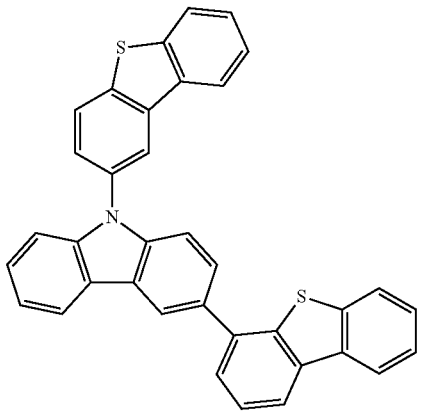
Chemical Formula I-27
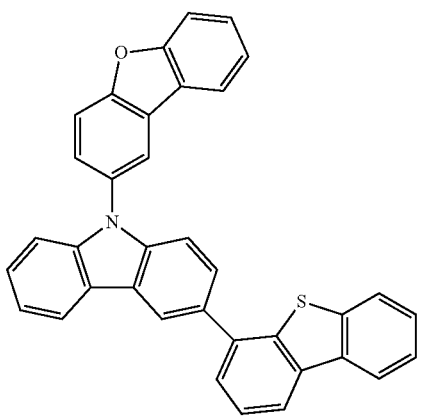

Chemical Formula I-28
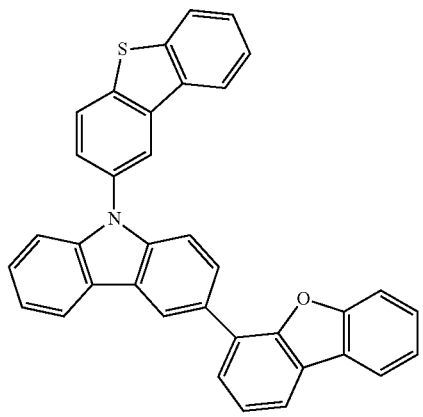
Chemical Formula I-29
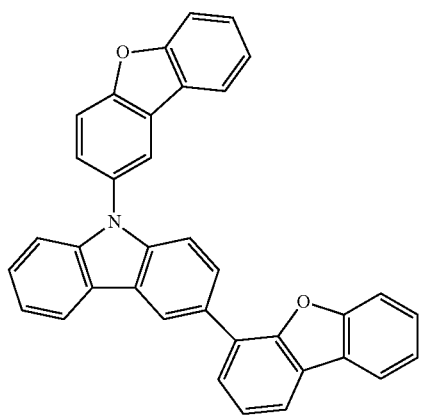
Chemical Formula I-30
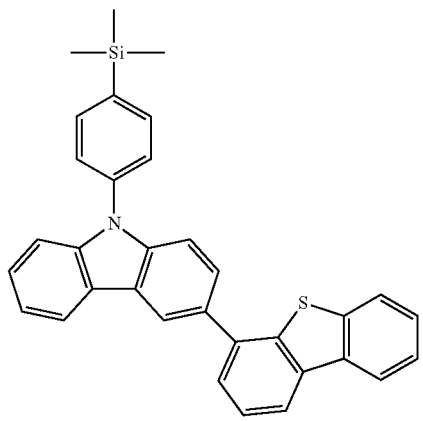
Chemical Formula I-31
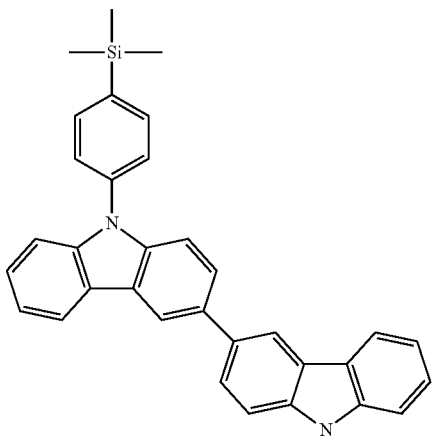
The Chemical Formula C-1 may be represented by one of the following Chemical Formulae J-1 to J-20.
Chemical Formula J-1
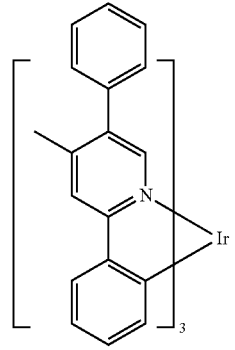
Chemical Formula J-2
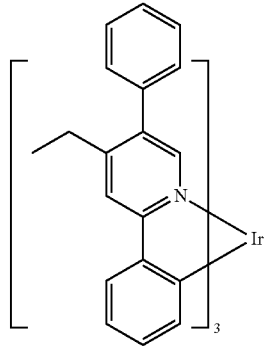

Chemical Formula J-3
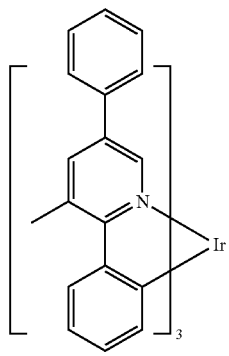
Chemical Formula J-4
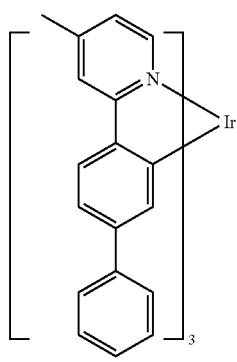
Chemical Formula J-5
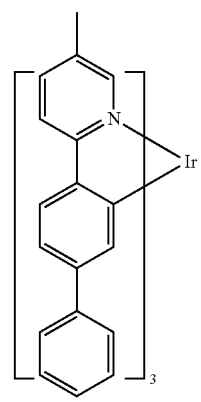
Chemical Formula J-6
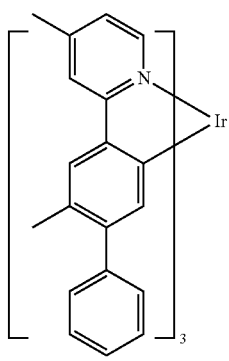
Chemical Formula J-7
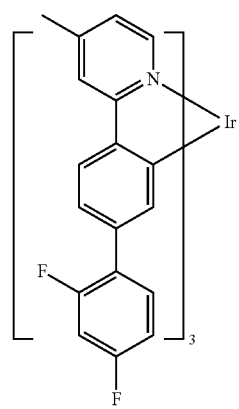
Chemical Formula J-8
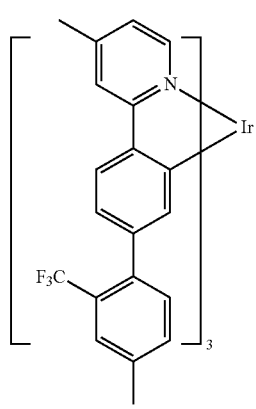
Chemical Formula J-9
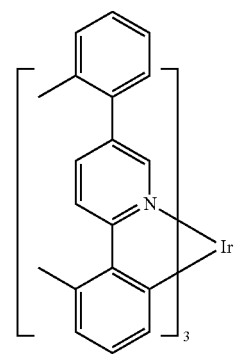
Chemical Formula J-10
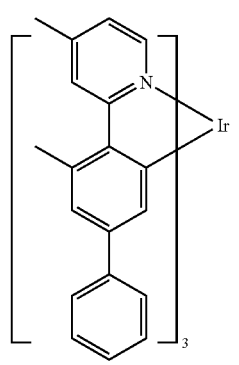

Chemical Formula J-11
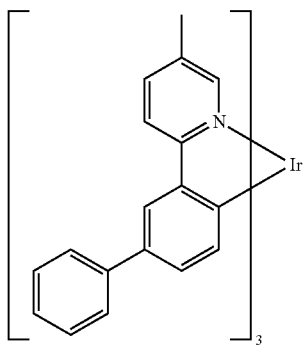
Chemical Formula J-12
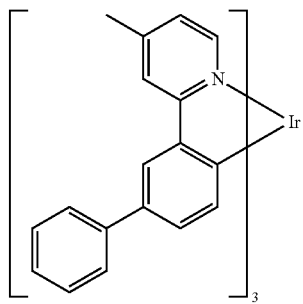
Chemical Formula J-13
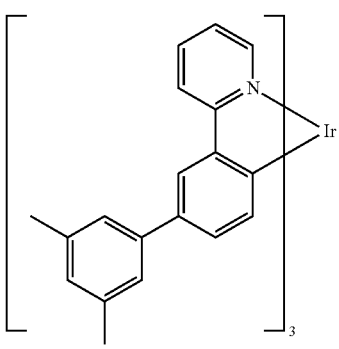
Chemical Formula J-14
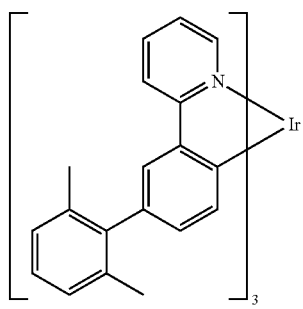
Chemical Formula J-15
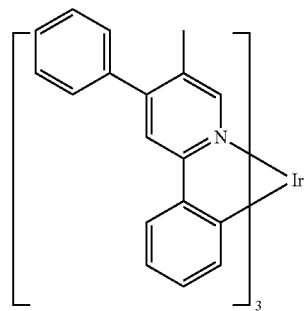
Chemical Formula J-16
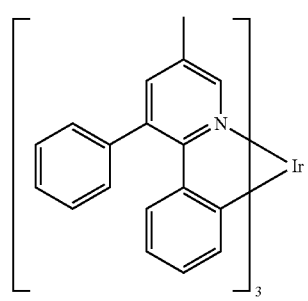
Chemical Formula J-17
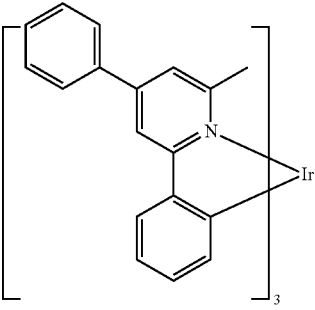
Chemical Formula J-18
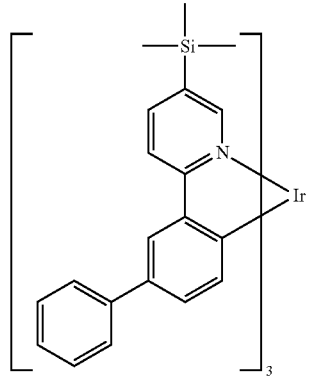

Chemical Formula J-19

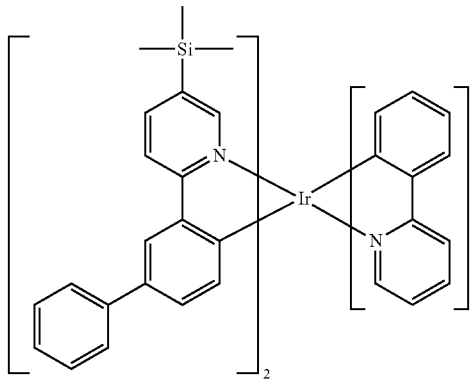

Chemical Formula J-20

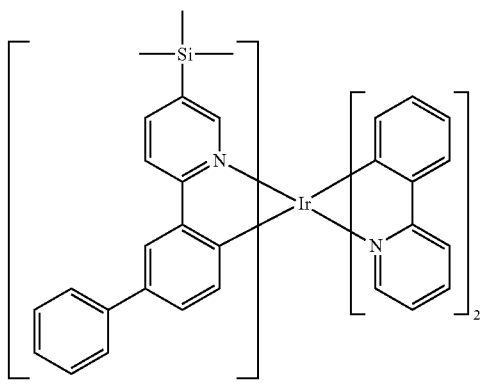

According to another embodiment, an organic light emitting diode including an anode, a cathode, and at least one organic layer between the anode and the cathode is provided. The at least one organic layer includes the material for an organic optoelectronic device according to the above embodiment.

The at least one organic layer may be an emission layer.

According to yet another embodiment, a display device including the organic light emitting diode is provided.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
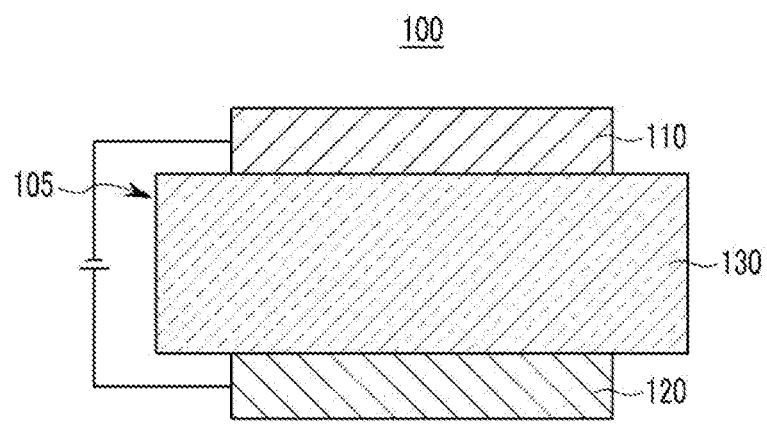
FIGS. 1 to 5 are cross-sectional views showing organic light emitting diodes according to various embodiments, including a material for an organic optoelectronic device according to an embodiment.

Exemplary embodiments will hereinafter be described in detail. However, these embodiments are only exemplary, and the present invention is not limited thereto but rather is defined by the scope of the appended claims. Accordingly, the embodiments are merely described below, by referring to the figures, to explain aspects of the present description. As used herein, the term "and/or" includes any and all combinations of one or more of the associated listed items. The term "or" means "and/or." Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Additional aspects will be set forth in part in the description which follows and, in part, will be apparent from the description.

As used herein, when specific definition is not otherwise provided, the term "substituted" refers to a group substituted with deuterium, a halogen, a hydroxy group (—OH), an amino group (—NH$_2$), a carboxyl group (—CO$_2$H), a substituted or unsubstituted C1 to C30 amine group, a nitro group (—NO$_2$), a substituted or unsubstituted C3 to C40 silyl group, a C1 to C30 alkyl group, a C1 to C10 alkylsilyl group, a C3 to C30 cycloalkyl group, a C6 to C30 aryl group, a C1 to C20 alkoxy group, a fluoro group (—F), a C1 to C10 trifluoroalkyl group such as a trifluoromethyl group (—$CF_3$) and the like, or a cyano group (—CN), instead of at least one hydrogen of a substituted group or compound.

Two adjacent substituents selected from a halogen, a hydroxy group, an amino group, a substituted or unsubstituted C1 to C20 amine group, a nitro (—$NO_2$), a substituted or unsubstituted C3 to C40 silyl group, a C1 to C30 alkyl group, a C1 to C10 alkylsilyl group, a C3 to C30 cycloalkyl group, a C6 to C30 aryl group, a C1 to C20 alkoxy group, a fluoro group (—F), a trifluoroalkyl group such as a trifluoromethyl group (—$CF_3$), or a cyano group (—CN) may be fused to each other to provide a ring.

As used herein, when specific definition is not otherwise provided, the term "hetero" refers to a group wherein one or more carbons are replaced with 1 to 3 hetero atoms selected from nitrogen (N), oxygen (O), sulfur (S), and phosphorus (P).

As used herein, when a definition is not otherwise provided, the term "combination thereof" refers to at least two substituents bound to each other by a linker, or at least two substituents fused to each other.

In the specification, when a definition is not otherwise provided, the term "alkyl group" may refer to an aliphatic hydrocarbon group. The alkyl group may be a saturated group without any double bond or triple bond.

The alkyl group may be branched, linear, or cyclic.

As used herein, the term "alkenyl group" may refer to a substituent including at least two carbon atoms and including at least one carbon-carbon double bond, and the "alkynyl group" may refer to a substituent including at least two carbon atoms and including at least one carbon-carbon triple bond.

The alkyl group may be a C1 to C20 alkyl group. In an embodiment, the alkyl group may be a C1 to C10 alkyl group or a C1 to C6 alkyl group. For example, the C1 to C4 alkyl group may have 1 to 4 carbon atoms, and may be selected from methyl, ethyl, propyl, iso-propyl, n-butyl, iso-butyl, sec-butyl, and t-butyl.

Examples of the alkyl group may include a methyl group, an ethyl group, a propyl group, an isopropyl group, a butyl group, an isobutyl group, a t-butyl group, a pentyl group, a hexyl group, a cyclopropyl group, a cyclobutyl group, a cyclopentyl group, a cyclohexyl group, and the like.

As used herein, the term "alkoxy group" may refer to "alkyl-O—", wherein the alkyl is the same as described above and having the specified number of carbon atoms. Non-limiting examples of the alkoxy group include methoxy, ethoxy, propoxy, 2-propoxy, butoxy, t-butoxy, pentyloxy, hexyloxy, cyclopropoxy, and cyclohexyloxy.

As used herein, the term "aryl group" may refer to a substituent including all elements of the cycle having p-orbitals which form conjugation. The "aryl group" may refer to a monocyclic or fused ring polycydic (i.e., wherein the rings share adjacent pairs of carbon atoms) group.

As used herein, the term "aryloxy group" may refer to "—O-aryl" having the specified number of carbon atoms. A non-limiting example of the aryloxy group is phenoxy.

As used herein, the term "silyl group" may refer to a monovalent or higher valency group derived from a completely saturated, branched or unbranched (or a straight or linear) silane, and having the specified number of carbon atoms. A non-limiting example of silyl group is trimethylsilyl ((CH$_3$)$_3$Si—).

As used herein, the term "silyloxy group" may refer to "—O-silyl" having the specified number of carbon atoms. A non-limiting example of silyloxy group is trimethylsilyloxy ((CH$_3$)$_3$SiO—).

As used herein, the term "acyl group" may refer to "—C(=O)-alkyl" wherein the alkyl is the same as described above and having the specified number of carbon atoms. A non-limiting example of the acyl group is acetyl (CH$_3$C(=O)—).

As used herein, the term "alkoxycarbonyl group" may refer to "—C(=O)—O-alkyl" wherein the alkyl is the same as described above and having the specified number of carbon atoms. A non-limiting example of the alkoxycarbonyl group is methoxycarbonyl (CH$_3$OC(=O)—).

As used herein, the term "acyloxy group" may refer to "—O-acyl" wherein the acyl is the same as described above and having the specified number of carbon atoms. A non-limiting example of the acyloxy group is acetyloxy (CH$_3$C(=O)O—).

As used herein, the term "acylamino group" may refer to "—NH-acyl" wherein the acyl is the same as described above and having the specified number of carbon atoms. A non-limiting example of the acylamino group is acetylamino (CH$_3$C(=O)NH—).

As used herein, the term "alkoxycarbonylamino group" may refer to "—NH—C(=O)—O-alkyl" wherein the alkyl is the same as described above and having the specified number of carbon atoms. A non-limiting example of the alkoxycarbonylamino group is methoxycarbonylamino (CH$_3$OC(=O)NH—).

As used herein, the term "aryloxycarbonylamino group" may refer to "—NH—C(=O)—O-aryl" wherein the aryl is the same as described above and having the specified number of carbon atoms. A non-limiting example of the aryloxycarbonylamino group is phenoxycarbonylamino (PhOC(=O)NH—).

As used herein, the term "sulfamoylamino group" may refer to H$_2$NS(O$_2$)NH—, alkyl-NHS(O$_2$)NH—, (alkyl)$_2$NS(O$_2$)NH—, aryl-NHS(O$_2$)NH—, (aryl)$_2$NS(O)$_2$NH—, heteroaryl-NHS(O$_2$)—NH—, or (heteroaryl)$_2$NHS(O$_2$)—NH—, wherein alkyl, aryl, and heteroaryl are the same as described above and having the specified number of carbon atoms.

As used herein, the term "sulfonyl group" may refer to alkyl-S(O$_2$)—, aryl-S(O$_2$)—, or heteroaryl-S(O$_2$)—, wherein alkyl, aryl, and heteroaryl are the same as described above and having the specified number of carbon atoms.

As used herein, the term "alkylthio group" may refer to "alkyl-S—", wherein the alkyl is the same as described above and having the specified number of carbon atoms. Non-limiting example of the alkylthio group include methyithio.

As used herein, the term "arylthio group" may refer to "aryl-S—", wherein the aryl is the same as described above and having the specified number of carbon atoms. Non-limiting example of the arylthio group include phenylthio.

As used herein, the term "heterocyclothio group" may refer to "heterocyclo-S—", wherein the heterocyclo is a saturated hydrocarbon ring group, including at least one heteroatom selected from nitrogen (N), oxygen (O), phosphorous (P), and sulfur (S), wherein the rest of the cyclic atoms are carbon, and having the specified number of carbon atoms. A non-limiting example of a heterocycloalkyl group includes tetrahydro-2H-pyran-2-yl-thio-(OC$_5$H$_9$—S—).

As used herein, the term "ureide group" may refer to H$_2$NC(O)NH—, alkyl-NHC(O)NH—, (alkyl)$_2$NC(O)NH—, aryl-NHC(O)NH—, (aryl)$_2$NC(O)NH—, heteroaryl- NHC(O)—NH—, or (heteroaryl)₂NHC(O)NH—, wherein alkyl, aryl, and heteroaryl are the same as described above and having the specified number of carbon atoms.

As used herein, the term "halogen" may refer to —F, —Cl, —Br, or —I.

As used herein, the term "ferrocenyl group" may refer to a monovalent or higher valency group derived from ferrocene (bis(η5-cyclopentadienyl)iron) by a removal of one or more hydrogen atoms.

As used herein, the term "alkenylene group" may refer to a straight or branched chain, divalent hydrocarbon group having at least one carbon-carbon double bond, and having the specified number of carbon atoms. A non-limiting example of the alkenylene group includes propenylene.

As used herein, the term "alkynylene group" may refer to a straight or branched chain, divalent hydrocarbon group having at least one carbon-carbon double bond, and having the specified number of carbon atoms. A non-limiting example of the alkynylene group includes propynylene.

As used herein, the term "arylene group" may refer to a divalent group formed by the removal of two hydrogen atoms from one or more rings of an arene, wherein the hydrogen atoms may be removed from the same or different rings. Non-limiting examples of the arylene group include phenylene or napthylene.

As used herein, the term "heteroarylene group" may refer to a divalent group formed by the removal of two hydrogen atoms from one or more rings of a heteroaryl moiety, wherein the hydrogen atoms may be removed from the same or different rings, each of which rings may be aromatic or nonaromatic. A non-limiting example of the heteroarylene group includes pyrid-2,5-ylene.

As used herein, the term "heteroaryl group" may refer to an aryl group including 1 to 3 hetero atoms selected from nitrogen (N), oxygen (O), sulfur (S), and phosphorus (P), and remaining carbons in one functional group. The heteroaryl group may be a fused ring cyclic group where each cycle may include the 1 to 3 heteroatoms.

Non-limiting examples of a monocyclic heteroaryl group include thienyl, furyl, pyrrolyl, imidazolyl, pyrazolyl, thiazolyl, isothiazolyl, 1,2,3-oxadiazolyl, 1,2,4-oxadiazolyl, 1,2,5-oxadiazolyl, 1,3,4-oxadiaxolyl, 1,2,3-thiadiazolyl, 1,2,4-thiadiazolyl, 1,2,5-thiadiazolyl, 1,3,4-thiazolyl, isothiazol-3-yl, isothiazol-4-yl, isothiazol-5-yl, oxazol-2-yl, oxazol-4-yl, oxazol-5-yl, isoxazol-3-yl, isoxazol-4-yl, isoxazol-5-yl, 1,2,4-triazol-3-yl, 1,2,4-triazol-5-yl, 1,2,3-triazol-4-yl, 1,2,3-triazol-5-yl, tetrazolyl, pyrid-2-yl, pyrid-3-yl, 2-pyrazin-2-yl, pyrazin-4-yl, pyrazin-5-yl, 2-pyrimidin-2-yl, 4-pyrimidin-2-yl, and 5-pyrimidin-2-yl.

Non-limiting examples of a bicyclic heteroaryl group include indolyl, isoindolyl, indazolyl, indolizinyl, purinyl, quinolizinyl, quinolinyl, isoquinolinyl, cinnolinyl, phthalazinyl, naphthyridinyl, quinazolinyl, quinaxalinyl, phenanthridinyl, phenathrolinyl, phenazinyl, phenothiazinyl, phenoxazinyl, benzisoqinolinyl, thieno[2,3-b]furanyl, furo[3,2-b]-pyranyl, 5H-pyrido[2,3-d]-o-oxazinyl, 1H-pyrazolo[4,3-d]-oxazolyl, 4H-imidazo[4,5-d]thiazolyl, pyrazino[2,3-d]pyridazinyl, imidazo[2,1-b]thiazolyl, imidazo[1,2-b][1,2,4]triazinyl, 7-benzo[b]thienyl, benzoxazolyl, benzimidazolyl, benzothiazolyl, benzoxapinyl, benzoxazinyl, 1H-pyrrolo[1,2-b][2]benzazapinyl, benzofuryl, benzothiophenyl, benzotriazolyl, pyrrolo[2,3-b]pyridinyl, pyrrolo[3,2-c]pyridinyl, pyrrolo[3,2-b]pyridinyl, imidazo[4,5-b]pyridinyl, imidazo[4,5-c]pyridinyl, pyrazolo[4,3-d]pyridinyl, pyrazolo[4,3-c]pyridinyl, pyrazolo[3,4-c]pyridinyl, pyrazolo[3,4-d]pyridinyl, pyrazolo[3,4-b]pyridinyl, imidazo[1,2-a]pyridinyl, pyrazolo[1,5-a]pyridinyl, pyrrolo[1,2-b]pyridazinyl, imidazo[1,2-c]pyrimidinyl, pyrido[3,2-d]pyrimidinyl, pyrido[4,3-d]pyrimidinyl, pyrido[3,4-d]pyrimidinyl, pyrido[2,3-d]pyrimidinyl, pyrido[2,3-b]pyrazinyl, pyrido[3,4-b]pyrazinyl, pyrimido[5,4-d]pyrimidinyl, pyrazino[2,3-b]pyrazinyl, and pyrimido[4,5-d]pyrimidinyl.

In this specification, the term "hole properties" may refer to a characteristic that a hole formed in the anode is readily injected into the emission layer and transported in the emission layer due to a conductive characteristic according to HOMO level. For example, the hole properties are similar to electron-repelling properties.

In this specification, the term "electronic properties" may refer to a characteristic that an electron formed in the negative electrode is readily injected into the emission layer and transported in the emission layer due to a conductive characteristic according to LUMO level. For example, the hole properties are similar to electron-withdrawing properties.

According to an embodiment, a material for an organic optoelectronic device including a first compound represented by the following Chemical Formula A-1 and a second compound represented by the following Chemical Formula B-1 is provided.

Chemical Formula A-1

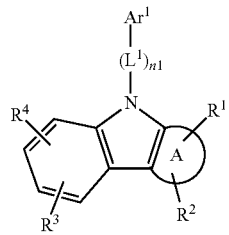

In Chemical Formula A-1,

Ar¹ is a substituted or unsubstituted C2 to C30 heteroaryl group having electronic properties, L¹ is a substituted or unsubstituted C2 to C6 alkenylene group, a substituted or unsubstituted C2 to C6 alkynylene group, a substituted or unsubstituted C6 to C30 arylene group, a substituted or unsubstituted C2 to C30 heteroarylene group, or a combination thereof, n1 is an integer of 0 to 3, R¹ to R⁴ are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthio group, a substituted or unsubstituted C6 to C20 arylthio group, a substituted or unsubstituted C1 to C20 heterocyclothio group, a substituted or unsubstituted C1 to C20 ureide group, a substituted or unsubstituted C3 to C40 silyl group, or a combination thereof, A is a substituted or unsubstituted C5 to C80 aryl group or a substituted or unsubstituted X2 to C80 heteroaryl group, and A includes one ring or five rings.

Chemical Formula B-1

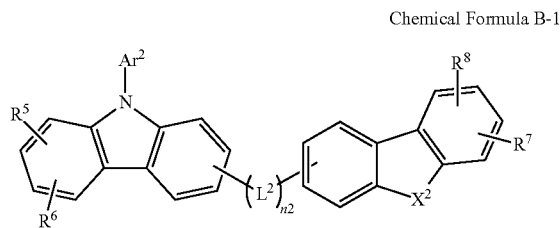

In Chemical Formula B-1, $X^2$ is —O—, —S—, or —NR'—, $Ar^2$, $R^5$ to $R^8$, and R' are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthio group, a substituted or unsubstituted C6 to C20 arylthio group, a substituted or unsubstituted C1 to C20 heterocyclothio group, a substituted or unsubstituted C1 to C20 ureide group, a substituted or unsubstituted C3 to C40 silyl group, or a combination thereof, $L^2$ is a substituted or unsubstituted C2 to C6 alkenylene group, a substituted or unsubstituted C2 to C6 alkynylene group, a substituted or unsubstituted C6 to C30 arylene group, a substituted or unsubstituted C2 to C30 heteroarylene group, or a combination thereof, and n2 is an integer of 0 to 3.

The material for an organic optoelectronic device simultaneously including a first compound represented by the following Chemical Formula A-1 and a second compound represented by the following Chemical Formula B-1 may adjust a balance between holes and electrons in an emission layer. Specifically, the compound represented by Chemical Formula A-1 may have excellent electronic properties, while the compound represented by Chemical Formula B-1 may have excellent hole properties. In general, a balance between holes and electrons in an emission layer may improve luminous efficiency of an organic optoelectronic device. Accordingly, the balance between holes and electrons may be adjusted in an emission layer, and thus luminous efficiency and life-span of a device may be increased by combining the compounds in a predetermined ratio.

In an embodiment, a conventional compound having a bis-carbazole structure is combined with a substituent having electronic properties and then used together for an emission layer. Accordingly, the conventional compound does not adjust but determines a balance between holes and electrons, since the holes and electrons are injected through energy level of the compound. However, when a host having hole properties and another host having electronic properties are simultaneously used, the balance between holes and electrons may be adjusted by regulating the combination ratio of the two hosts, and thus the amounts of the holes and the elections injected into the emission layer.

In another embodiment, the compound represented by Chemical Formula A-1 and the compound represented by Chemical Formula B-1 may be mixed in a ratio ranging from about 3:7 to about 7:3, and in an embodiment from 4:6 to about 6:4.

More specifically, A may be represented by the following Chemical Formulae A-2 or A-3.

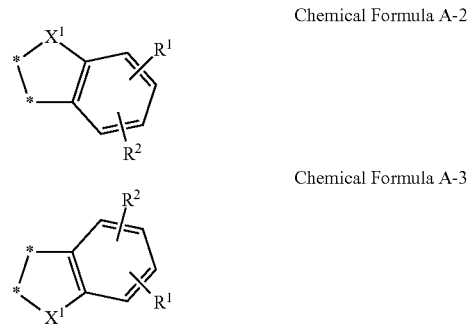

In Chemical Formula A-2 and A-3, two adjacent *'s indicate bonding positions with Chemical Formula A-1, $X^1$ is O—, —S—, or —NR'—, and $R^1$, $R^2$, and R' are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthio group, a substituted or unsubstituted C6 to C20 arylthio group, a substituted or unsubstituted C1 to C20 heterocyclothio group, a substituted or unsubstituted C1 to C20 ureide group, a substituted or unsubstituted C3 to C40 silyl group, or a combination thereof.

In this case, fused rings may improve thermal stability of the compound. However, Chemical Formulae A-2 and A-3 are not limited thereto.

In another embodiment, A may be represented by one of the following Chemical Formulae A-4 to A-9.

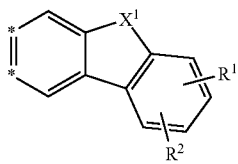

Chemical Formula A-4

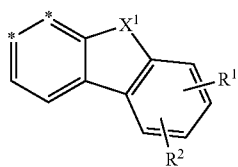

Chemical Formula A-5

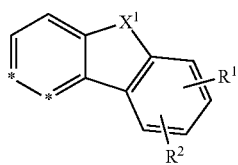

Chemical Formula A-6

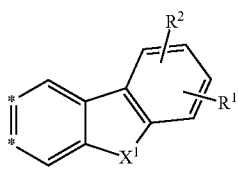

Chemical Formula A-7

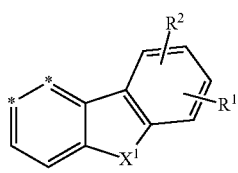

Chemical Formula A-8

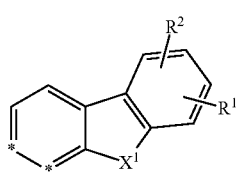

Chemical Formula A-9

In Chemical Formula A-4 to A-9, two adjacent *'s indicate bonding positions with Chemical Formula A-1, $X^1$ is —O—, —S—, or —NR'—, and $R^1$, $R^2$, and R' are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthio group, a substituted or unsubstituted C6 to C20 arylthio group, a substituted or unsubstituted C1 to C20 heterocyclothio group, a substituted or unsubstituted C1 to C20 ureide group, a substituted or unsubstituted C3 to C40 silyl group, or a combination thereof.

In this case, fused rings may improve thermal stability of the compound. However, Chemical Formula A-4 to A-9 are not limited thereto.

In another embodiment, In Chemical Formula A-1 may be represented by the following Chemical Formula A-10.

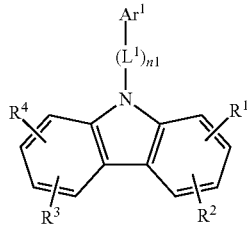

Chemical Formula A-10

In Chemical Formula A-10, $Ar^1$ is a substituted or unsubstituted C2 to C30 heteroaryl group having electronic properties, $L^1$ is a substituted or unsubstituted C2 to C6 alkenylene group, a substituted or unsubstituted C2 to C6 alkynylene group, a substituted or unsubstituted C6 to C30 arylene group, a substituted or unsubstituted C2 to C30 heteroarylene group, or a combination thereof, n1 is an integer of 0 to 3, and $R^1$ to $R^4$ are independently hydrogen, deuterium, a halogen, a cyano group, a hydroxyl group, an amino group, a substituted or unsubstituted C1 to C20 amine group, a nitro group, a carboxyl group, a ferrocenyl group, a substituted or unsubstituted C1 to C20 alkyl group, a substituted or unsubstituted C6 to C30 aryl group, a substituted or unsubstituted C2 to C30 heteroaryl group, a substituted or unsubstituted C1 to C20 alkoxy group, a substituted or unsubstituted C6 to C20 aryloxy group, a substituted or unsubstituted C3 to C40 silyloxy group, a substituted or unsubstituted C1 to C20 acyl group, a substituted or unsubstituted C2 to C20 alkoxycarbonyl group, a substituted or unsubstituted C2 to C20 acyloxy group, a substituted or unsubstituted C2 to C20 acylamino group, a substituted or unsubstituted C2 to C20 alkoxycarbonylamino group, a substituted or unsubstituted C7 to C20 aryloxycarbonylamino group, a substituted or unsubstituted C1 to C20 sulfamoylamino group, a substituted or unsubstituted C1 to C20 sulfonyl group, a substituted or unsubstituted C1 to C20 alkylthio group, a substituted or unsubstituted C6 to C20 arylthio group, a substituted or unsubstituted C1 to C20 heterocyclothio group, a substituted or unsubstituted C1 to C20 ureide group, a substituted or unsubstituted C3 to C40 silyl group, or a combination thereof.

In this case, the compound may be easily synthesized.

The compound for an organic optoelectronic device represented by Chemical Formula A-1 and/or B-1 includes a core part and various substituents for substituting the core part, and thus may have various energy bandgaps.

The compound may have an appropriate energy level depending on the substituents, and thus may fortify electron transport capability and hole transport capability of an organic optoelectronic device and bring about excellent effects in terms of efficiency and driving voltage, and may also have excellent electrochemical and thermal stability and thus improve life-span characteristics during the operation of the organic optoelectronic device.

In an embodiment, the substituted or unsubstituted C6 to C30 aryl group and/or substituted or unsubstituted C2 to C30 heteroaryl group may include a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenylyl group, a substituted or unsubstituted p-terphenyl group, a substituted or unsubstituted m-terphenyl group, a substituted or unsubstituted chrysenyl group, a substituted or unsubstituted triperylenyl group, a substituted or unsubstituted perylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted triazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzothiazinyl group, a substituted or unsubstituted acridinyl group, a substituted or unsubstituted phenazinyl group, a substituted or unsubstituted phenothiazinyl group, a substituted or unsubstituted phenoxazinyl group, or a combination thereof, but are not limited thereto.

For example, $Ar^2$ and R' of NR' of Chemical Formula B-1 may be represented by the following Chemical Formula B-2 or B-3.

Chemical Formula B-2

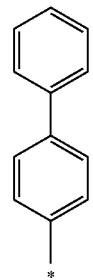

Chemical Formula B-3

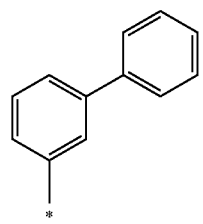

A total conjugation length of the compound may be controlled by selecting $L^1$ and $L^2$ of Chemical Formula A-1 and/or Chemical Formula B-1 appropriately, and thereby the bandgap of triplet energy may be adjusted. Thereby, a material needed for an organic optoelectronic device may be obtained. In addition, ortho, para, or meta binding positions may adjust the triplet energy bandgap.

Examples of the $L^1$ and $L^2$ may include a substituted or unsubstituted phenylene group, a substituted or unsubstituted biphenylene group, a substituted or unsubstituted terphenylene group, a substituted or unsubstituted naphthylene group, a substituted or unsubstituted anthracenylene group, a substituted or unsubstituted phenanthrylene group, a substituted or unsubstituted pyrenylene group, a substituted or unsubstituted fluorenylene group, a substituted or unsubstituted p-terphenyl group, a substituted or unsubstituted m-terphenyl group, a substituted or unsubstituted pyrenylene group, and the like.

In an embodiment, the $L^1$ and/or $L^2$ may be a phenylene group. When the $L^1$ and/or $L^2$ are a phenylene group, both cores may be bonded at an ortho, meta, or para position relative to the phenylene group.

In Chemical Formula B-1, n2 may be 0. In this case, only two carbazoles are linked directly, a molecular weight of the compound would be smaller, and the compound may be synthesized more easily.

In Chemical Formula B-1, $X^2$ may be NR', wherein R' is a substituted or unsubstituted C6 to C30 aryl group. In this case, the compound represented by Chemical Formula B-1 may have improved thermal stability such as a glass transition temperature.

The material for an organic optoelectronic device may further include a dopant represented by the following Chemical Formula C-1.

Chemical Formula C-1

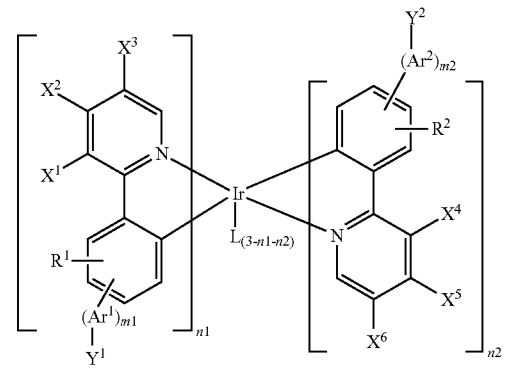

In Chemical Formula C-1,
$X^1$ to $X^6$, $Y^1$, and $Y^2$ are independently hydrogen, deuterium, a halogen, a substituted or unsubstituted C1 to C20 alkyl group, a substituted or unsubstituted C1 to C20 fluoroalkyl group, a substituted or unsubstituted C1 to C20 alkoxy group, a substituted or unsubstituted C1 to C20 amino group, a substituted or unsubstituted C6 to C30 aryl group, a substituted or unsubstituted C1 to C30 heteroaryl group, or a substituent represented by the following Chemical Formula X-1,
$Ar^1$ and $Ar^2$ are substituted or unsubstituted C6 to C30 arylene groups, $R^1$ and $R^2$ are independently hydrogen, deuterium, a C1 to C30 alkyl group substituted or unsubstituted with a halogen, or a C6 to C30 aryl group substituted or unsubstituted with a C1 to C30 alkyl group or halogen, $m^1$ and $m^2$ are integers ranging from 0 to 2, and $m^1+m^2$ is greater than or equal to 1, L is a bidentate ligand of a monovalent anion and is coordination-bonded with iridium through lone pair electrons of carbon or heteroatoms, $n^1$ and $n^2$ are independently integers ranging from 0 to 3, and $n^1+n^2$ is an integer ranging from 1 to 3.

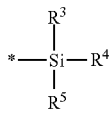

Chemical Formula X-1

In Chemical Formula X-1, the $R^3$, $R^4$, and $R^5$ are independently a substituted or unsubstituted C1 to C20 alkyl group, a substituted or unsubstituted C1 to C20 alkoxy group, a substituted or unsubstituted C1 to C20 fluoroalkyl group, a substituted or unsubstituted C1 to C20 amino group, a substituted or unsubstituted C6 to C30 aryl group, or a substituted or unsubstituted C1 to C30 heteroaryl group.

In Chemical Formula C-1, at least one of $X^1$ to $X^6$ and $Y^1$ and $Y^2$ may be a substituted or unsubstituted C1 to C20 alkyl group. In this case, the compound may have improved thermal stability.

In Chemical Formula C-1, at least one of the $X^1$ to $X^6$, $Y^1$, and $Y^2$ may be a substituent represented by Chemical Formula X-1. In this case, interactions between molecules may be suppressed and light emitting efficiency and life-span of a device may be improved.

In Chemical Formula C-1, substituents represented by $Ar^1$ or $Ar^2$ may be linked at an ortho, meta, or para position relative to the phenyl group.

When the substituents are particularly linked to the phenyl group at a meta position, color purity of green light emitting does not change, and the entire volume of molecules may be increased. Interactions between molecules may be minimized and thus high efficiency and long life-span of a light emitting diode may be improved.

In Chemical Formula C-1, $Ar^1$ may be a phenylene group, and $Y^1$ may be linked at an ortho, meta, or para position relative to $Ar^1$. In Chemical Formula 1, $Ar^2$ may be a phenylene group, and $Y^2$ may be linked at an ortho, meta, or para position relative to $Ar^2$.

In an embodiment, the $Y^1$ may be linked at a para position relative to $Ar^1$, and the $Y^2$ may be linked at a para position relative to $Ar^2$. In this case, interactions between molecules may be minimized due to an increase of entire volume.

In Chemical Formula C-1, $n^1+n^2$ may be 3, which indicates that in Chemical Formula C-1, a ligand represented by L is not included. In this case, synthesis may be easy and the compound may be stable. Therefore, the compound may provide a light emitting diode having improved life-span characteristics.

In Chemical Formula C-1, $n^1+n^2$ may be 1 or 2, which indicates that, in Chemical Formula C-1, at least one ligand represented by L may be present. In this case, color tuning of the compound may be possible.

In Chemical Formula C-1, L may be specifically selected from the following Chemical Formulae L-1 to L-14. The Chemical Formulae L-1 to L-14 may be examples of the ligand represented by L, but Chemical Formulae L-1 to L-14 are not limited thereto.

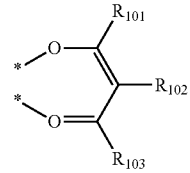

Chemical Formula L-1

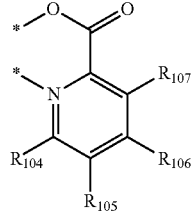

Chemical Formula L-2

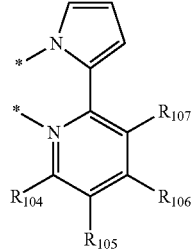

Chemical Formula L-3

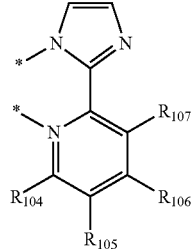

Chemical Formula L-4

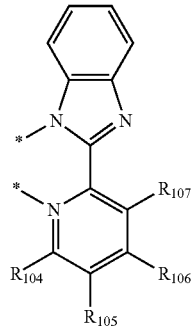

Chemical Formula L-5

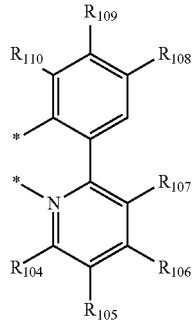

Chemical Formula L-6

Chemical Formula L-7
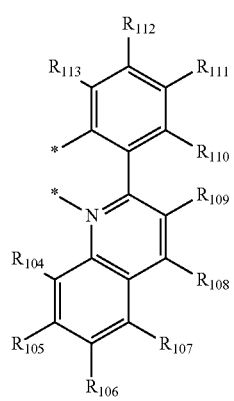
Chemical Formula L-8
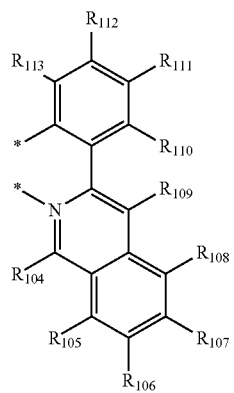
Chemical Formula L-9
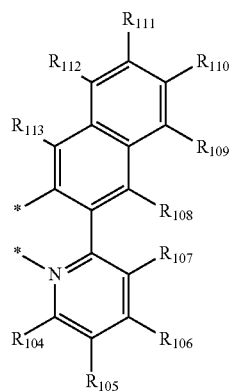
Chemical Formula L-10
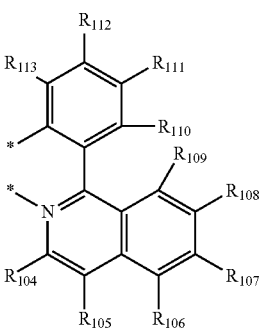
Chemical Formula L-11
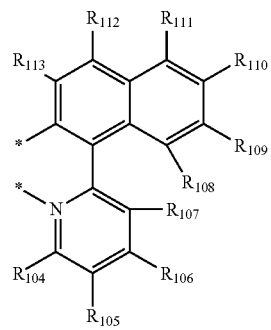
Chemical Formula L-12
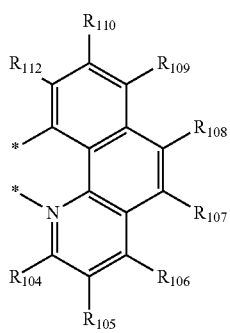
Chemical Formula L-13
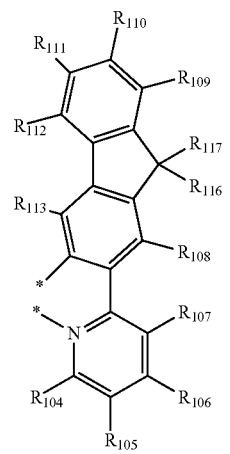

-continued

Chemical Formula L-14

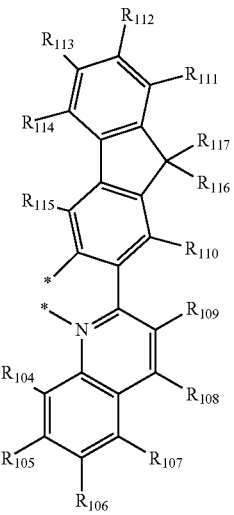

In Chemical Formula L-1 to L-14, asterisk (*) indicates a site bonding with iridium (Ir), and $R_{101}$ to $R_{103}$ are independently hydrogen, deuterium, a C1 to C30 alkyl group substituted or unsubstituted with a halogen, a C6 to C30 aryl group substituted or unsubstituted with a C1 to C30 alkyl group, or a halogen.

$R_{104}$ to $R_{115}$ are independently hydrogen, deuterium, a halogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C2 to C30 alkenyl group, a substituted or unsubstituted C6 to C30 aryl group, a substituted or unsubstituted C1 to C30 heteroaryl group, a substituted or unsubstituted C1 to C30 amino group, a substituted or unsubstituted C6 to C30 arylamino group, $SF_5$, a trialkylsilyl group having a substituted or unsubstituted C1 to C30 alkyl group, a dialkylarylsilyl group having a substituted or unsubstituted C1 to C30 alkyl group and C6 to C30 aryl group, or a triarylsilyl group having a substituted or unsubstituted C6 to C30 aryl group.

$R_{116}$ to $R_{117}$ are independently hydrogen, deuterium, a C1 to C30 alkyl group substituted or unsubstituted with a halogen, or a C6 to C30 aryl group substituted or unsubstituted with a C1 to C30 alkyl group.

For example, the substituted or unsubstituted C2 to C30 heteroaryl group having electronic properties may be a substituted or unsubstituted imidazolyl group, a substituted or unsubstituted triazolyl group, a substituted or unsubstituted tetrazolyl group, a substituted or unsubstituted oxadiazolyl group, a substituted or unsubstituted oxatriazolyl group, a substituted or unsubstituted thiatriazolyl group, a substituted or unsubstituted benzimidazolyl group, a substituted or unsubstituted benzotriazolyl group, a substituted or unsubstituted pyridinyl group, a substituted or unsubstituted pyrimidinyl group, a substituted or unsubstituted triazinyl group, a substituted or unsubstituted pyrazinyl group, a substituted or unsubstituted pyridazinyl group, a substituted or unsubstituted purinyl group, a substituted or unsubstituted quinolinyl group, a substituted or unsubstituted isoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted acridinyl group, a substituted or unsubstituted phenanthrolinyl group, or a substituted or unsubstituted phenazinyl group.

In an embodiment, the substituted or unsubstituted C2 to C30 heteroaryl group having electronic properties may be represented by one of the following Chemical Formulae E-1 to E-5.

Chemical Formula E-1

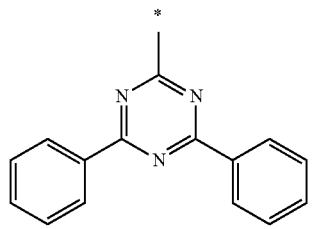

Chemical Formula E-2

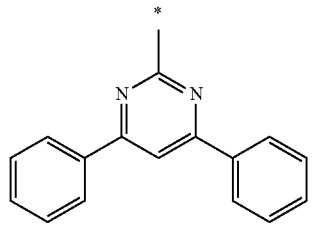

Chemical Formula E-3

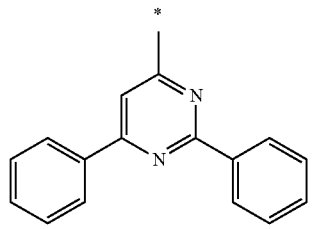

Chemical Formula E-4

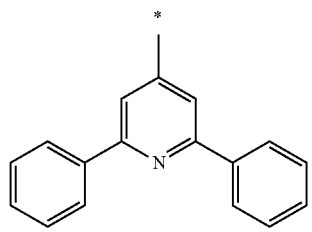

Chemical Formula E-5

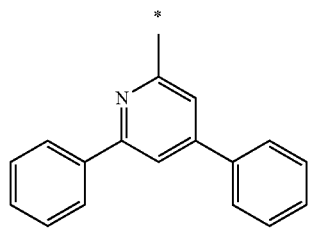

For example, the Chemical Formula A-1 may be one of the following Chemical Formulae H-1 to H-35, but is not limited thereto.

Chemical Formula H-1
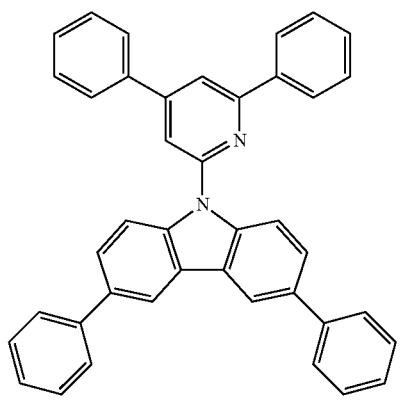
Chemical Formula H-2
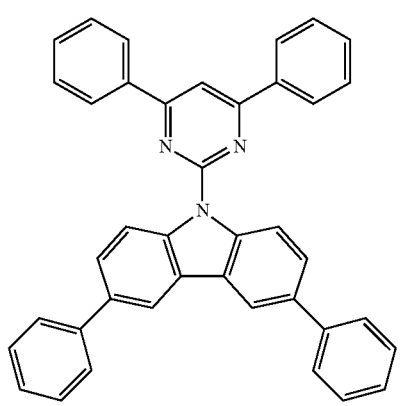
Chemical Formula H-3
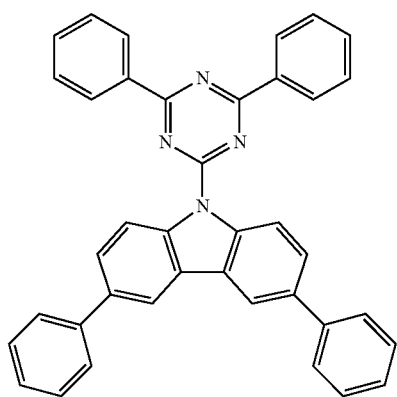
Chemical Formula H-4
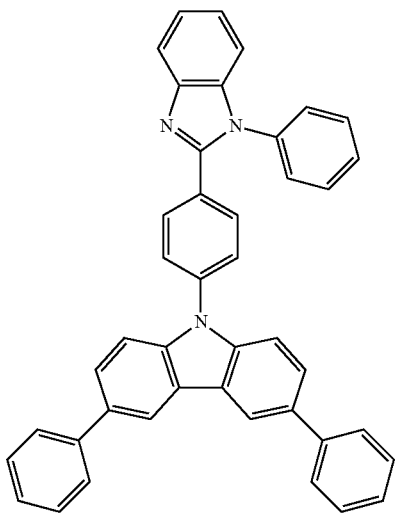
Chemical Formula H-5
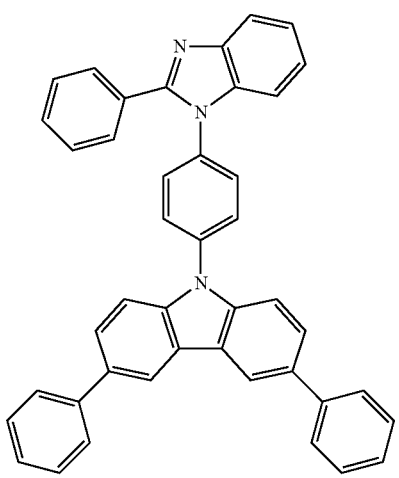
Chemical Formula H-6
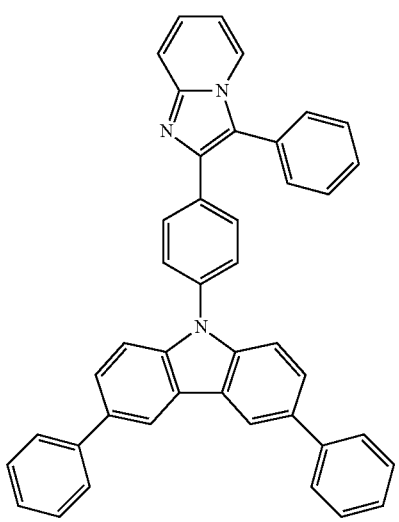

Chemical Formula H-7
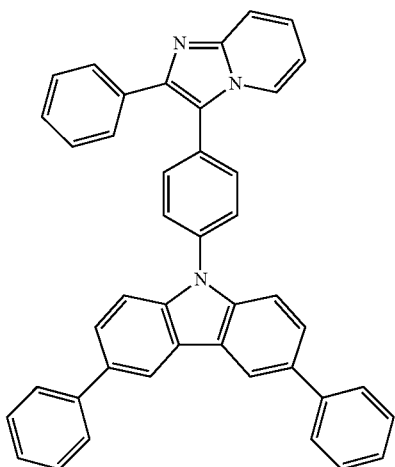
Chemical Formula H-8
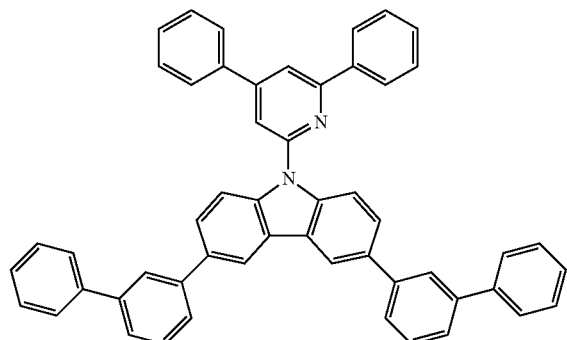
Chemical Formula H-9
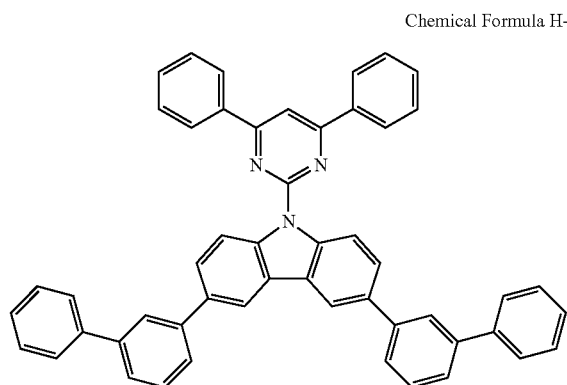
Chemical Formula H-10
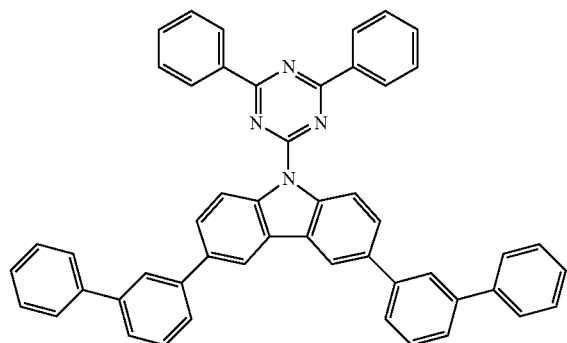
Chemical Formula H-11
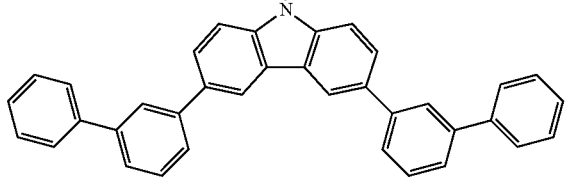
Chemical Formula H-12
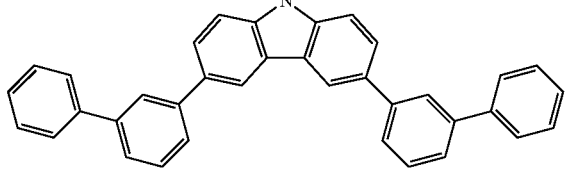
Chemical Formula H-13
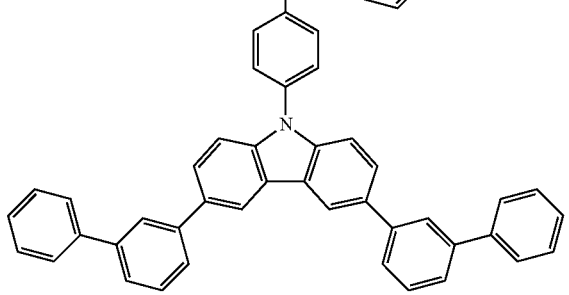

Chemical Formula H-14
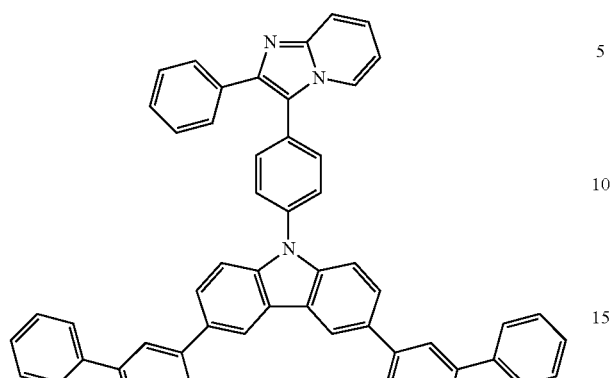
Chemical Formula H-15
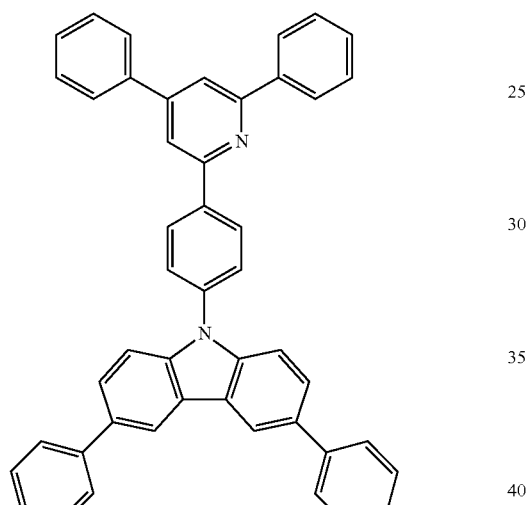
Chemical Formula H-16
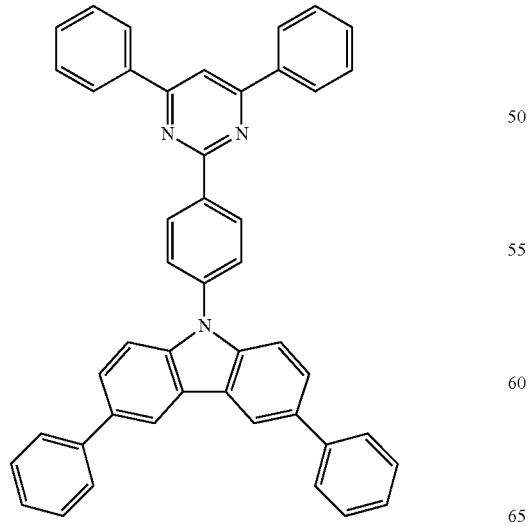
Chemical Formula H-17
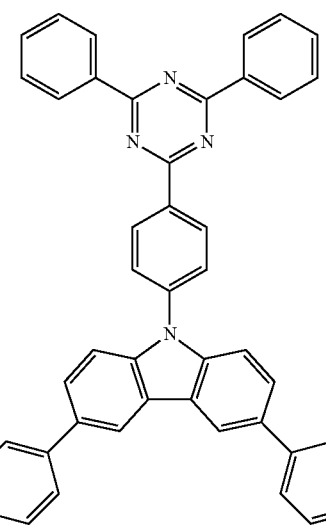
Chemical Formula H-18
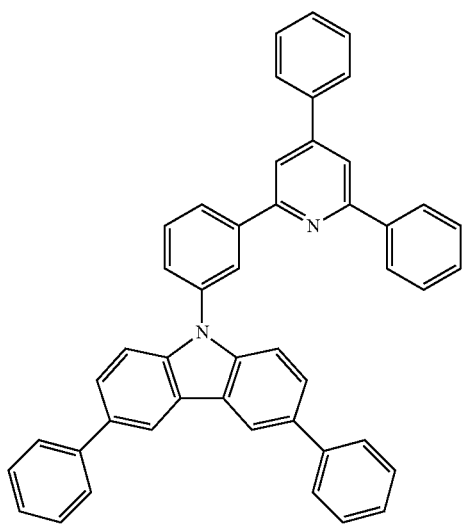
Chemical Formula H-19
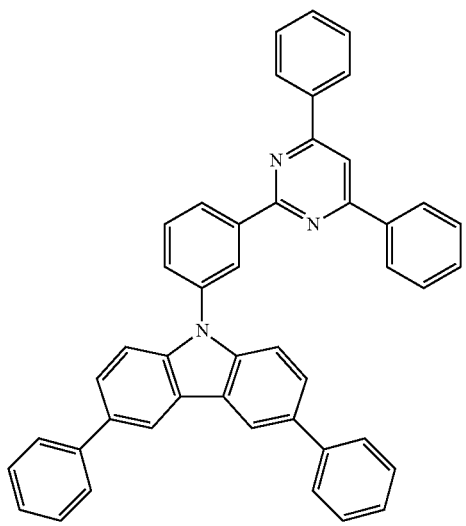

Chemical Formula H-20
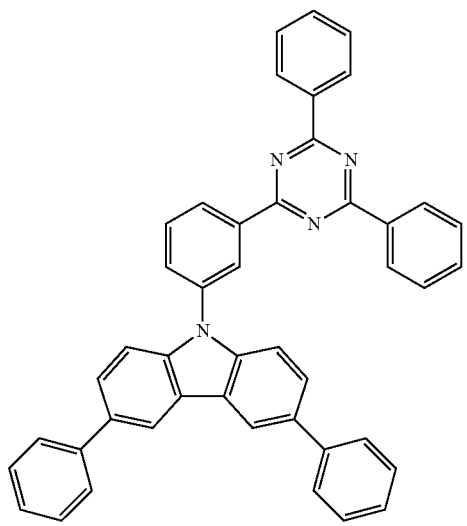
Chemical Formula H-21
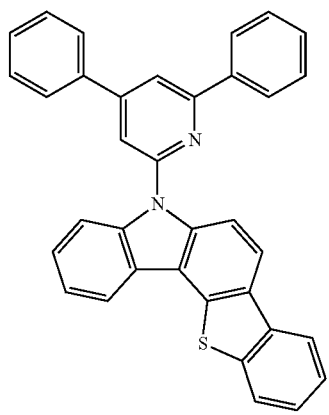
Chemical Formula H-22
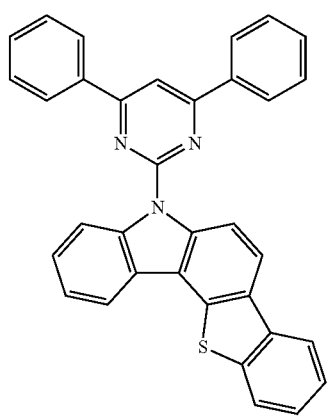
Chemical Formula H-23
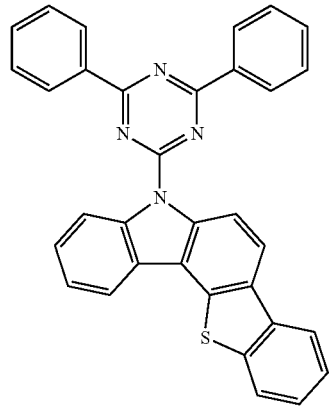
Chemical Formula H-24
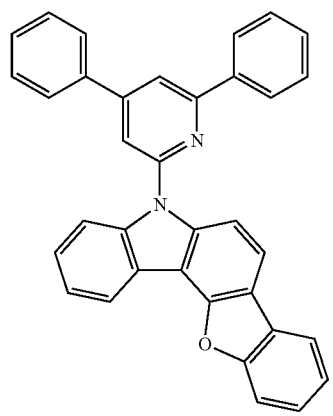
Chemical Formula H-25
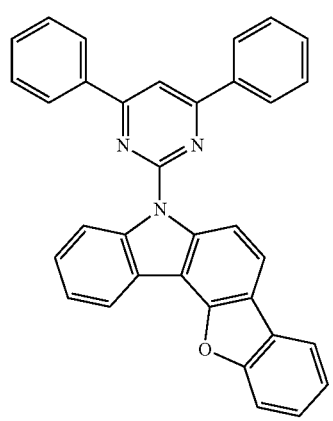

Chemical Formula H-26
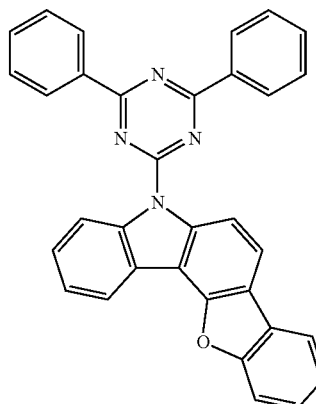
Chemical Formula H-27
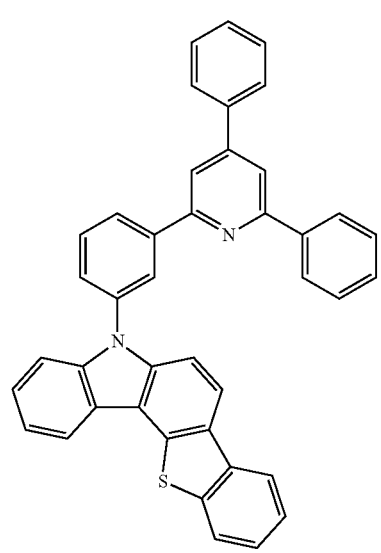
Chemical Formula H-28
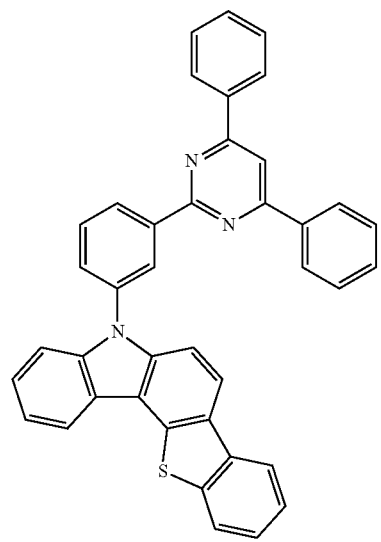
Chemical Formula H-29
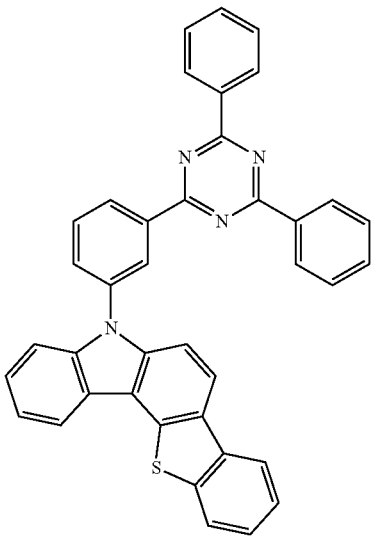
Chemical Formula H-30
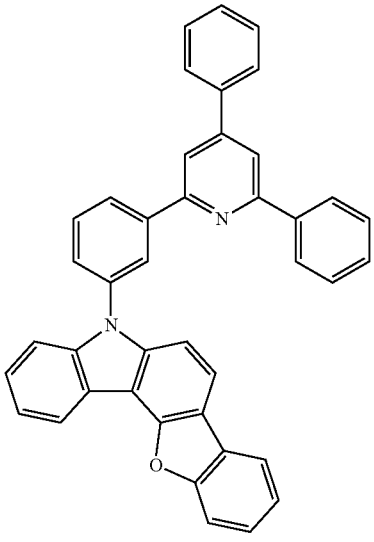

Chemical Formula H-31
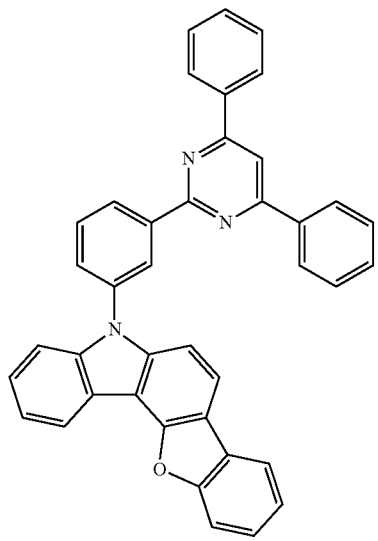
Chemical Formula H-32
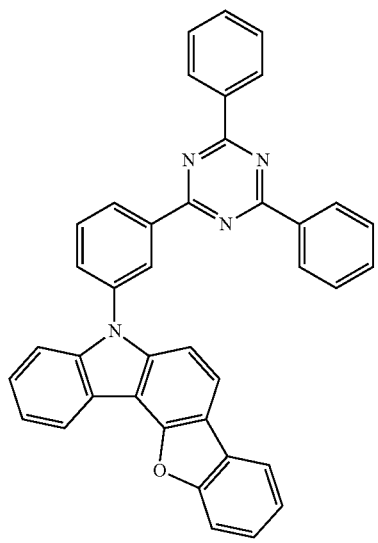
Chemical Formula H-33
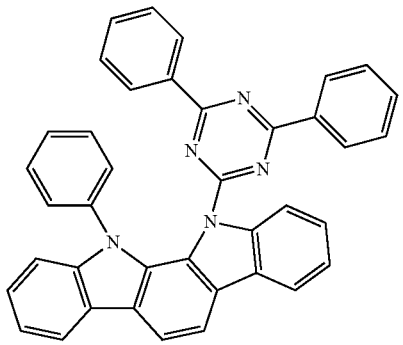
Chemical Formula H-34
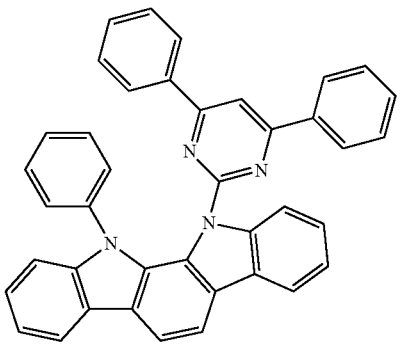
Chemical Formula H-35
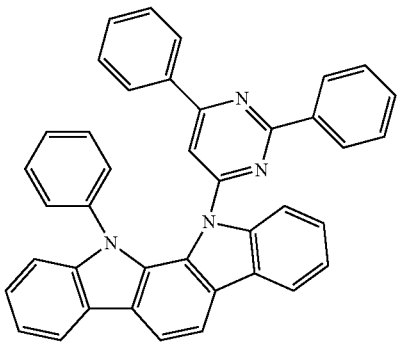
For example, the Chemical Formula B-1 may be one of the following Chemical Formulae I-1 to I-31, but is not limited thereto.
Chemical Formula I-1
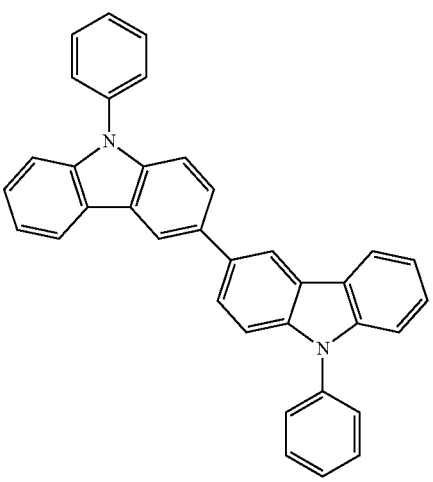

Chemical Formula I-2
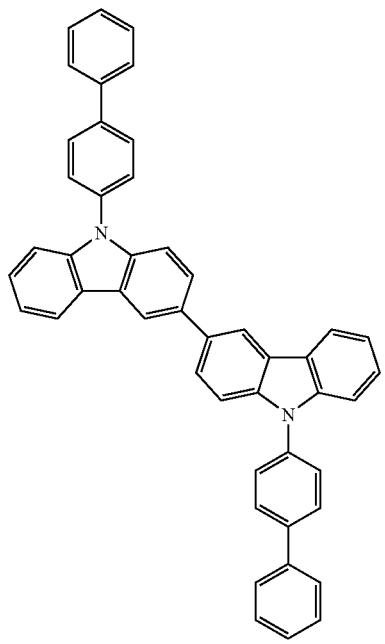
Chemical Formula I-3
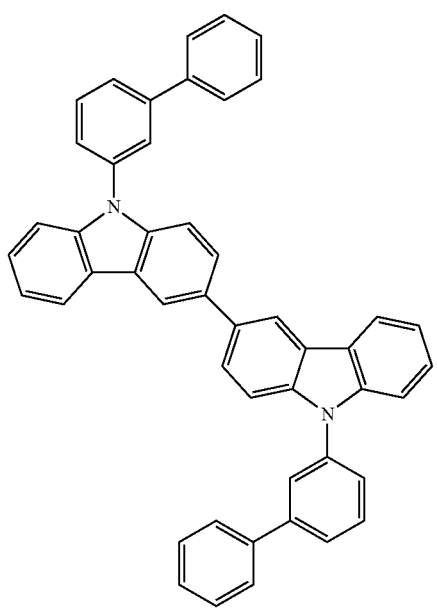
Chemical Formula I-4
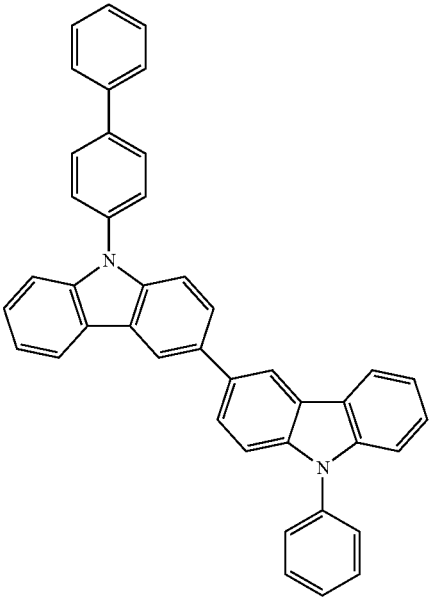
Chemical Formula I-5
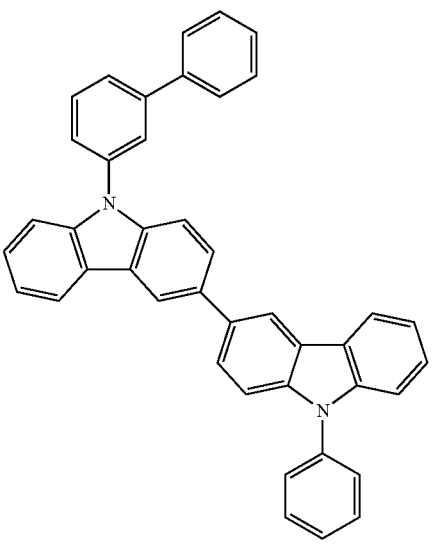
Chemical Formula I-6
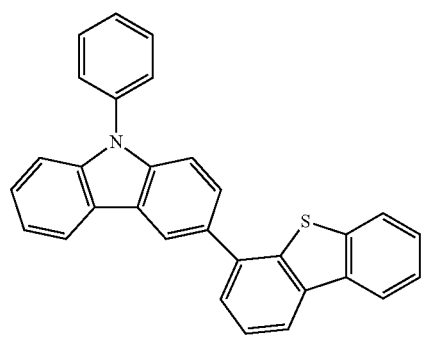

Chemical Formula I-7
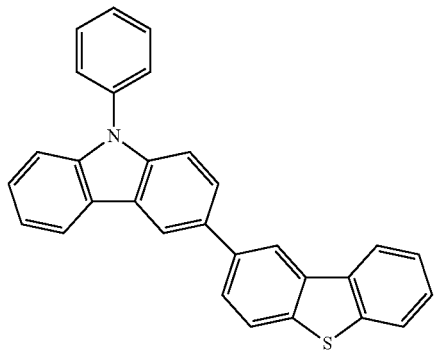
Chemical Formula I-8
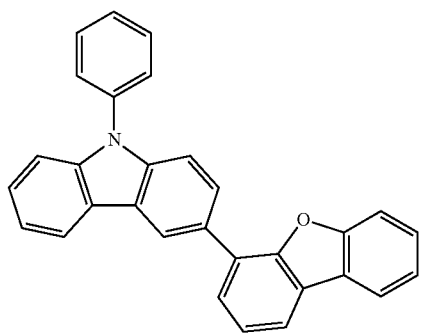
Chemical Formula I-9
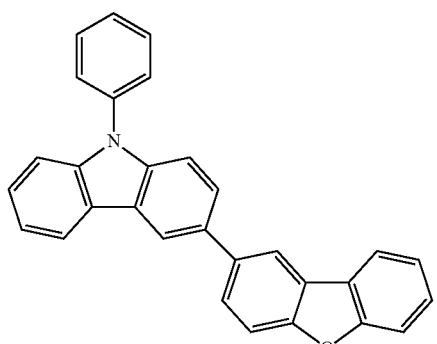
Chemical Formula I-10
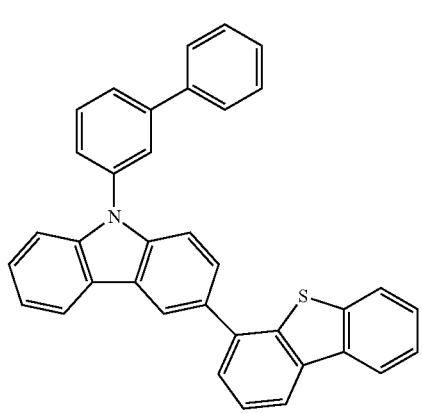
Chemical Formula I-11
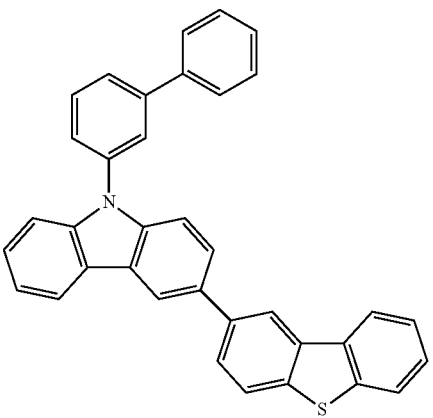
Chemical Formula I-12
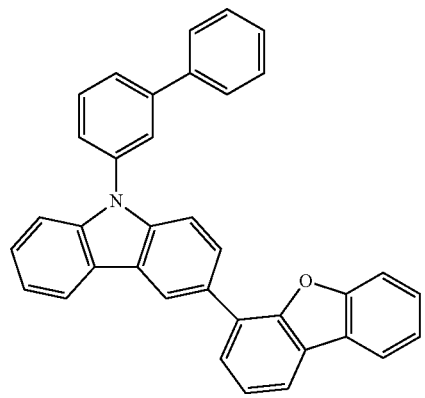
Chemical Formula I-13
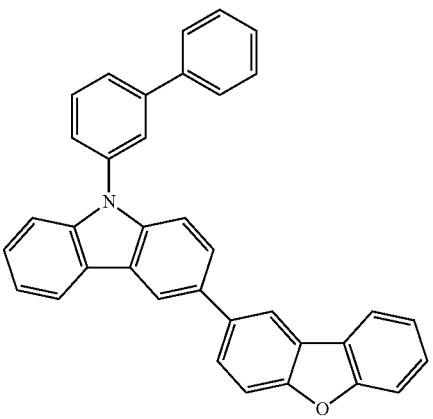

Chemical Formula I-14
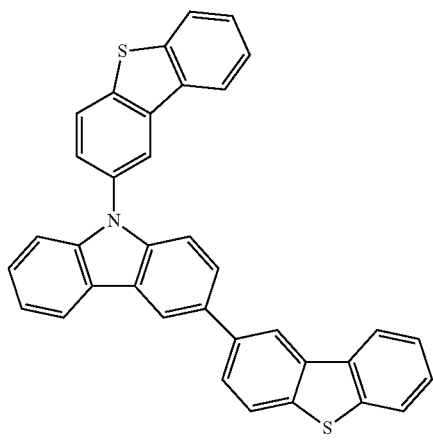
Chemical Formula I-15
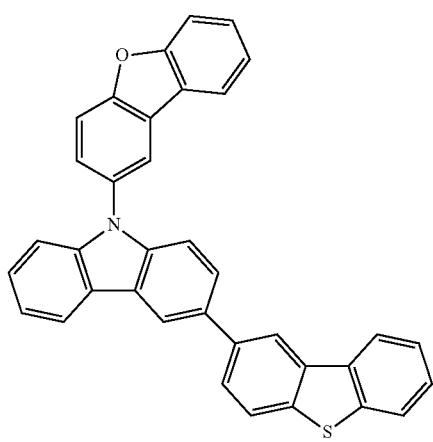
Chemical Formula I-16
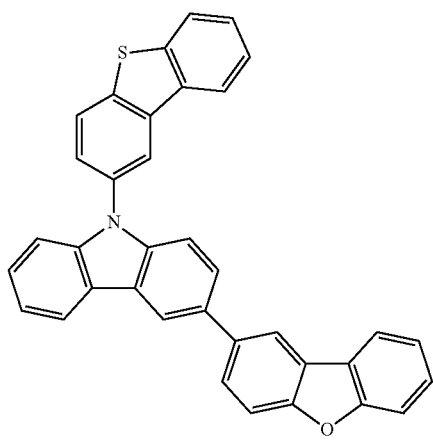
Chemical Formula I-17
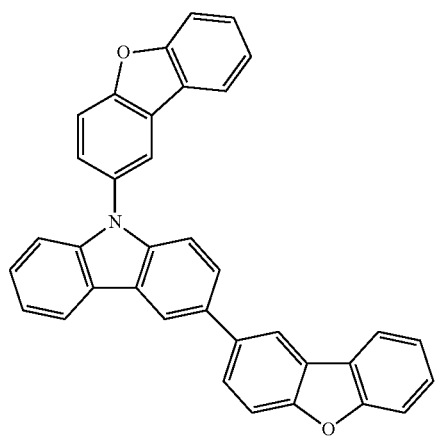
Chemical Formula I-18
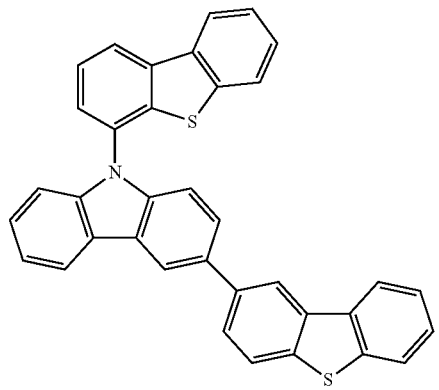
Chemical Formula I-19
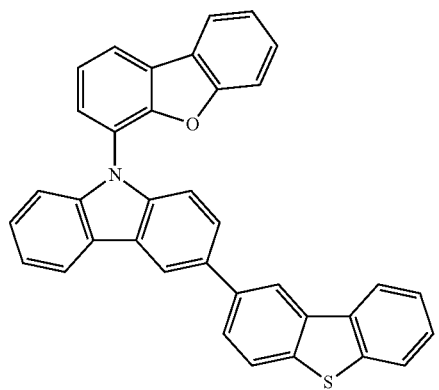

Chemical Formula I-20
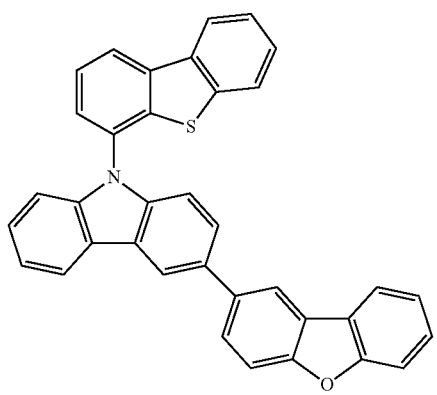
Chemical Formula I-21
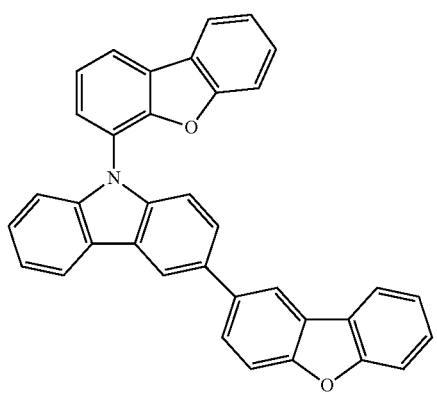
Chemical Formula I-22
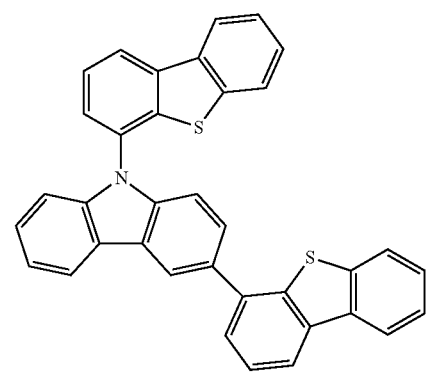
Chemical Formula I-23
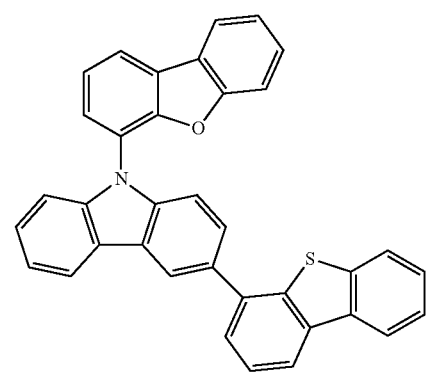
Chemical Formula I-24
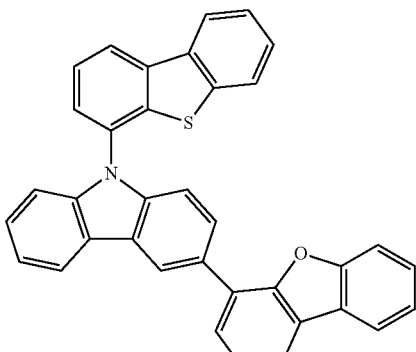
Chemical Formula I-25
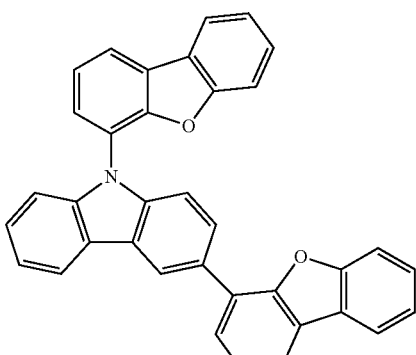
Chemical Formula I-26
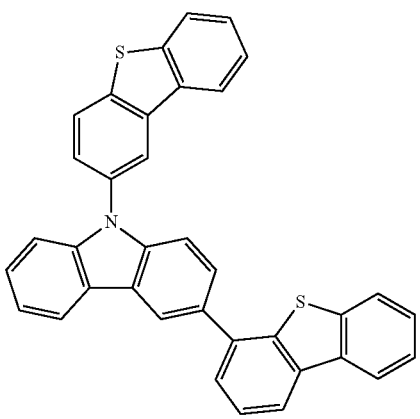
Chemical Formula I-27
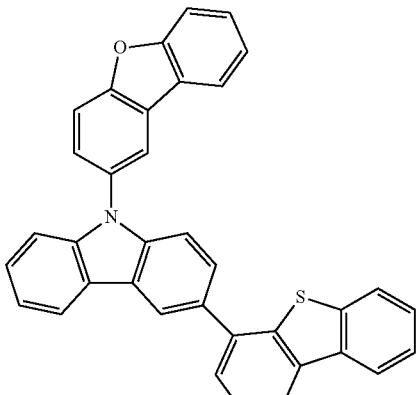

Chemical Formula I-28
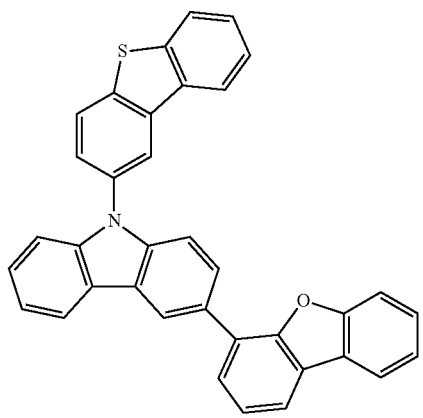
Chemical Formula I-29
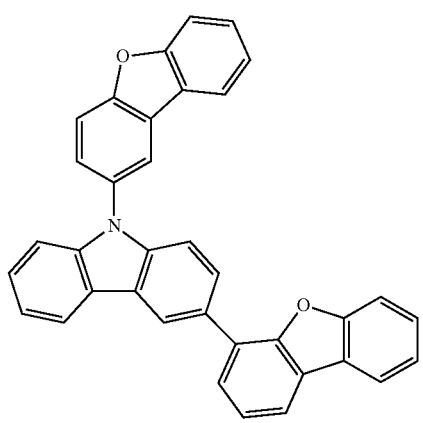
Chemical Formula I-30
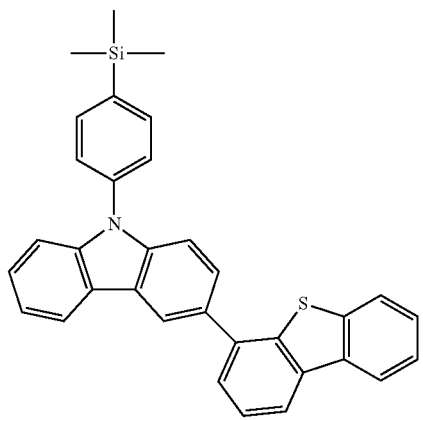
Chemical Formula I-31
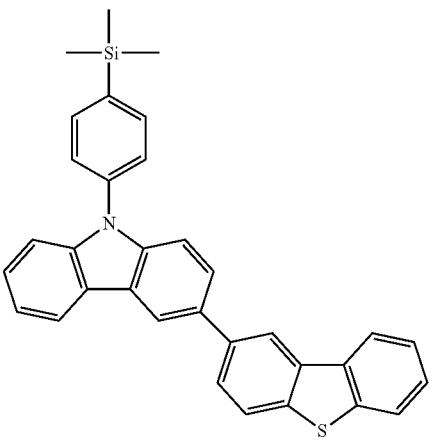
For example, the Chemical Formula C-1 may be one of the following Chemical Formulae J-1 to J-20, but is not limited thereto.
Chemical Formula J-1
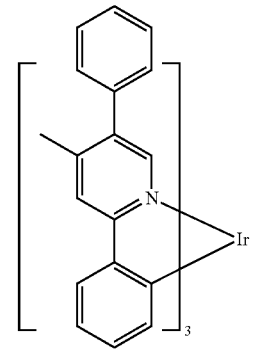
Chemical Formula J-2
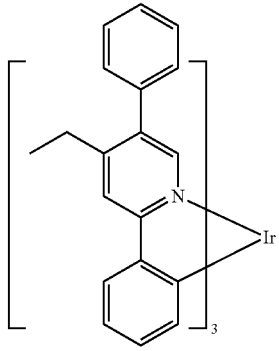

Chemical Formula J-3
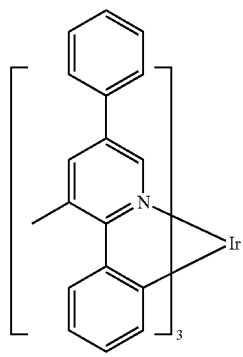
Chemical Formula J-4
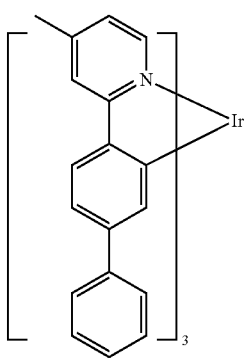
Chemical Formula J-5
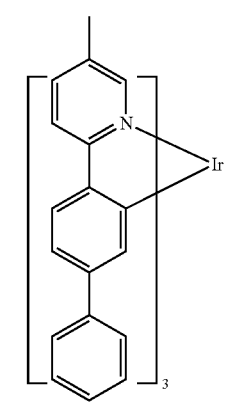
Chemical Formula J-6
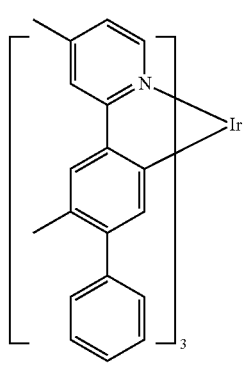
Chemical Formula J-7
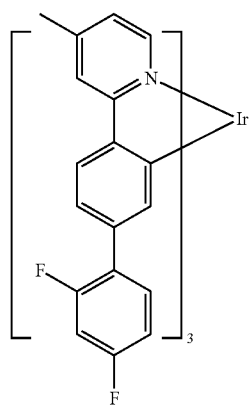
Chemical Formula J-8
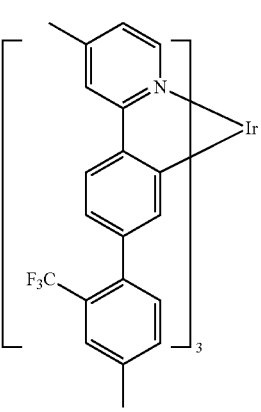
Chemical Formula J-9
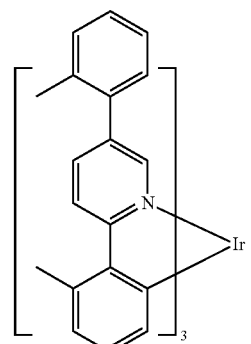
Chemical Formula J-10
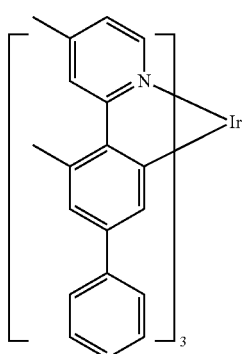

Chemical Formula J-11
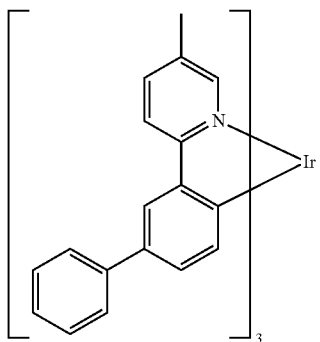
Chemical Formula J-12
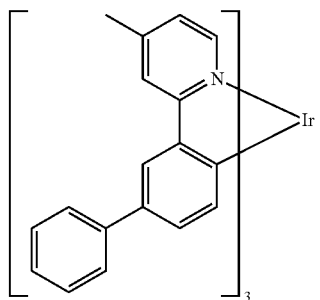
Chemical Formula J-13
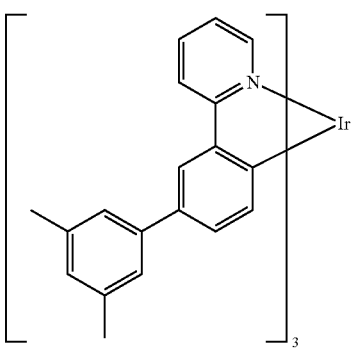
Chemical Formula J-14
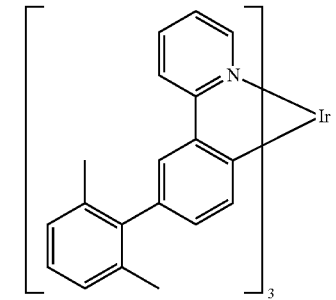
Chemical Formula J-15
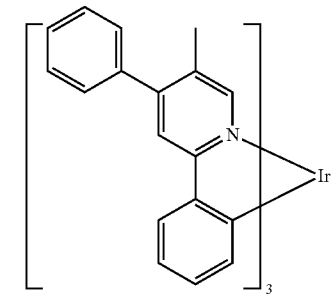
Chemical Formula J-16
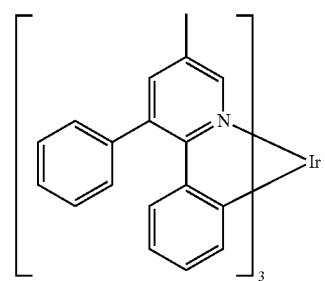
Chemical Formula J-17
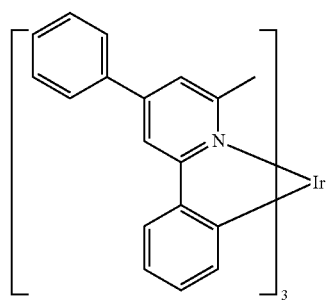
Chemical Formula J-18
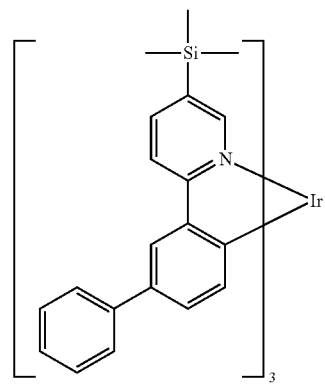
Chemical Formula J-19
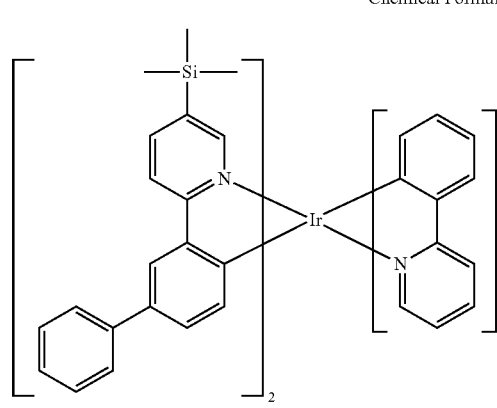

Chemical Formula J-20

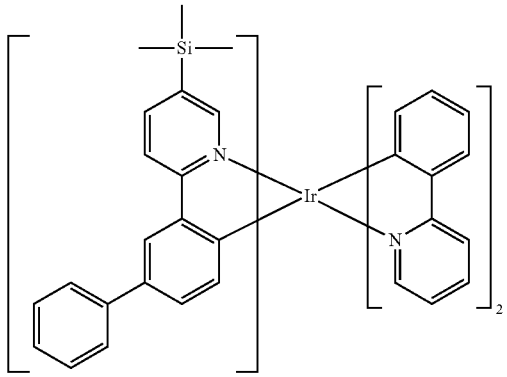

In another embodiment, an organic light emitting diode includes an anode, a cathode, and at least one organic layer, referred to herein after as an "organic thin layer" between the anode and the cathode, and at least one organic thin layer may include the material for an organic optoelectronic device according to an embodiment. For example, the organic thin layer may have a thickness of about 5 nanometer to about 1 millimeter, or about 10 nanometers to about 100 micrometers, or about 10 nanometers to about 10 micrometers, or about 100 nanometer to about 1 micrometer.

The material for an organic optoelectronic device is used for an organic thin layer, and it may improve the life-span characteristic, efficiency characteristic, electrochemical stability, and thermal stability of an organic photoelectric device, and decrease the driving voltage.

The organic thin layer may be an emission layer.

The organic optoelectronic device may include an organic light emitting diode, an organic photoelectric device, an organic solar cell, an organic transistor, an organic photoconductor drum, or an organic memory device.

In an embodiment, the organic optoelectronic device may be an organic light emitting diode. FIGS. 1 to 5 are cross-sectional views showing organic light emitting diodes including the material for an organic optoelectronic device according to an embodiment.

Referring to FIGS. 1 to 5, organic light emitting diodes 100, 200, 300, 400, and 500 according to an embodiment include at least one organic thin layer 105 interposed between an anode 120 and a cathode 110.

The anode 120 includes an anode material having a large work function to help hole injection into an organic thin layer. The anode material includes: a metal such as nickel (Ni), platinum (Pt), vanadium (V), chromium (Cr), copper (Cu), zinc (Zn), and gold (Au), or alloys thereof; a metal oxide such as zinc oxide, indium oxide, indium tin oxide ("ITO"), and indium zinc oxide ("IZO"); a combination of a metal and an oxide such as ZnO:Al and SnO$_2$:Sb; or a conductive polymer such as poly(3-methylthiophene), poly (3,4-(ethylene-1,2-dioxy)thiophene) ("PEDT"), polypyrrole, and polyaniline, but is not limited thereto. In an embodiment, the transparent electrode may include indium tin oxide (ITO) as an anode.

The cathode 110 includes a cathode material having a small work function to help electron injection into an organic thin layer. The cathode material includes: a metal such as magnesium, calcium, sodium, potassium, titanium, indium, yttrium, lithium, gadolinium, aluminum, silver, tin, and lead, or alloys thereof; or a multi-layered material such as LiF/Al, Liq/Al, LiO$_2$/Al, LiF/Ca, LiF/Al, and BaF$_2$/Ca, but is not limited thereto. In an embodiment, a metal electrode may include aluminum as a cathode.

Referring to FIG. 1, the organic photoelectric device 100 includes an organic thin layer 105 including only an emission layer 130.

Figure 2:
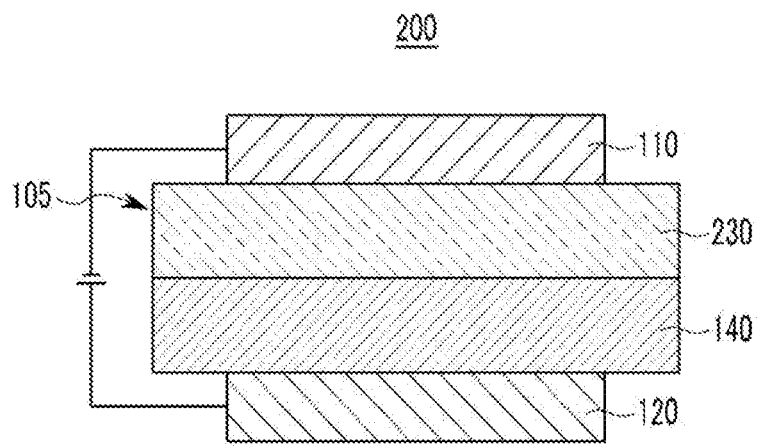

Referring to FIG. 2, a double-layered organic photoelectric device 200 includes an organic thin layer 105 including an emission layer 230 including an electron transport layer ("ETL"), and a hole transport layer ("HTL") 140. As shown in FIG. 2, the organic thin layer 105 includes a double layer of the emission layer 230 and the hole transport layer (HTL) 140. The emission layer 130 also functions as an electron transport layer (ETL), and the hole transport layer (HTL) 140 layer has an excellent binding property with a transparent electrode such as ITO or an excellent hole transport capability.

Figure 3:
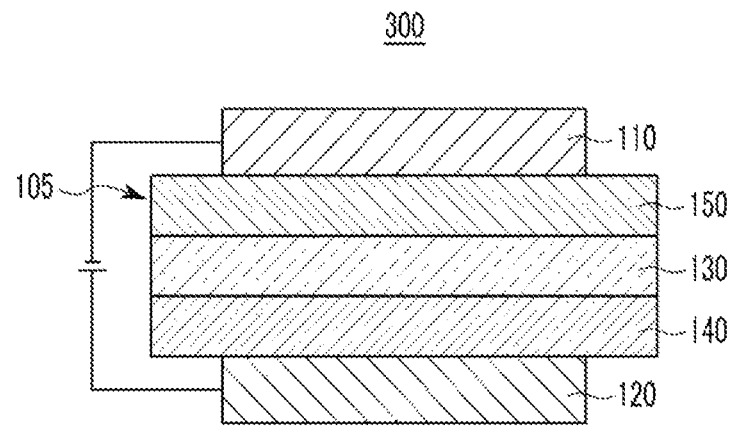

Referring to FIG. 3, a three-layered organic photoelectric device 300 includes an organic thin layer 105 including an electron transport layer (ETL) 150, an emission layer 130, and a hole transport layer (HTL) 140. The emission layer 130 is independently installed, and layers having an excellent electron transport capability or an excellent hole transport capability are separately stacked.

Figure 4:
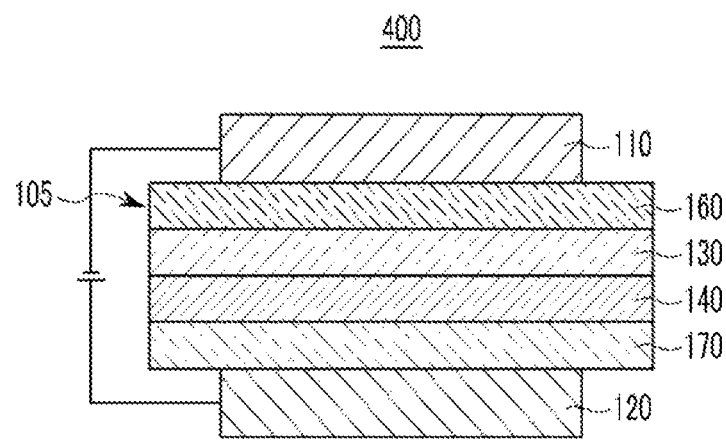

As shown in FIG. 4, a four-layered organic photoelectric device 400 includes an organic thin layer 105 including an electron injection layer ("EIL) 160, an emission layer 130, a hole transport layer (HTL) 140, and a hole injection layer (HIL) 170 for adherence with the cathode of ITO.

Figure 5:
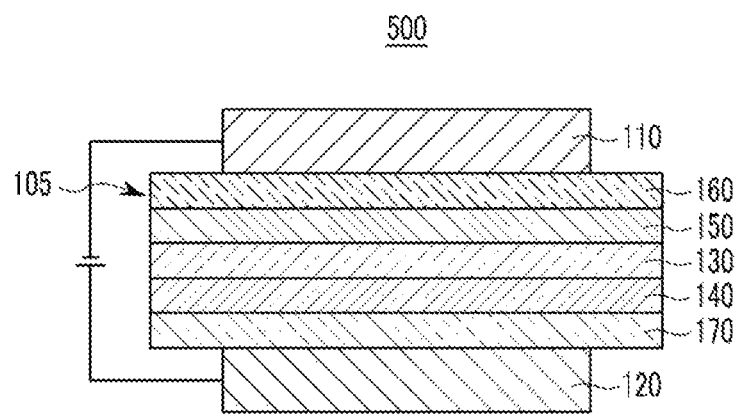

As shown in FIG. 5, a five-layered organic photoelectric device 500 includes an organic thin layer 105 including an electron transport layer (ETL) 150, an emission layer 130, a hole transport layer (HTL) 140, and a hole injection layer (HIL) 170, and further includes an electron injection layer (EIL) 160 to achieve a low voltage.

In FIGS. 1 to 5, the organic thin layer 105 including at least one selected from the group consisting of an electron transport layer (ETL) 150, an electron injection layer (EIL) 160, emission layers 130 and 230, a hole transport layer (HTL) 140, a hole injection layer (HIL) 170, and combinations thereof includes a compound for an organic optoelectronic device.

Particularly, the material for an organic optoelectronic device may be used in the emission layers 130 and 230, and may be used as a green phosphorescent host and a dopant material in the emission layer.

The organic light emitting diode may be manufactured by: forming an anode on a substrate; forming an organic thin layer in accordance with a dry coating method such as evaporation, sputtering, plasma plating, and ion plating, or a wet coating method such as spin coating, dipping, and flow coating; and providing a cathode thereon.

Another embodiment provides a display device including the organic photoelectric device according to the above embodiment.

EXAMPLES

Hereinafter, the embodiments are illustrated in more detail with reference to examples. These examples, however, should not in any sense be interpreted as limiting the scope of the claims.

Preparation of Compound for Organic Optoelectronic Device

Example 1: Synthesis of Compound Represented by Chemical Formula H-10

A compound represented by Chemical Formula H-10 is obtained according to the following method.

85

Reaction Scheme 1

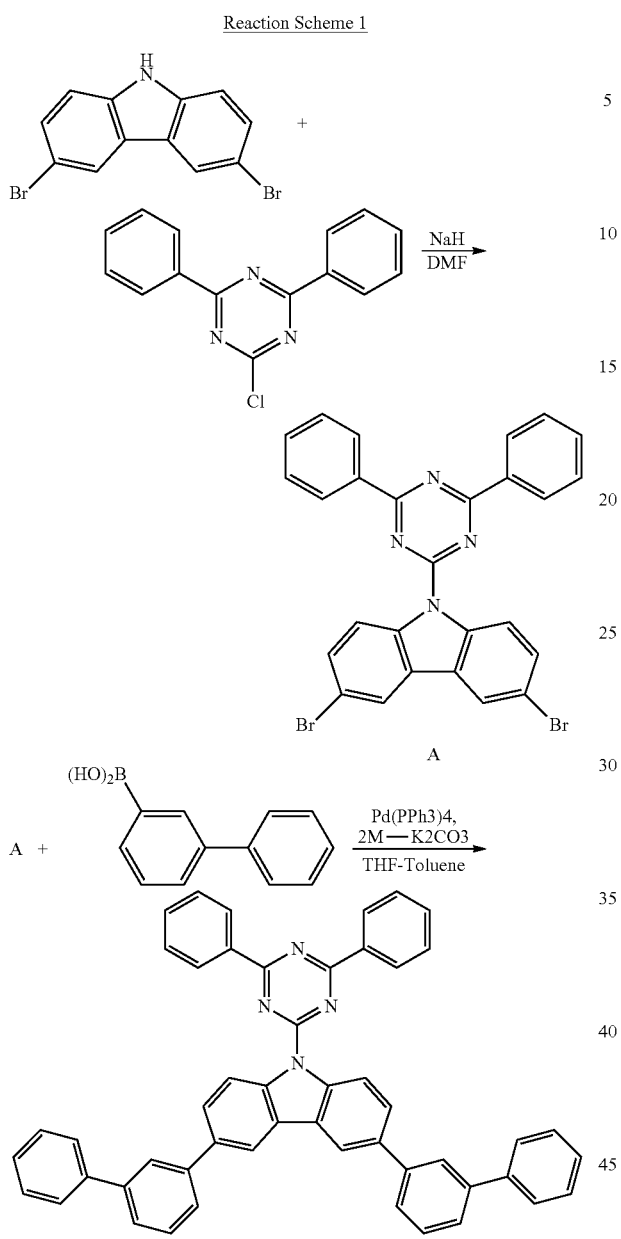

Preparation of Compound A 62.490 g (0.19 mmol) of 3,6-dibromocarbazole and 11.537 g (0.48 mmol) of sodium hydride dispersed in mineral oil are dissolved in 450 mL of DMF in a 2 L round-bottomed flask in an ice-bath, and the solution is agitated for 40 minutes. Then, another solution prepared by dissolving 61.769 g (0.23 mmol) of 2-chloro-4,6-diphenyl triazine in 450 mL of DMF is slowly added to the agitated solution in a dropwise fashion. The mixture is agitated for 12 hours. The reactant is poured into 2 L of water to complete the reaction, the resulting product is agitated for 30 minutes, and a solid produced therein is filtered. The solid is washed with methanol and then dried. The dried solid is dissolved in 2.4 L of chlorobenzene while being heated, and the solution is agitated at room temperature. Then, a solid produced therein is filtered, respectively washed with methanol and acetone, and then vacuum-dried, obtaining 99.72 g (a yield of 93%) of a compound A.

86

Preparation of Compound H-10

20 g (40 mmol) of the compound A, 15.664 g (80 mmol) of 3-biphenyl boronic acid, 150 mL of a mixture of tetrahydrofuran:toluene in a ratio of 1:1, and 150 mL of a 2 M potassium carbonate aqueous solution are mixed in a 500 mL round-bottomed flask having an agitator under a nitrogen atmosphere, and 2.077 g (1.8 mmol) of tetrakistriphenylphosphine palladium (0) is added thereto. The mixture is heated and refluxed for 12 hours under a nitrogen atmosphere. When the reaction is complete, the reactant is poured into methanol, and a solid produced therein is filtered. The solid is sufficiently washed with water and methanol and then dried. The dried solid is dissolved in 1 L of chlorobenzene while being heated. The solution is filtered through silica gel, and methanol is added thereto, obtaining 18.5 g (a yield of 73%) of a compound H-10.

Calcd. $C_{51}H_{34}N_4$: C, 87.15; H, 4.88; N, 7.97. found: C, 87.35; H, 4.55; N, 7.80.

Example 2: Synthesis of Compound Represented by Chemical Formula I-1

A compound represented by Chemical Formula I-1 is synthesized according to the following method.

Reaction Scheme 2

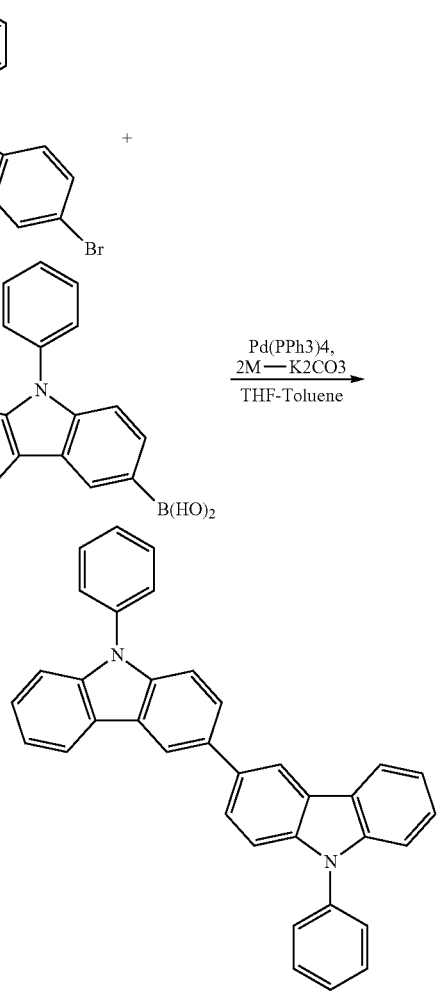

16.622 g (51.59 mmol) of 3-bromo-N-phenylcarbazole, 17.775 g (61.91 mmol) of N-phenylcarbazol-3-yl boronic acid, 200 mL of a mixture of tetrahydrofuran:toluene in a ratio of 1:1, and 100 mL of a 2 M potassium carbonate aqueous solution are mixed in a 500 mL round-bottomed flask having an agitator under a nitrogen atmosphere, and 2.981 g (2.58 mmol) of tetrakistriphenylphosphinepalladium (0) is added thereto. The mixture is heated and refluxed for 12 hours under a nitrogen atmosphere.

When the reaction is complete, the reactant is poured into methanol, and a solid produced therein is filtered. The solid is sufficiently washed with water and methanol, and then dried. The obtained solid is dissolved in 1 L of chlorobenzene while being heated. The solution is filtered through silica gel, and a solvent remaining therein is completely removed. Then, the obtained solid is dissolved in 500 mL of toluene while being heated. The solution is recrystallized, obtaining 16 g of a compound I-1 (a yield of 64%).

Calcd. $C_3H_{24}N_2$: C, 89.23; H, 4.99; N, 5.78. found: C, 89.45; H, 4.89; N, 5.65.

Example 3: Synthesis of Compound Represented by Chemical Formula J-1

A compound represented by Chemical Formula J-1 is obtained according to the following method.

Preparation of Compound J-1-1

204.56 g (815.26 mmol) of 2,5-dibromo-4-methylpyridine, 228.63 g (1875.1 mmol) of boronic acid, 1358 mL of 1,4-dioxane, and 815 mL of a 2 M potassium carbonate aqueous solution are mixed in a 4 L round-bottomed flask having an agitator under a nitrogen atmosphere, and 0 47.1 g (40.76 mmol) of tetrakistriphenylphosphine palladium (0) is added thereto. The mixture is heated and refluxed for 12 hours under a nitrogen atmosphere. When the reaction is complete, an organic layer produced therein is separated, and a solvent therein is completely removed. Then, 120.1 g of a compound J-1-1 (a yield of 60%) was obtained through column chromatography.

Synthesis of Compound J-1-2

120.1 g (489.63 mmol) of the compound J-1-1, 58.48 g (195.85 mmol) of iridium chloride, 816 mL of 2-ethoxyethanol, and 272 mL of distilled water are put in a 2 L round-bottomed flask and then heated and refluxed for 24 hours. When the reaction is complete, the reactant is cooled down to room temperature, and a solid produced during the reaction is filtered and washed with water and methanol. The solid is dried in a vacuum oven, obtaining 98.2 g of a compound J-1-2 (a yield of 69%).

Synthesis of Compound J-1-3

98.2 g (68.55 mmol) of the compound J-1-2, 15.1 g (150.8 mmol) of 2,4-pentane dione, and 94.74 g (685.5 mmol) of sodium carbonate are dissolved in 740 mL of 2-ethoxyethanol in a 2 L round-bottomed flask, and the solution is heated and refluxed for 5 hours. When the reaction is complete, the reactant is cooled down to room temperature, and a solid produced therein is filtered. Then, 16.2 g of a compound J-1-3 (a yield of 55%) is obtained through column chromatography.

Synthesis of Compound J-1

16.2 g (37.67 mmol) of the compound J-1-3 and 27.73 g (113.02 mmol) of the compound J-1-1 are dissolved in 300 mL of glycerol in a 500 mL round-bottomed flask, and the solution is heated and refluxed at 220° C. for 12 hours. Then, water is poured into the reactant to complete the reaction, and a solid produced during the reaction is filtered. The solid is washed with water and methanol, dissolved in dichloromethane, separated through column chromatography, and then recrystallized, obtaining 5.2 g of a compound J-1 (a yield of 32%).

Calcd. $C_{54}H_{42}IrN_3$; C, 70.11; H, 4.58; Ir, 20.78; N, 4.54. found: C, 70.23; H, 4.6; N, 4.56.

Manufacture of Organic Light Emitting Diode

Example 4

The compound synthesized according to Example 1 as a first host, the compound synthesized according to Example 2 as a second host, and the compound synthesized according to Example 3 as a dopant are used to fabricate an organic light emitting diode.

Specifically, ITO (indium tin oxide) is coated to form a 1,500 (Angstrom-thick) Å-thick thin film on a glass substrate, and the coated glass substrate is washed with distilled water under ultrasonic waves. Then, the glass substrate coated with the ITO is ultrasonic wave-treated with a solvent such as isopropyl alcohol, acetone, methanol, and the like, dried, and moved into a plasma cleaner. Then, the substrate is cleaned for 5 minutes using oxygen plasma and moved into a vacuum depositor.

The obtained ITO transparent electrode is used as a anode, and HTM ((N-(biphenyl-4-yl)-9,9-diphenyl-N-(4-(9-phenyl-9H-carbazole)-3-yl)phenyl)9H-fluorene-2-amine) represented by the following Chemical Formula Z-1 is vacuum deposited on the ITO substrate to form a 1,200 Å-thick hole injection layer ("HIL").

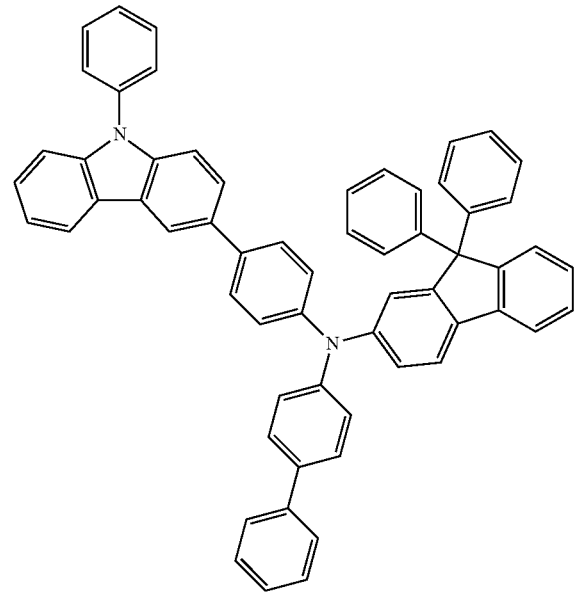

Chemical Formula Z-1

On the hole transport layer ("HTL"), a 300 Å-thick emission layer is formed by mixing the compounds synthesized according to Examples 1 and 2 as first and second hosts in a weight ratio of 7:3, doping the mixture with 10 weight % of the compound synthesized according to Example 3 as a green phosphorescent dopant based on the total weight of the mixture, and then vacuum-depositing the resultant materials. On the emission layer, an electron transport layer (ETL) is formed by sequentially depositing BAlq (bis(2-methyl-8-quinolinolato-N1,O8)-(1,1'-biphenyl-4-olato)aluminum) represented by the following Chemical Formula Z-3 to be 50 Å thick and Alq3 (tris(8-hydroxyquinolinato)aluminum) represented by the following Chemical Formula Z-4 to be 250 Å thick. On the electron transport layer (ETL), a cathode is formed by sequentially vacuum-depositing LiF to be 5 Å thick and Al to be 1,000 Å thick, completing an organic light emitting diode.

Chemical Formula Z-3

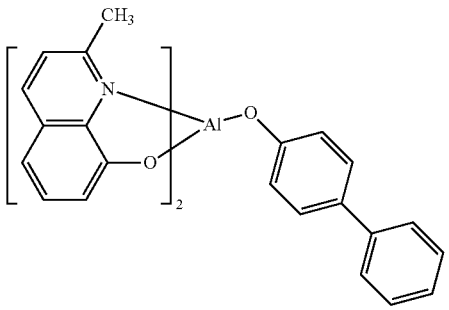

Chemical Formula Z-4

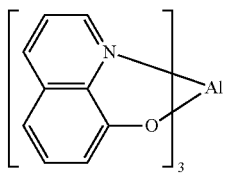

Example 5

An organic light emitting diode is fabricated according to the same method as Example 4, except for depositing the first and second hosts in a weight ratio of 5:5.

Example 6

An organic light emitting diode is fabricated according to the same method as Example 4, except for depositing the first and second hosts in a weight ratio of 3:7.

Comparative Example 1

An organic light emitting diode is fabricated according to the same method as Example 4, except for using the compound synthesized according to Example 1 as a host for an emission layer.

Comparative Example 2

An organic light emitting diode is fabricated according to the same method as Example 4, except for using the compound synthesized according to Example 2 as a host for an emission layer.

Performance of Organic Light Emitting Diode

Experimental Example 1

Each organic light emitting diode according to Examples 4 to 6 and Comparative Examples 1 and 2 are measured regarding current density change, luminance change, and luminous efficiency depending on a voltage. The measurement is specifically performed in the following methods. The results are provided in the following Table 1.

(1) Measurement of Current Density Change Depending on Voltage Change

The obtained organic light emitting diodes are measured regarding current value flowing in a unit device, while their voltages are increased from 0 Volts ("V") to 10 V using a current-voltage meter (Keithley 2400). The measured current value is divided by an area to calculate current density.

(2) Measurement of Luminance Change Depending on Voltage Change

The organic light emitting diodes are measured regarding luminance using a luminance meter (Minolta Cs-1000A) while their voltages are increased from 0 V to 10 V.

(3) Measurement of Luminous Efficiency

Current efficiency (candelas per ampere, cd/A) and electric power efficiency (lumens per watt, lm/W) at the same luminance (candelas per square meter, 9,000 cd/m$^2$) are calculated by using luminance and current density from (1) and (2) and a voltage.

TABLE 1

| | Host of emission layer | Dopant material of emission layer | Driving voltage (V) | Luminous efficiency (9,000 cd/A) | Life-span (h) |
|---|---|---|---|---|---|
| Example 4 | Example 1:Example 2 = 3:7 | Example 3 | 4.5 | 94.3 | 1 |
| Example 5 | Example 1:Example 2 = 5:5 | Example 3 | 4.1 | 96.7 | 65 |
| Example 6 | Example 1:Example 2 = 7:3 | Example 3 | 3.9 | 75.8 | 65 |
| Comparative Example 1 | Example 1 | Example 3 | 3.9 | 43.6 | 10 |
| Comparative Example 2 | Example 2 | Example 3 | 8.8 | 5.7 | — |

Referring to Table 1, the devices using both of the first host and second hosts have much better luminous efficiency than the devices using each host alone. In addition, each host supplements the other and increases luminous efficiency of a device, but may rather decrease the luminous efficiency when used beyond a predetermined ratio. As a result, each host leads injection of holes and electrons into an emission layer, and thus, the holes and electrons may be balanced in the emission layer by adjusting the weight ratio of the hosts, improving luminous efficiency of the device. Accordingly, the organic light emitting diode using two or more hosts has an advantage of adjusting balance between holes and electrons.

In addition, the organic light emitting diodes according to Examples 5 and 6 have a much better life-span characteristic than those according to Comparative Examples 1 and 2. Accordingly, the first and second hosts turn out to contribute to improving life-span as well as luminous efficiency of the organic light emitting diode.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

What is claimed is:

1. A material for an organic optoelectronic device, comprising
a first compound represented by Chemical Formula A-1, and
a second compound represented by Chemical Formula B-1:

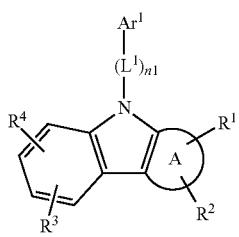

Chemical Formula A-1 wherein, in Chemical Formula A-1,
Ar¹ is a substituted or unsubstituted imidazolyl group, a substituted or unsubstituted triazolyl group, a substituted or unsubstituted tetrazolyl group, a substituted or unsubstituted oxadiazolyl group, a substituted or unsubstituted oxatriazolyl group, a substituted or unsubstituted thiatriazolyl group, a substituted or unsubstituted benzimidazolyl group, a substituted or unsubstituted benzotriazolyl group, a substituted or unsubstituted pyridinyl group, a substituted or unsubstituted pyrimidinyl group, a substituted or unsubstituted triazinyl group, a substituted or unsubstituted pyrazinyl group, a substituted or unsubstituted pyridazinyl group, a substituted or unsubstituted purinyl group, a substituted or unsubstituted quinolinyl group, a substituted or unsubstituted isoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted acridinyl group, a substituted or unsubstituted phenanthrolinyl group, or substituted or unsubstituted phenazinyl group,
L¹ is a C6 to C30 arylene group,
n1 is 0 or 1,
R¹ to R⁴ are independently hydrogen, deuterium, a cyano group, a C1 to C20 alkyl group, or a C6 to C30 aryl group,
A is a substituted or unsubstituted C6 aryl group or a group represented by one of Chemical Formulae A-4 to A-9,

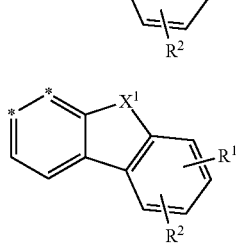

Chemical Formula A-4

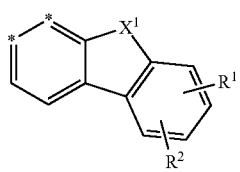

Chemical Formula A-5

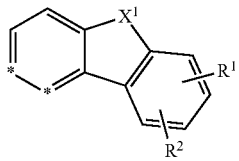

Chemical Formula A-6

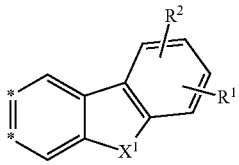

Chemical Formula A-7

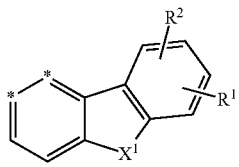

Chemical Formula A-8

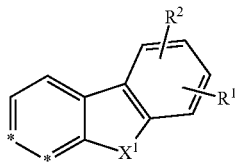

Chemical Formula A-9 wherein, in Chemical Formula A-4 to A-9,
two adjacent *'s indicate bonding positions with Chemical Formula A-1,
X¹ is —NR'—,
R' is C6 to C12 aryl group,
R¹ and R² are independently hydrogen, deuterium, a cyano group, C1 to C20 alkyl group or C6 to C30 aryl group,

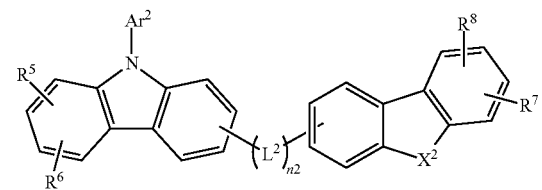

Chemical Formula B-1 wherein, in Chemical Formula B-1,
X² is —NR'—,
Ar² and R' are independently C6 to C12 aryl group,
R⁵ to R⁸ are independently hydrogen, deuterium, a cyano group, a C1 to C20 alkyl group, or a C6 to C30 aryl group,
L² is a substituted or unsubstituted C2 to C6 alkenylene group, a substituted or unsubstituted C2 to C6 alkynylene group, a substituted or unsubstituted C6 to C30 arylene group, a substituted or unsubstituted C3 to C30 heteroarylene group, or a combination thereof, and
n2 is an integer of 0 to 3.

2. The material for an organic optoelectronic device of claim 1, wherein Chemical Formula A-1 is represented by Chemical Formula A-10:

Chemical Formula A-10

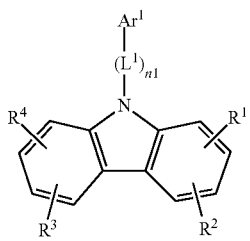

wherein, in Chemical Formula A-10, $Ar^1$ is a substituted or unsubstituted imidazolyl group, a substituted or unsubstituted triazolyl group, a substituted or unsubstituted tetrazolyl group, a substituted or unsubstituted oxadiazolyl group, a substituted or unsubstituted oxatriazolyl group, a substituted or unsubstituted thiatriazolyl group, a substituted or unsubstituted benzimidazolyl group, a substituted or unsubstituted benzotriazolyl group, a substituted or unsubstituted pyridinyl group, a substituted or unsubstituted pyrimidinyl group, a substituted or unsubstituted triazinyl group, a substituted or unsubstituted pyrazinyl group, a substituted or unsubstituted pyridazinyl group, a substituted or unsubstituted purinyl group, a substituted or unsubstituted quinolinyl group, a substituted or unsubstituted isoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted acridinyl group, a substituted or unsubstituted phenanthrolinyl group, or substituted or unsubstituted phenazinyl group, $L^1$ is a C6 to C30 arylene group, n1 is 0 or 1, and $R^1$ to $R^4$ are independently hydrogen, deuterium, a cyano group, a C1 to C20 alkyl group, or a C6 to C30 aryl group.

3. The material for an organic optoelectronic device of claim 1, wherein n2 in Chemical Formula B-1 is 0.

4. The material for an organic optoelectronic device of claim 1, wherein the material for an organic optoelectronic device further comprises a dopant represented by Chemical Formula C-1:

Chemical Formula C-1

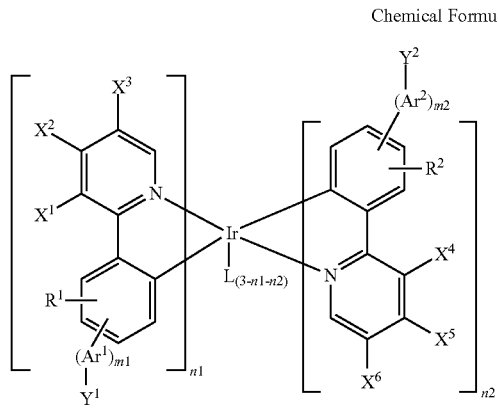

wherein, in Chemical Formula C-1, $X^1$ to $X^6$, $Y^1$, and $Y^2$ are independently hydrogen, deuterium, a halogen, a substituted or unsubstituted C1 to C20 alkyl group, a substituted or unsubstituted C1 to C20 fluoroalkyl group, a substituted or unsubstituted C1 to C20 alkoxy group, a substituted or unsubstituted C1 to C20 amino group, a substituted or unsubstituted C6 to C30 aryl group, a substituted or unsubstituted C3 to C30 heteroaryl group, or a substituent represented by Chemical Formula X-1, $Ar^1$ and $Ar^2$ are substituted or unsubstituted C6 to C30 arylene groups, $R^1$ and $R^2$ are independently hydrogen, deuterium, a C1 to C30 alkyl group substituted or unsubstituted with a halogen, a C6 to C30 aryl group substituted or unsubstituted with a C1 to C30 alkyl group or a halogen, $m^1$ and $m^2$ are integers ranging from 0 to 2, and $m^1+m^2$ is greater than or equal to 1, L is a bidentate ligand of a monovalent anion, and is coordination-bonded with iridium through lone pair electrons of carbon or heteroatom, and $n^1$ and $n^2$ are independently integers ranging from 0 to 3, and $n^1+n^2$ is an integer ranging from 1 to 3, Chemical Formula X-1

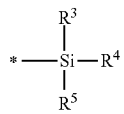

wherein, in Chemical Formula X-1, $R^3$, $R^4$, and $R^5$ are independently a substituted or unsubstituted C1 to C20 alkyl group, a substituted or unsubstituted C1 to C20 alkoxy group, a substituted or unsubstituted C1 to C20 fluoroalkyl group, a substituted or unsubstituted C1 to C20 amino group, a substituted or unsubstituted C6 to C30 aryl group, or a substituted or unsubstituted C3 to C30 heteroaryl group.

5. The material for an organic optoelectronic device of claim 4, wherein in Chemical Formula C-1, $m^1$ is 1 or 2 and $Y^1$ is a substituent represented by Chemical Formula X-1, or $m^2$ is 1 or 2 and $Y^2$ is a substituent represented by Chemical Formula X-1.

6. The material for an organic optoelectronic device of claim 4, wherein in Chemical Formula C-1, $n^1+n^2$ is 3.

7. The material for an organic optoelectronic device of claim 4, wherein in Chemical Formula C-1, $n^1$ or $n^2$ is 3.

8. The material for an organic optoelectronic device of claim 4, wherein in Chemical Formula C-1, L is selected from Chemical Formulae L-1 to L-14:

Chemical Formula L-1

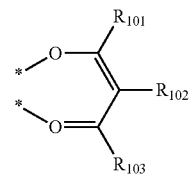

Chemical Formula L-2
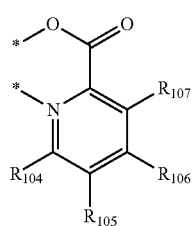
Chemical Formula L-3
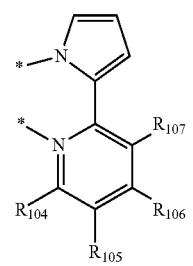
Chemical Formula L-4
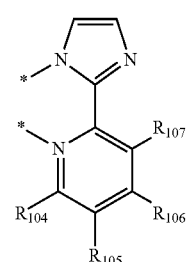
Chemical Formula L-5
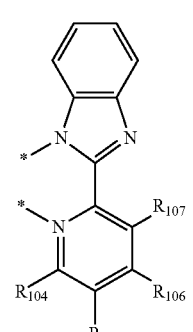
Chemical Formula L-6
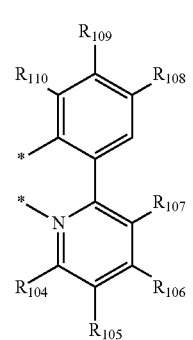
Chemical Formula L-7
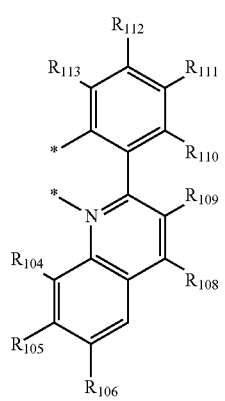
Chemical Formula L-8
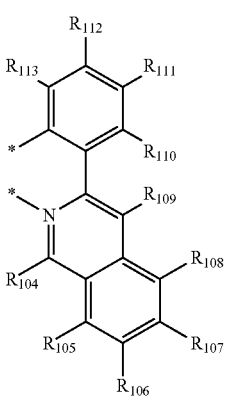
Chemical Formula L-9
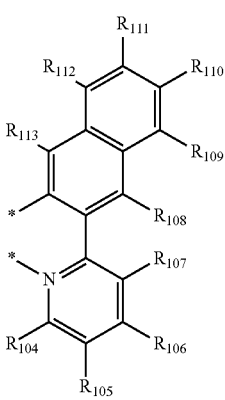
Chemical Formula L-10
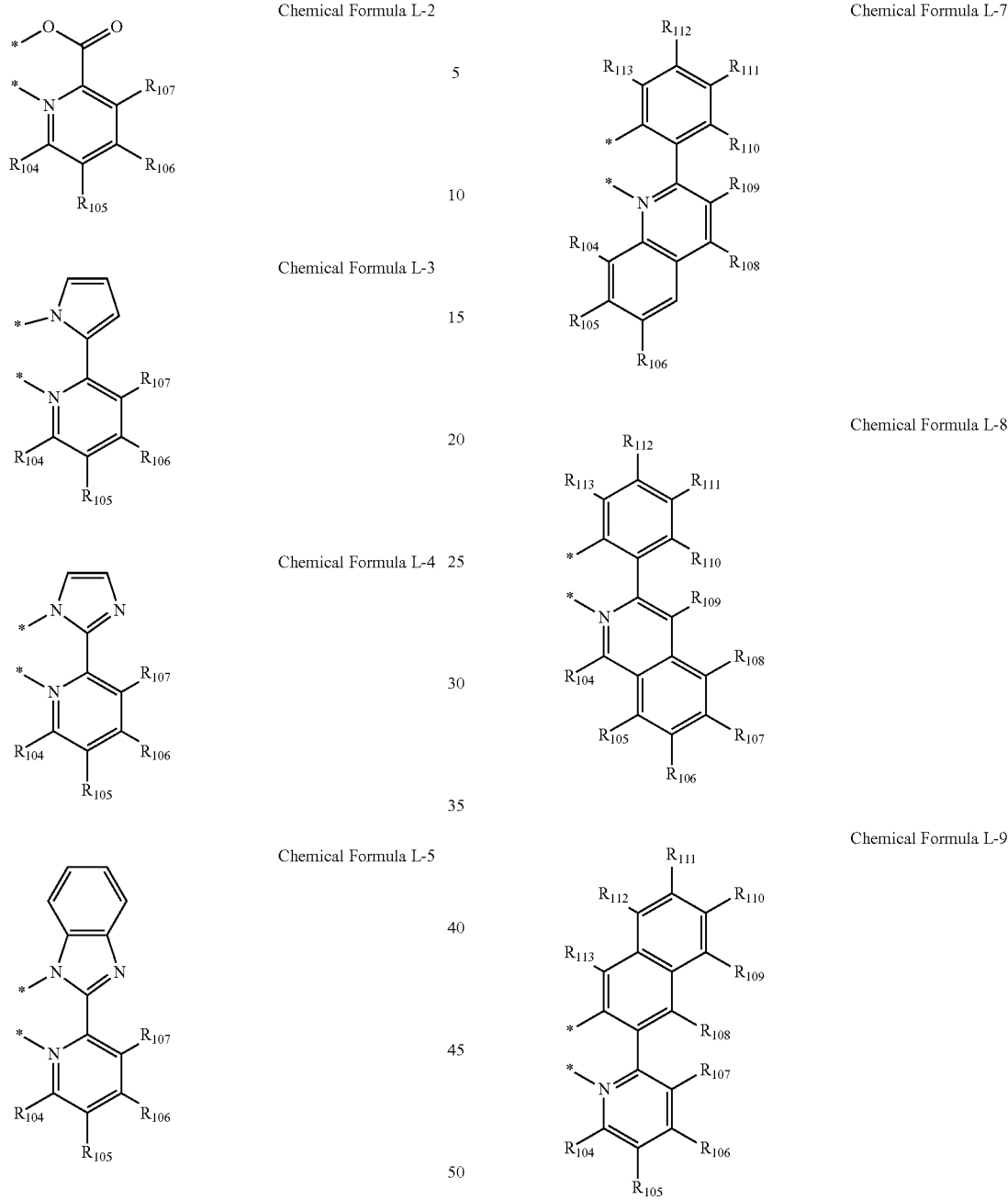

-continued

Chemical Formula L-11

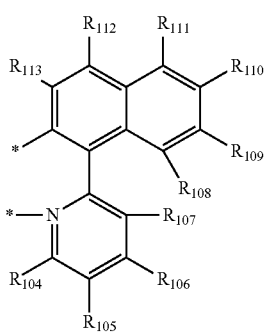

Chemical Formula L-12

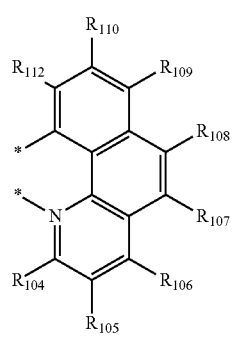

Chemical Formula L-13

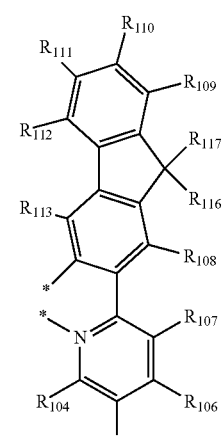

Chemical Formula L-14

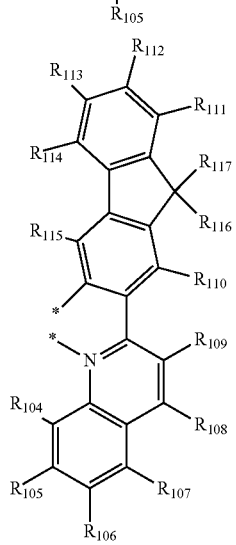

wherein, in Chemical Formulae L-1 to L-14,
asterisk (*) indicates a site bonding with iridium, $R_{101}$ to $R_{103}$ are independently hydrogen, deuterium, a C1 to C30 alkyl group substituted or unsubstituted with a halogen, or a C6 to C30 aryl group substituted or unsubstituted with a C1 to C30 alkyl group or a halogen, $R_{104}$ to $R_{115}$ are independently hydrogen, deuterium, a halogen, a substituted or unsubstituted C1 to C30 alkyl group, a substituted or unsubstituted C1 to C30 alkoxy group, a substituted or unsubstituted C3 to C30 cycloalkyl group, a substituted or unsubstituted C2 to C30 alkenyl group, a substituted or unsubstituted C6 to C30 aryl group, a substituted or unsubstituted C3 to C30 heteroaryl group, a substituted or unsubstituted C1 to C30 amino group, a substituted or unsubstituted C6 to C30 an arylamino group, $SF_5$, a trialkylsilyl group having a substituted or unsubstituted C1 to C30 alkyl group, a dialkylarylsilyl group having a substituted or unsubstituted C1 to C30 alkyl group and C6 to C30 aryl group, or a triarylsilyl group having a substituted or unsubstituted C6 to C30 aryl group, and $R_{116}$ to $R_{117}$ are independently hydrogen, deuterium, a C1 to C30 alkyl group substituted or unsubstituted with a halogen, or a C6 to C30 aryl group substituted or unsubstituted with a C1 to C30 alkyl group.

9. The material for an organic optoelectronic device of claim 1, wherein $Ar^1$ is represented by one of Chemical Formulae E-1 to E-5:

Chemical Formula E-1

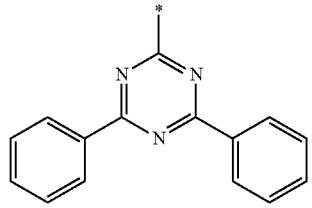

Chemical Formula E-2

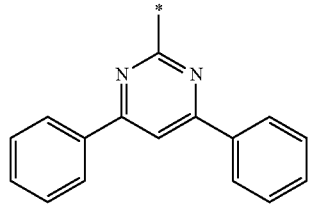

Chemical Formula E-3

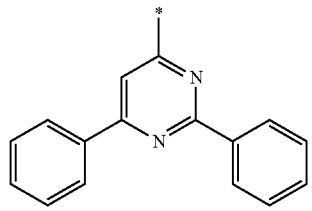

Chemical Formula E-4

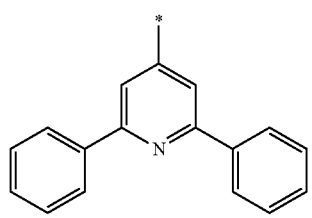

Chemical Formula E-5
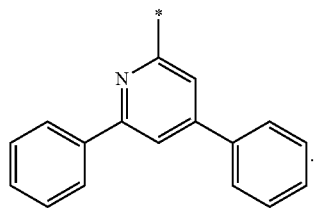
10. The material for an organic optoelectronic device of claim 1, wherein Chemical Formula A-1 is represented by one of Chemical Formulae H-1 to H-20 and H-33 to H-35:
Chemical Formula H-1
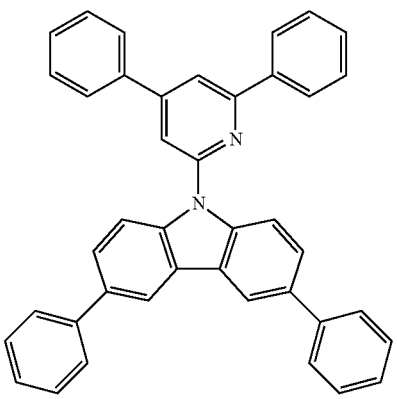
Chemical Formula H-2
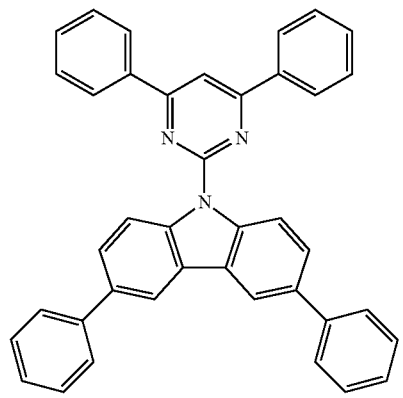
Chemical Formula H-3
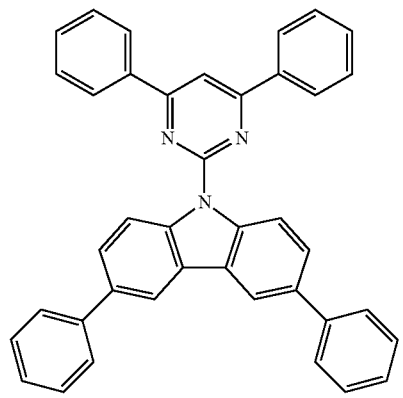
Chemical Formula H-4
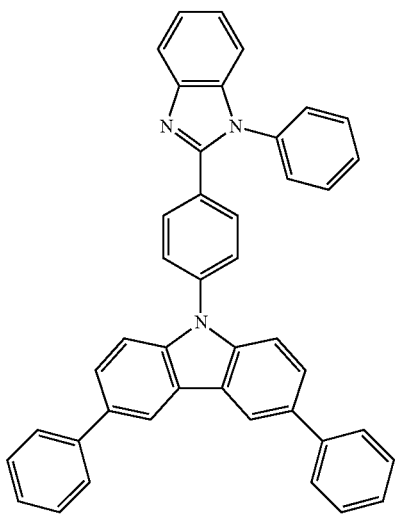
Chemical Formula H-5
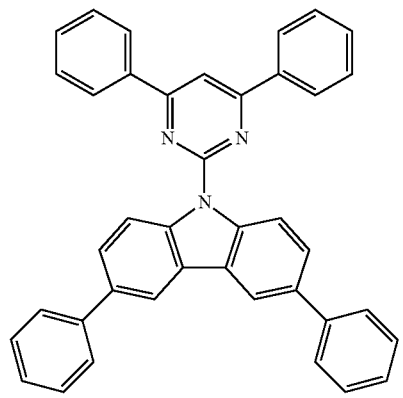
Chemical Formula H-6
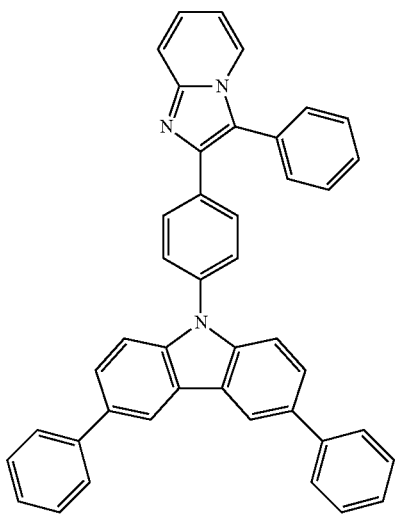

Chemical Formula H-7
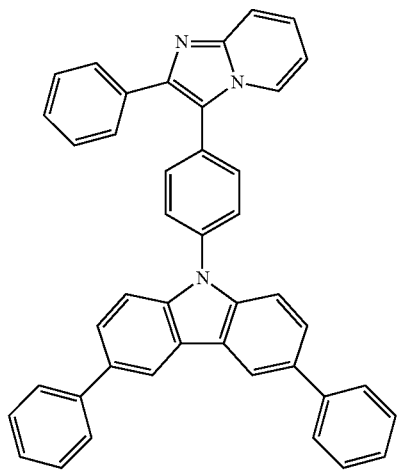
Chemical Formula H-8
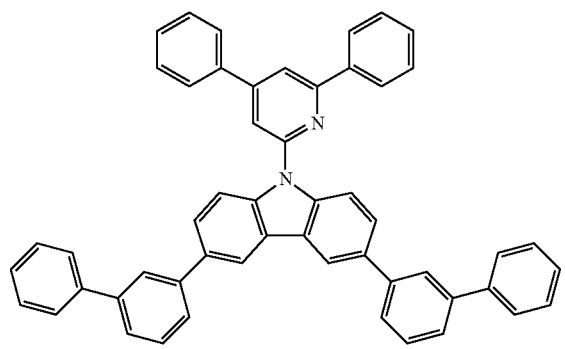
Chemical Formula H-9
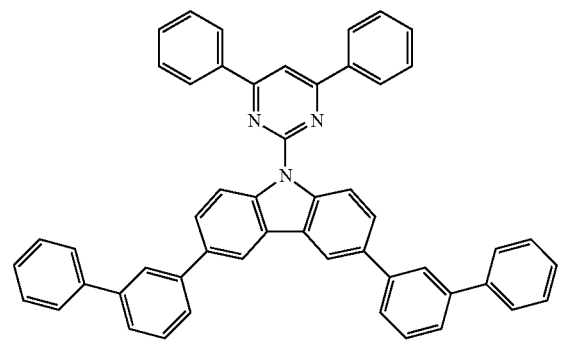
Chemical Formula H-10
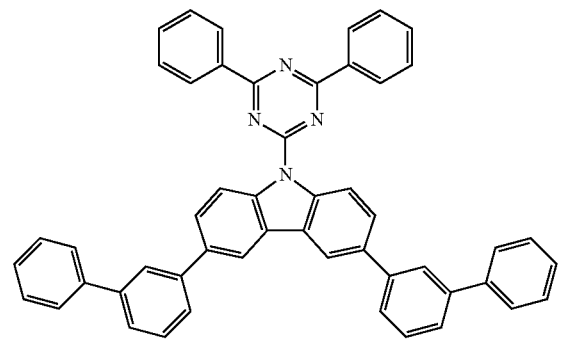
Chemical Formula H-11
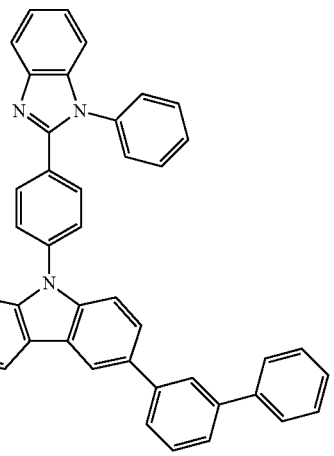
Chemical Formula H-12
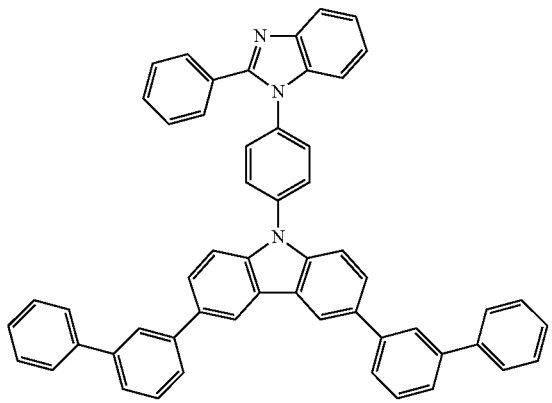
Chemical Formula H-13
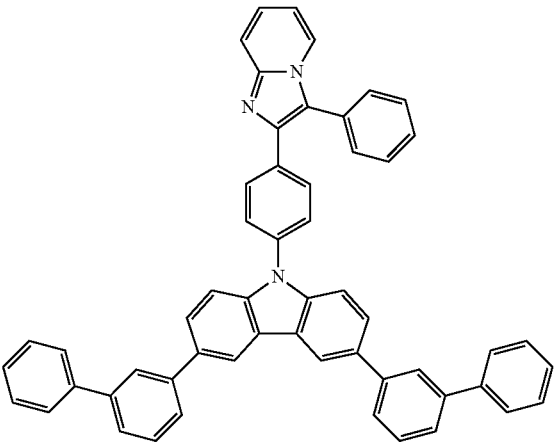

Chemical Formula H-14
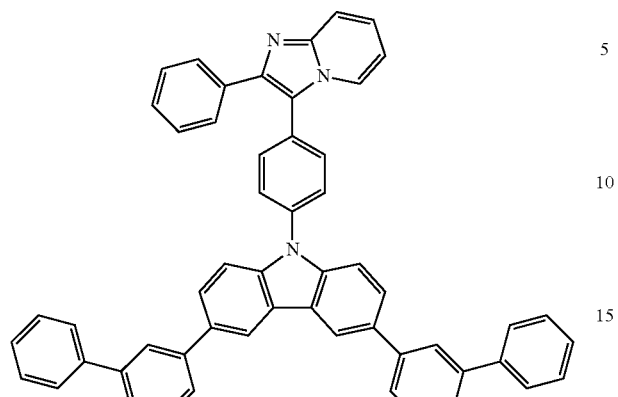
Chemical Formula H-15
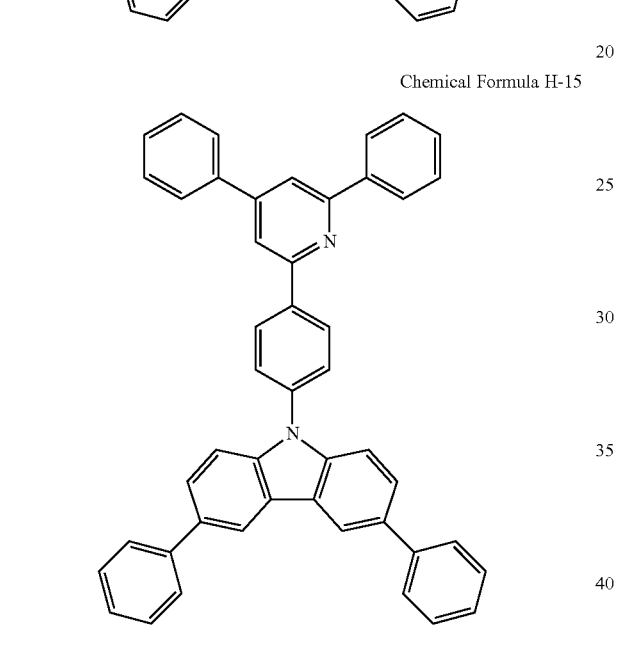
Chemical Formula H-16
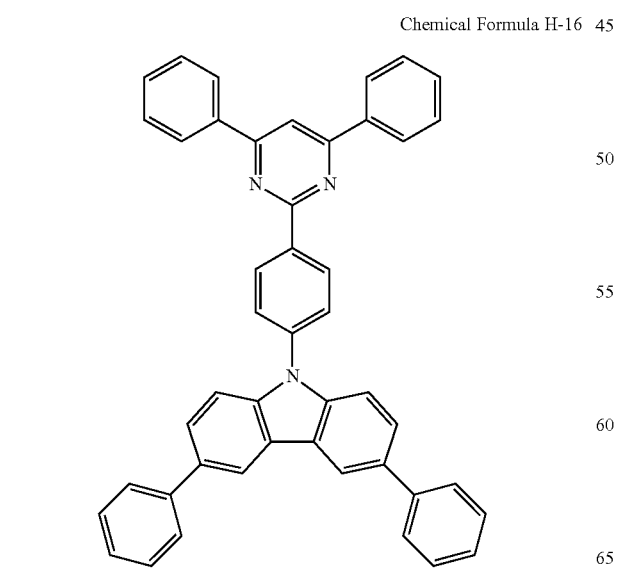
Chemical Formula H-17
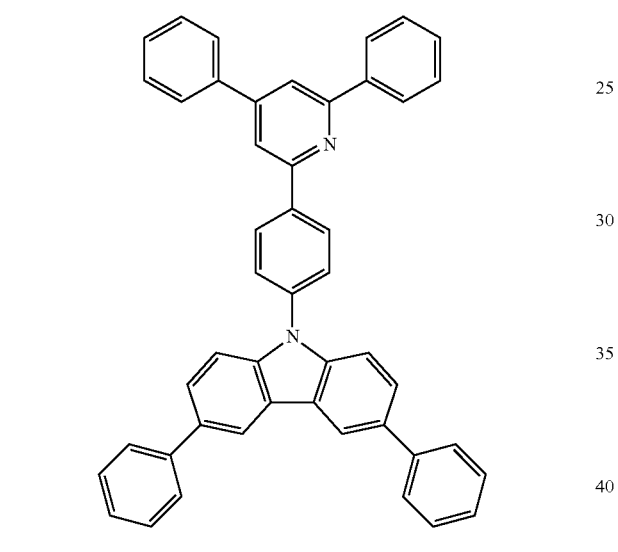
Chemical Formula H-18
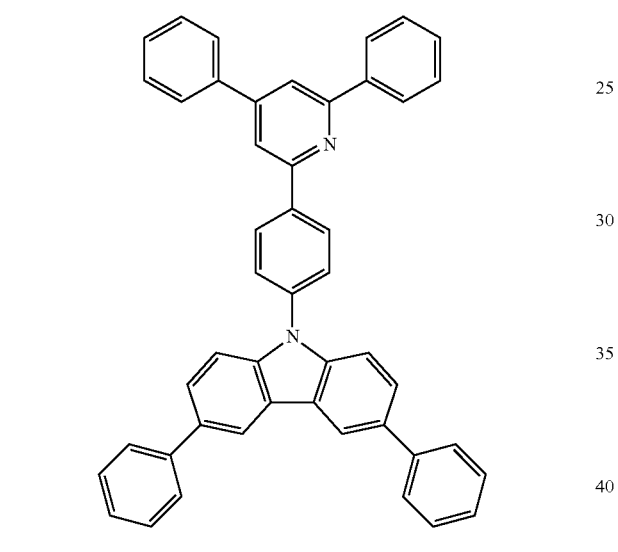
Chemical Formula H-19
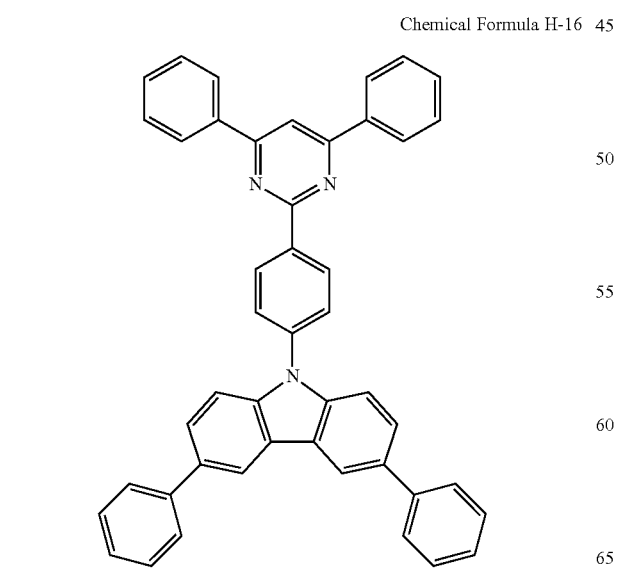

-continued
Chemical Formula H-20
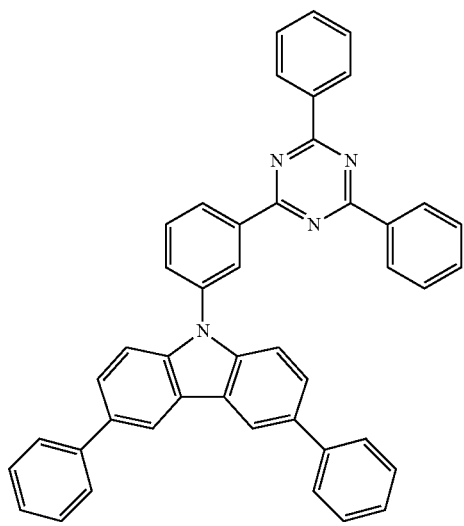
Chemical Formula H-33
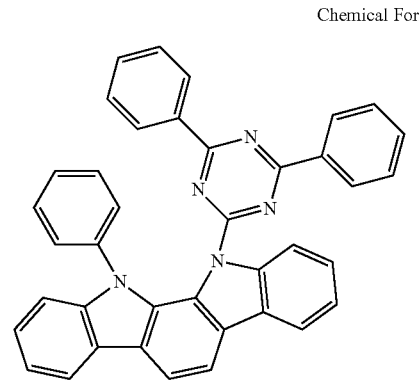
Chemical Formula H-34
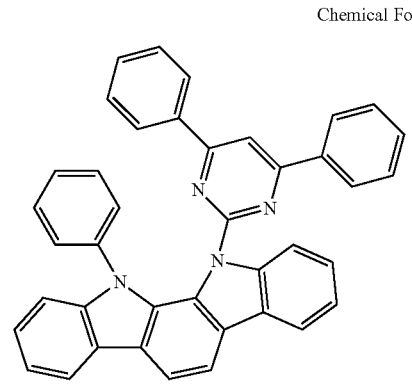
Chemical Formula H-35
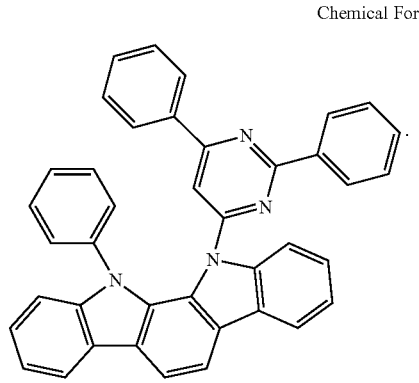
11. The material for an organic optoelectronic device of claim 1, wherein Chemical Formula B-1 is represented by one of Chemical Formulae I-1 to I-5:
Chemical Formula I-1
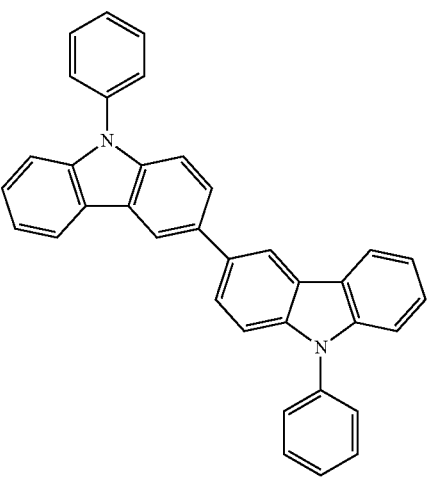
Chemical Formula I-2
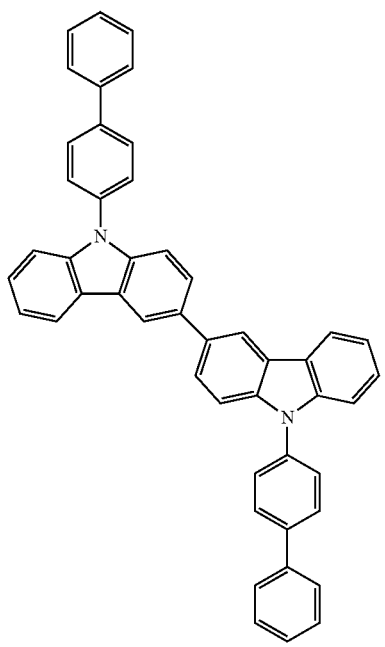

Chemical Formula I-3
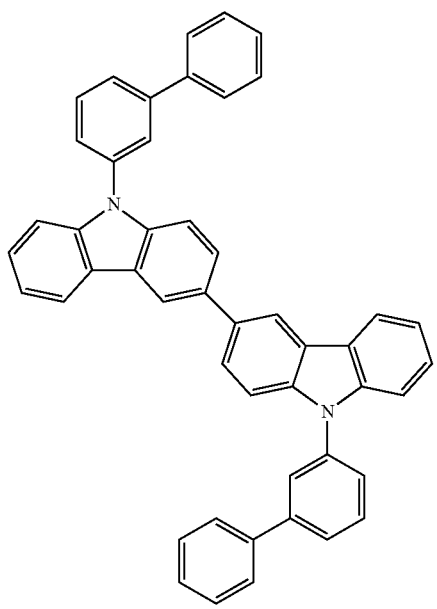
Chemical Formula I-4
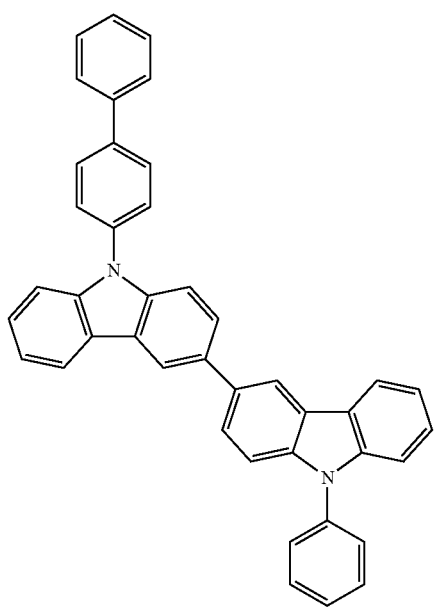
Chemical Formula I-5
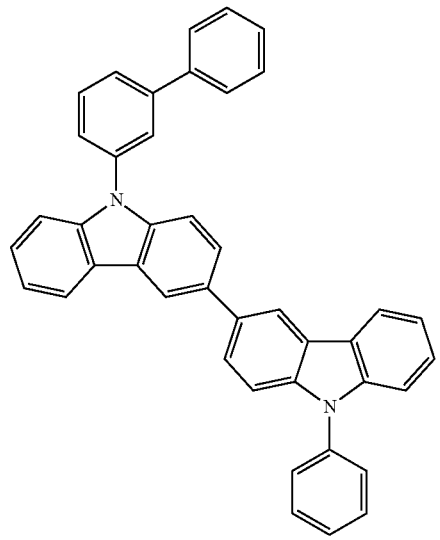
12. The material for an organic optoelectronic device of claim 4, wherein Chemical Formula C-1 is represented by Chemical Formulae J-1 to J-20:
Chemical Formula J-1
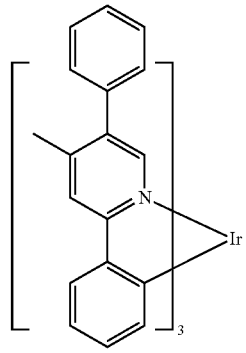
Chemical Formula J-2
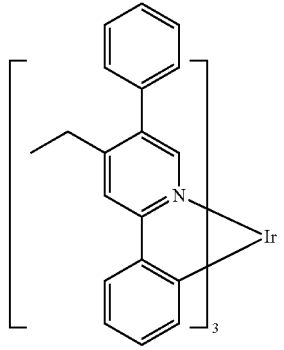

Chemical Formula J-3
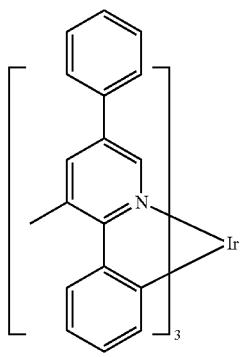
Chemical Formula J-4
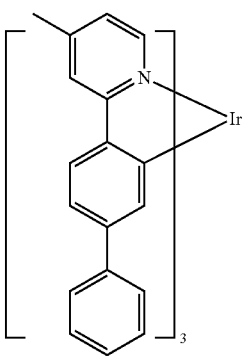
Chemical Formula J-5
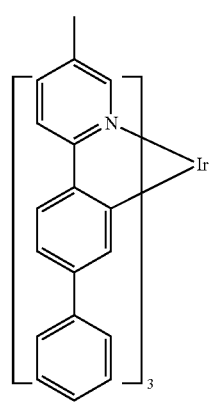
Chemical Formula J-6
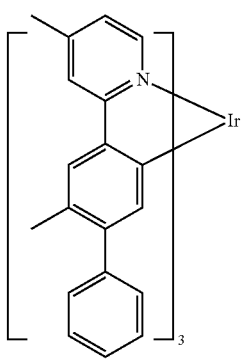
Chemical Formula J-7
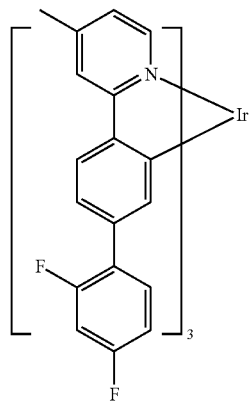
Chemical Formula J-8
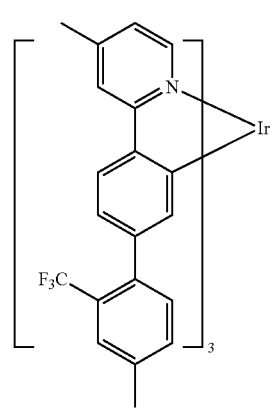
Chemical Formula J-9
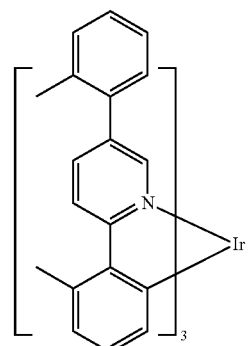
Chemical Formula J-10
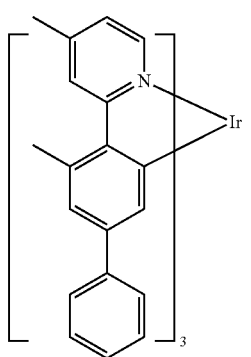

Chemical Formula J-11
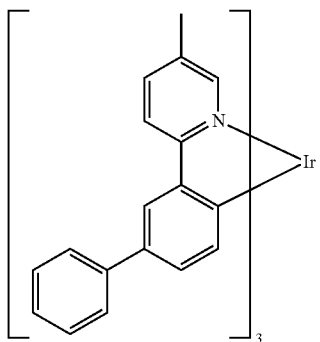
Chemical Formula J-12
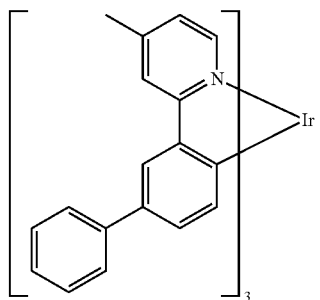
Chemical Formula J-13
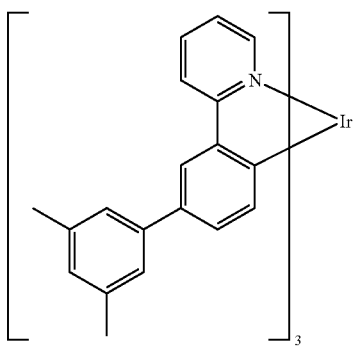
Chemical Formula J-14
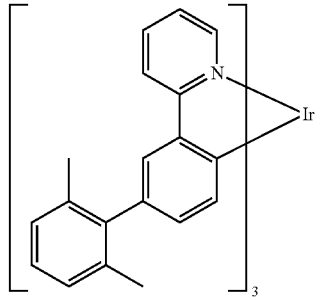
Chemical Formula J-15
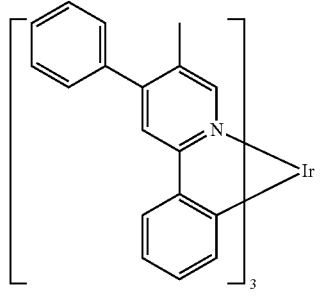
Chemical Formula J-16
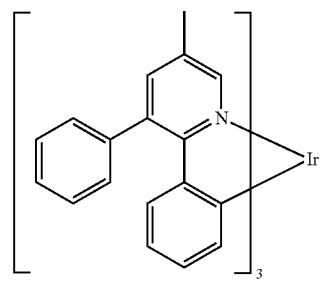
Chemical Formula J-17
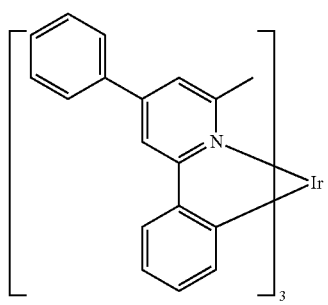
Chemical Formula J-18
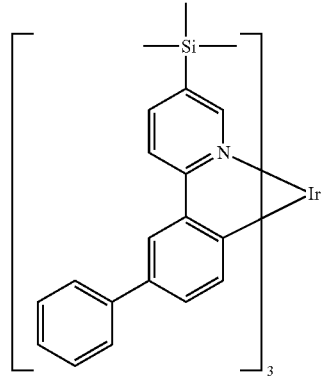
Chemical Formula J-19
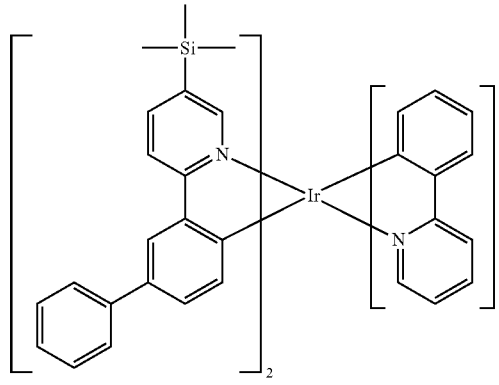

Chemical Formula J-20

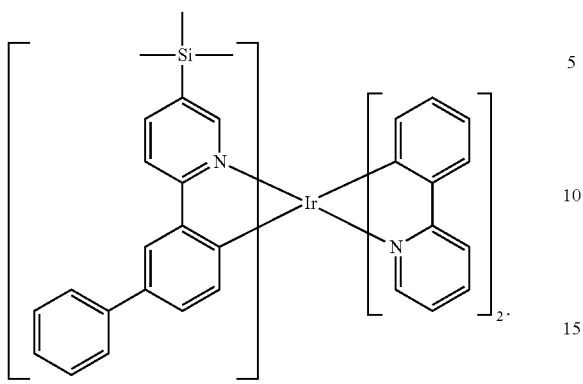

13. An organic light emitting diode comprising
an anode,
a cathode, and
at least one organic layer between the anode and the cathode,
wherein at least one organic layer comprises the material for an organic optoelectronic device according to claim 1.

14. The organic light emitting diode of claim 13, wherein the at least one organic layer is an emission layer.

15. A display device comprising the organic light emitting diode according to claim 13.

* * * * *